US012046745B2

(12) United States Patent
Newbound et al.

(10) Patent No.: US 12,046,745 B2
(45) Date of Patent: Jul. 23, 2024

(54) GROUP IVA FUNCTIONALIZED PARTICLES AND METHODS OF USE THEREOF

(71) Applicant: KRATOS LLC, Irmo, SC (US)

(72) Inventors: Timothy D. Newbound, Chelsea, MI (US); Leslie Matthews, Mount Pleasant, UT (US); Jeff A. Norris, Lexington, SC (US)

(73) Assignee: Kratos LLC, Irmo, SC (US)

( * ) Notice: Subject to any disclaimer, the term of this patent is extended or adjusted under 35 U.S.C. 154(b) by 0 days.

(21) Appl. No.: 18/304,183

(22) Filed: Apr. 20, 2023

(65) Prior Publication Data
US 2023/0369573 A1   Nov. 16, 2023

Related U.S. Application Data

(63) Continuation of application No. 17/238,005, filed on Apr. 22, 2021, now abandoned, which is a continuation of application No. 16/267,692, filed on Feb. 5, 2019, now Pat. No. 11,005,097, which is a continuation of application No. 15/255,080, filed on Sep. 1, 2016, now Pat. No. 10,211,454, which is a continuation of application No. 13/972,575, filed on Aug. 21, 2013, now Pat. No. 9,461,304.

(60) Provisional application No. 61/815,654, filed on Apr. 24, 2013, provisional application No. 61/773,270, filed on Mar. 6, 2013, provisional application No. 61/691,641, filed on Aug. 21, 2012.

(51) Int. Cl.
| | | |
|---|---|---|
| H01M 4/38 | (2006.01) | |
| H01L 31/0264 | (2006.01) | |
| H01L 31/0352 | (2006.01) | |
| H01M 4/04 | (2006.01) | |
| H01M 4/134 | (2010.01) | |
| H01M 4/36 | (2006.01) | |
| H01M 4/62 | (2006.01) | |
| H01M 10/0525 | (2010.01) | |
| H01M 4/02 | (2006.01) | |
| H01M 10/052 | (2010.01) | |
| H01M 10/0569 | (2010.01) | |

(52) U.S. Cl.
CPC ........ *H01M 4/366* (2013.01); *H01L 31/0264* (2013.01); *H01L 31/0352* (2013.01); *H01M 4/049* (2013.01); *H01M 4/134* (2013.01); *H01M 4/38* (2013.01); *H01M 4/386* (2013.01); *H01M 4/387* (2013.01); *H01M 4/62* (2013.01); *H01M 10/0525* (2013.01); *H01M 2004/027* (2013.01); *H01M 10/052* (2013.01); *H01M 10/0569* (2013.01); *Y02E 60/10* (2013.01); *Y02P 70/50* (2015.11)

(58) Field of Classification Search
CPC .................................................... H01M 4/366
See application file for complete search history.

(56) References Cited

U.S. PATENT DOCUMENTS 6,132,801 A * 10/2000 Linford .................. B01J 20/287
427/221

FOREIGN PATENT DOCUMENTS

WO   WO-2009011981 A2 *  1/2009  ............ B22F 1/0018

* cited by examiner

*Primary Examiner* — Edward J Cain
(74) *Attorney, Agent, or Firm* — Michael Best & Friedrich LLP

(57) ABSTRACT

Disclosed are functionalized Group IVA particles, methods of preparing the Group IVA particles, and methods of using the Group IVA particles. The Group IVA particles may be passivated with at least one layer of material covering at least a portion of the particle. The layer of material may be a covalently bonded non-dielectric layer of material. The Group IVA particles may be used in various technologies, including lithium ion batteries and photovoltaic cells.

20 Claims, 42 Drawing Sheets

GROUP IVA FUNCTIONALIZED PARTICLES AND METHODS OF USE THEREOF

CROSS-REFERENCE TO RELATED APPLICATIONS

This is a continuation of U.S. patent application Ser. No. 13/972,575, filed on Aug. 21, 2013, which claims priority to U.S. Provisional Patent Application No. 61/691,641, filed on Aug. 21, 2012, U.S. Provisional Patent Application No. 61/773,270, filed on Mar. 6, 2013, and U.S. Provisional Patent Application No. 61/815,654, filed on Apr. 24, 2013, the entire contents of all of which are fully incorporated herein by reference.

TECHNICAL FIELD

The present disclosure relates generally to functionalized Group IVA particles, and more particularly, to Group IVA particles passivated by a covalently bonded non-dielectric layer of hydrocarbons, methods of preparing the Group IVA particles, and methods of using the Group IVA particles. The present disclosure also relates to the incorporation of porous covalent frameworks with covalently bound Group IVA particles, and methods of using the porous covalent frameworks in battery technologies.

BACKGROUND

A battery is an electrochemical energy storage device. Batteries can be categorized as either primary (non-rechargeable) or secondary (rechargeable). In either case, a fully charged battery delivers electrical power as it undergoes an oxidation/reduction process and electrons are allowed to flow between the negative and positive polls of the battery.

Lithium ion batteries can be made as secondary batteries; which means that they can be recharged by driving current in the opposite direction and reducing lithium ions to $Li^0$ at the anode. A generalized schematic representation of a lithium ion battery is shown in FIG. 1. The direction of movement of ions and electrons are shown to represent "charging". The discharge cycle would show ions moving in the opposite direction. Lithium ions migrating into the anode are met by electrons moving toward the anode through the closed circuit, thus reducing the $Li^+$ to $Li^0$ (lithium metal). $Li^0$ is actually much larger in diameter than $Li^+$ because of the electron it acquired occupies its 2S orbital. Consequently lithium metal occupies a significant amount of space. Conventional carbon anodes accommodate reduced lithium between the layers of graphite. Graphite can be thought of as 2-D arrays of 6-membered rings of carbon forming "sheets" that slide easily on one another. Fully charged, a graphite anode is able to accommodate the volume of lithium without imposing special demands beyond the inherent space that already exists between the sheets of graphite sheets.

There are no such special demands on the cathode as $Li^+$ requires very little space (like adding sand to a bucket of gravel). The metal oxides and/or phosphates comprising the cathode stay in place. But only a finite number of $Li^+$ ions (usually one or two) can pair with each cluster of metal oxides. Thus much greater space requirement of the cathode limits the specific charge capacity (charge per gram or charge per cubic millimeter). From the standpoint of size and molecular mass alone, lithium is the ideal element to use in batteries that must be made compact and light. In addition, lithium has the highest redox potential difference of any element.

The average cathode composition generally has lower charge capacity and therefore requires more size (and weight) when matched with the most common anode composite, graphite. As a consequence, a majority of research has focused on developing improved cathodes.

Some researchers have sought to develop alternative anodes for lithium ion batteries using silicon based materials. Silicon (Si) is known to have a far superior capacity to attract lithium than carbon used in traditional batteries [372 milliamp hours per gram, (mAh/g) versus 4,212 mAh/g for Si]. However, no commercial batteries have been successfully introduced using Si because no suitable structure has been found that prevents mechanical breakdown of the Si composites after only a few recharge cycles. Specifically, the limited structural form of silicon, coupled with the strong attraction that lithium has for silicon, results in mechanical failure due to volumetric expansion after a few charge/recharge cycles.

Accordingly, there is a need for new materials and methods that improve upon existing battery technology. In particular, there is a need for materials that provide a suitable porous framework to accommodate the spatial requirements of lithium accumulation at the anode of lithium ion batteries, and also possess good charge carrier mobility.

Also needed are nanoparticle materials that can be efficiently and economically produced from abundant and readily available raw materials. While particle size control has been demonstrated using such methodologies as plasma enhanced chemical vapor deposition (PECVD), hot wire chemical vapor deposition (HWCVD) and ion beam deposition (IBD), commercial production using these methods usually involve in situ film manufacturing. Group IVA nanoparticle powders are only available commercially in very limited range of specifications and only with dielectric passivation. The products are expensive because their production requires large capital costs for production equipment and high energy costs in production.

SUMMARY

In one aspect, disclosed is a functionalized Group IVA particle. The Group IVA particle may be passivated by a non-dielectric layer covering at least a portion of a surface of the Group IVA particle.

The non-dielectric layer may be derived from a compound selected from the group consisting of alkenes, alkynes, aromatics, heteroaromatics, cycloalkenes, alcohols, glycols, thiols, disulfides, amines, amides, pyridines, pyrrols, furans, thiophenes, cyanates, isocyanates, isothiocyanates, ketones, carboxylic acids, amino acids, and aldehydes. The non-dielectric layer may be derived from a compound selected from the group consisting toluene, benzene, a polycyclic aromatic, a fullerene, a metallofullerene, a styrene, a cyclooctatetraene, a norbornadiene, a primary alkene, a primary alkyne, a saturated or unsaturated fatty acid, a peptide, a protein, an enzyme, 2,3,6,7-tetrahydroxyanthracene, and terephthalaldehyde. The non-dielectric layer may possess functional groups capable of forming covalent bonds to other reagents.

In certain embodiments, the Group IVA particle is stable to oxidation in air at room temperature.

In certain embodiments, the Group IVA particle is 25 microns in size or less, 1 micron in size or less, 0.1 micron in size or less, or 0.05 micron in size or less.

In certain embodiments, the Group IVA particle is covalently bonded to a porous covalent framework. The porous covalent framework may be a covalent organic framework, a metal organic framework, or a zeolitic imidazolate framework. The porous covalent framework may be a 2-dimensional framework. The porous covalent framework may be a 3-dimensional framework.

In certain embodiments, the Group IVA particle comprises silicon, germanium, tin, or any combination thereof. The Group IVA particle may comprise an n-type dopant or a p-type dopant. The n-type dopant may comprise nitrogen, phosphorous, arsenic, or any combination thereof. The p-type dopant may comprise boron, aluminum, or any combination thereof. The Group IVA particle may comprise an impurity selected from the group consisting of aluminum, iron, calcium, and titanium.

In certain embodiments, the Group IVA particle may be derived from metallurgical grade silicon. The Group IVA particle may be derived from a p-type silicon wafer, wherein the p-type silicon wafer may have a measured resistivity of 0.001-100 ohm/cm$^2$. The Group IVA particle may be derived from an n-type silicon wafer. The Group IVA particle may be derived from bulk MG Group IVA ingot material.

In certain embodiments, the Group IVA particle may be part of an anode in a lithium ion battery, part of a photovoltaic (PV) film, part of a biosensor, part of an energy storage device, part of a thermoelectric film, or part of a semiconductor device.

In certain embodiments, the Group IVA particle may be prepared by a process comprising the steps of: treating a Group IVA particle with a protic acid to provide a hydrogen passivated Group IVA particle; and treating the hydrogen passivated Group IVA particle with a compound to provide a passivated Group IVA particle. In certain embodiments, the Group IVA particle may be prepared by a process comprising the steps of: treating a Group IVA particle with a protic acid to provide a hydrogen passivated Group IVA particle; treating the hydrogen passivated Group IVA particle with benzene to yield a benzene passivated Group IVA particle; and treating the benzene passivated Group IVA particle with a compound to provide a passivated Group IVA particle. In certain embodiments, the passivated Group IVA particle may be a particle passivated with a non-dielectric layer covering at least a portion of a surface of the Group IVA particle. In certain embodiments, the passivated Group IVA particle may be stable to oxidation in air at room temperature. The compound for passivating may be selected from the group consisting of an organic compound, a fullerene, and an organometallic compound.

In certain embodiments, the Group IVA particle possesses functional groups capable of forming covalent bonds to other reagents.

In another aspect, disclosed are methods of preparing functionalized Group IVA particles.

In certain embodiments, a method of functionalizing a Group IVA particle comprises treating a Group IVA particle with a protic acid to provide a hydrogen passivated Group IVA particle; and treating the hydrogen passivated Group IVA particle with a compound to provide a passivated Group IVA particle. In certain embodiments, a method of functionalizing a Group IVA particle comprises treating a Group IVA particle with a protic acid to provide a hydrogen passivated Group IVA particle; treating the hydrogen passivated Group IVA particle with benzene to yield a stable benzene passivated Group IVA particle; and treating the benzene passivated Group IVA particle with a compound to provide a passivated Group IVA particle. The passivated Group IVA particles may be stable to oxidation in air at room temperature. The passivated Group IVA particles may be passivated with a non-dielectric layer covering at least a portion of a surface of the Group IVA particle.

In certain embodiments, a method of functionalizing a Group IVA particle comprises comminuting a material comprising a Group IVA element in a solvent comprising benzene to yield a benzene passivated Group IVA particle; and treating the benzene passivated Group IVA particle with a compound to provide a passivated Group IVA particle.

In certain embodiments, a method of functionalizing a Group IVA particle comprises comminuting a material comprising a Group IVA element in the presence of a compound to provide a passivated Group IVA particle.

In certain embodiments, the compound used for passivation may be selected from the group consisting of alkenes, alkynes, aromatics, heteroaromatics, cycloalkenes, alcohols, glycols, thiols, disulfides, amines, amides, pyridines, pyrrols, furans, thiophenes, cyanates, isocyanates, isothiocyanates, ketones, carboxylic acids, amino acids, and aldehydes. In certain embodiments, the compound used for passivation may be selected from the group consisting toluene, benzene, a polycyclic aromatic, a fullerene, a metallofullerene, a styrene, a cyclooctatetraene, a norbornadiene, a primary alkene, a primary alkyne, a saturated or unsaturated fatty acid, a peptide, a protein, an enzyme, 2,3,6,7-tetrahydroxyanthracene, and terephthalaldehyde.

In certain embodiments, the passivated Group IVA particle possesses functional groups capable of forming covalent bonds to other reagents.

In certain embodiments, the Group IVA particle is 25 microns in size or less, 1 micron in size or less, 0.1 micron in size or less, or 0.05 micron in size or less.

In certain embodiments, the Group IVA particle is covalently bonded to a porous covalent framework. The porous covalent framework may be a covalent organic framework, a metal organic framework, or a zeolitic imidazolate framework. The porous covalent framework may be a 2-dimensional framework. The porous covalent framework may be a 3-dimensional framework.

In certain embodiments, the Group IVA particle comprises silicon, germanium, tin, or any combination thereof. The Group IVA particle may comprise an n-type dopant or a p-type dopant. The n-type dopant may comprise nitrogen, phosphorous, arsenic, or any combination thereof. The p-type dopant may comprise boron, aluminum, or any combination thereof. The Group IVA particle may comprise an impurity selected from the group consisting of aluminum, iron, calcium, and titanium.

In certain embodiments, the Group IVA particle may be part of an anode in a lithium ion battery, part of a sorbent for capturing mercury from a combustion gas, part of a photovoltaic (PV) film, part of a biosensor, part of an energy storage device, part of a thermoelectric film, or part of a semiconductor device.

In certain embodiments, the protic acid may be selected from the group consisting of nitric acid, hydrochloric acid, hydrofluoric acid, and hydrobromic acid.

In certain embodiments, the synthetic steps to prepare the passivated Group IVA particles are conducted at about room temperature.

In certain embodiments, the Group IVA particle may be derived from metallurgical grade silicon. The Group IVA particle may be derived from a p-type silicon wafer, wherein the p-type silicon wafer may have a measured resistivity of 0.001-100 ohm/cm$^2$. The Group IVA particle may be derived from an n-type silicon wafer. The Group IVA particle may be derived from bulk MG Group IVA ingot material.

In certain embodiments, prior to treating the Group IVA particle with protic acid, the method comprises crushing, grinding, and milling an ingot or wafer material comprising a Group IVA element to provide submicron Group IVA particles ready for passivation.

In certain embodiments, the methods of preparing the Group IVA particles are a non-clean room processes.

In another aspect, disclosed is a lithium ion battery comprising: a positive electrode; a negative electrode comprising a composite comprising at least one submicron functionalized Group IVA particle (e.g., a conductive, porous covalent framework comprising at least one submicron functionalized Group IVA particle covalently bonded to the framework); a lithium ion permeable separator between the positive electrode and the negative electrode; and an electrolyte comprising lithium ions. The porous covalent framework may be a covalent organic framework, a metal organic framework, or a zeolitic imidazolate framework. The porous covalent framework may be a 2-dimensional framework or a 3-dimensional framework. In certain embodiments, the lithium ion battery includes a solvent that is a mixture of at least ethylene and propylene carbonates.

The compositions, methods and processes are further described herein.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
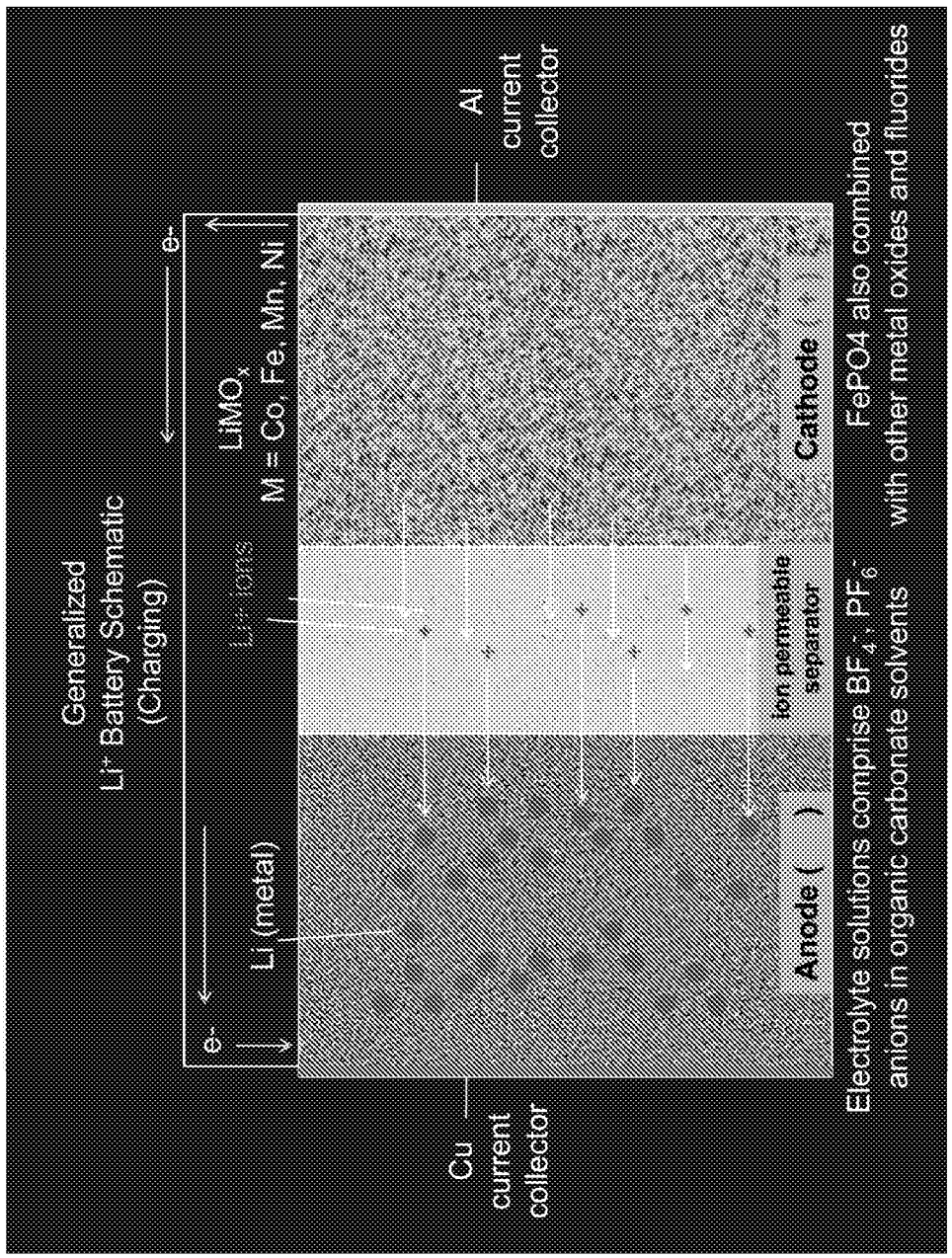
FIG. 1 depicts a generalized schematic representation of a lithium ion battery.

Disclosed herein are micron and submicron sized, passivated Group IVA particles; methods of preparing the Group IVA particles; and methods of using the Group IVA particles. Also disclosed are compositions comprising the Group IVA particles, such as inks or pastes comprising the Group IVA particles. Also disclosed are anodes and batteries comprising the Group IVA particles.

The Group IVA particles, the methods of preparing said particles, and methods of using said particles, as disclosed herein, provide several advantages over current technologies and practices. As one advantage, the Group IVA particles may be efficiently and economically produced from readily available starting materials. The Group IV particles can be prepared on a large scale and commercialized in an inexpensive industrial process. For example, the Group IVA particles can be made and functionalized without the use of heat or other high energy processes, thereby lowering manufacturing costs. The process for manufacturing nanosized Group IVA particles by methods disclosed herein are far more economical than manufacturing of Group IVA nanoparticles from "atom up" methods, such as plasma enhanced chemical vapor deposition (PECVD), hot wire chemical vapor deposition (HWCVD), and ion beam deposition (IBD).

The availability of feedstock for manufacturing the Group IVA submicron particles is plentiful and economical, as there are many sources of silicon and germanium derived from metallurgical grade ingots to various refined stage ingots. For silicon, the bulk material ranges from amorphous to polycrystalline and crystalline. Purities range from about 95% pure to 99.9999% pure. Silicon and germanium are available with dopants added that render the semiconductor properties as n-type (B, or Al) or p-type (N, P, or As). Of the refined crystalline and polycrystalline bulk materials, wafers from ingots with specific resistivity are available for use in semiconductor microelectronics manufacturing and solar photovoltaic cell manufacturing. Kerf from wafer manufacturing and scrap or defective wafers are also available at recycled material prices.

As another advantage, the ability to handle and store the Group IVA particles disclosed herein without rigorous exclusion of air and moisture is a distinct advantage, particularly in device manufacturing. Unlike most semiconductor devices where semiconducting films are manufactured in situ with strict controls to exclude oxygen and moisture, the Group IVA submicron particles disclosed herein may be manufactured separately from the device and can be stored in dry powdered form for up to several months without decomposition.

Thus, the methods disclosed herein allow functionalization of Group IVA materials for any application on any substrate/carrier that would otherwise require heat, sintering, environmentally controlled clean rooms and environmentally unfriendly etching, and substrates that would stand up to the heat processing, etc. Existing methods can be used only in applications or on substrates that will support the status quo heat and clean room based method to bond materials together and to the substrate or carrier.

As another advantage, the Group IVA particles and methods disclosed herein may be applied in technologies in such a way as to overcome existing problems in the art. The capability of forming formal covalent bonds to surrounding media from the passivated submicron particles through low-energy reactions allows the formation of materials that have optimized charge mobility from the particle to the surrounding media. As such, the Group IVA particles have applications in lithium ion battery and photovoltaic technologies. For example, inks manufactured from the Group IVA particles can be applied to conductive substrates to make fully functioning lithium ion batteries having charge/discharge capacities, charge capacity fade, and charging rates suitable for commercial use, and optionally superior to currently available technologies.

The Group IVA particles may be incorporated into a porous covalent framework to provide a composite for use in anodes of lithium ion batteries, functioning as high capacity anodes having high charge mobility. The composite can provide optimum porosity, allowing ion flow in all directions, thereby reducing internal resistance that can lead to the generation of heat. The composite can accommodate space requirements for lithium at the anode, and resist mechanical breakdown as compared to known silicon based composites. The composite can also provide conduits for electrical charge mobility to and from sites where lithium ions ($Li^+$) become reduced to lithium metal ($Li^0$), and the reverse process in which $Li^0$ atoms become oxidized to $Li^+$. The facile electron mobility may be beneficial also in suppressing the formation of solid electrolyte interface (SEI) films believed to form from solvent decomposition as a consequence of localized electrical potentials. The composite, which conducts charge efficiently, can provide increased recharge rate, decreasing the time required to recharge the battery.

1. DEFINITION OF TERMS

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing of the present invention. All publications, patent applications, patents and other references mentioned herein are incorporated by reference in their entirety. The materials, methods, and examples disclosed herein are illustrative only and not intended to be limiting.

As used in the specification and the appended claims, the singular forms "a," "and" and "the" include plural references unless the context clearly dictates otherwise. The terms "comprise(s)," "include(s)," "having," "has," "can," "contain(s)," and variants thereof, as used herein, are intended to be open-ended transitional phrases, terms, or words that do not preclude the possibility of additional acts or structures. The present disclosure also contemplates other embodiments "comprising," "consisting of" and "consisting essentially of," the embodiments or elements presented herein, whether explicitly set forth or not.

2. FUNCTIONALIZED GROUP IVA PARTICLES

Disclosed herein are Group IVA particles passivated with at least one layer of material covering at least a portion of the particle. The particles include at least one Group IVA element (e.g., silicon, germanium, or tin). The layer of material may be a covalently bonded non-dielectric layer of material, such as a hydrocarbon. The passivated Group IVA particles may also be referred to herein as "Group IVA particles," "functionalized Group IVA particles," "surface-modified Group IVA particles," or a derivative term thereof.

The surface-modified Group IVA particles may be combined with one or more additional components to provide a composition suitable for a particular application. For example, the surface-modified Group IVA particles may be combined with a conductive adhesion additive, a dopant additive, other additional components, or a combination thereof.

Figure 2:
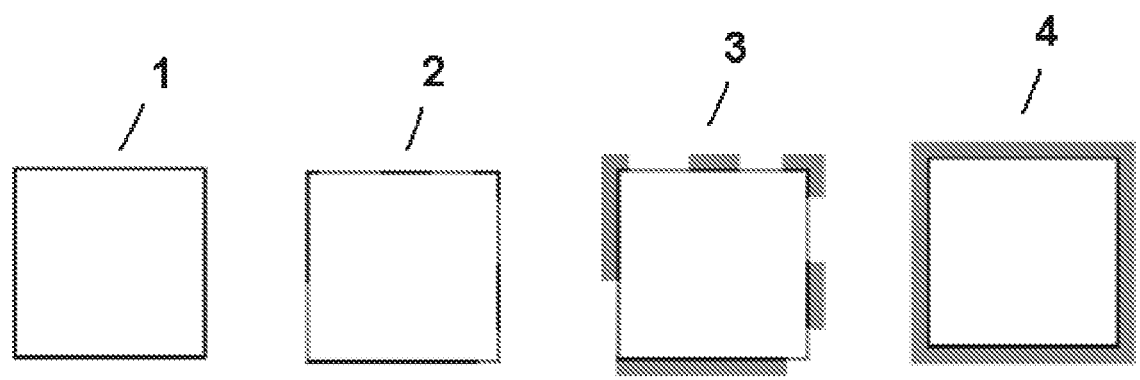
FIG. 2 depicts a simplified representation of passivated Group IVA particles.
Figure 3:
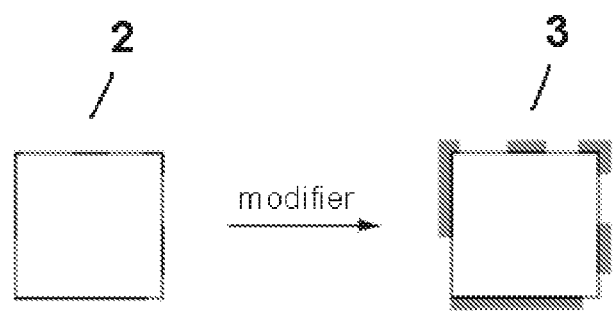
FIG. 3 depicts a simplified representation of a modification reaction from particle 2 to particle 3.

FIG. 2 depicts a simplified representation of passivated Group IVA particles. The Group IVA particles are shown as squares, which are meant to represent cubic particles, although the particles may have irregular shapes and may have a range of sizes. Particle 1, with a black outline, represents particles passivated with benzene, and can be prepared from wafers ground in the absence of oxygen and/or trace amounts of adventitious water. Particle 2 represents Group IVA particles that are partially passivated and partially oxidized (the putative oxidized portions of the surface are represented in light blue). The oxidized portion is inactive and may have been present prior to comminution or it may have been formed from the presence of oxygen and/or water during the comminution to the micron- or submicron-sized Group IVA particles. Particle 3 represents Group IVA particles after they have been surface-modified (e.g., with catechol, 2,3-dihydroxynaphthalene, or 9,10-dibromoanthracene). A modification reaction from particle 2 to particle 3 is shown in FIG. 3 (the modified surfaces of particle 3 are represented with lavender stripes). Particle 4 of FIG. 2 represents a Group IVA particle that is fully surface-modified.

The Group IVA particles may be micron or submicron sized particles. The particles may have a diameter of less than 25 microns, less than 20 microns, less than 15 microns, less 10 microns, less than 5 microns, less than 1 micron, less than 0.5 micron, less than 0.1 micron, or less than 0.05 micron. The particles may have a diameter ranging from about 0.05 micron to about 25 microns, or from about 0.1 micron to about 1 micron. The particles may have a diameter of 0.01 micron, 0.02 micron, 0.03 micron, 0.04 micron, 0.05 micron, 0.06 micron, 0.07 micron, 0.08 micron, 0.09 micron, 0.10 micron, 0.2 micron, 0.3 micron, 0.4 micron, 0.5 micron, 0.6 micron, 0.7 micron, 0.8 micron, 0.9 micron, or 1 micron. The particles produced by the processes disclosed herein may produce particles of uniform diameter, or may produce a distribution of particles of variable diameter.

a. Group IVA Elements and Materials

The Group IVA particles may include elemental silicon (Si), germanium (Ge) or tin (Sn), in their elemental form, or available in a wide range of purities. Impurities may be naturally occurring impurities that occur in metallurgical grade (MG) bulk materials, or may be intentionally added dopants to render the semiconducting properties of the Group IVA materials as n-type or p-type. For silicon, the metallurgical grade bulk material may range from amorphous to polycrystalline and crystalline; and purities may range from about 95% pure to 99.9999% pure. Dopants that render Group IVA materials as p-type semiconductors are typically from Group IIIA elements, such as boron (B) or aluminum (Al). Dopants that render Group IVA semiconductors as n-type are typically from Group VA elements, such as nitrogen (N), phosphorous (P) or arsenic (As). Naturally occurring impurities in metallurgical grade Si typically include metallic elements in the form of metal oxides, sulfides and silicides. The major metallic elements include aluminum (Al), iron (Fe), calcium (Ca) and titanium (Ti), but other elements can be observed in trace quantities.

The Group IVA particles may be derived from a variety of feedstocks. In certain embodiments, the Group IVA particles may be derived from wafers, such as silicon wafers. Of the refined crystalline and polycrystalline bulk materials, wafers from ingots with specific resistivity are available from semiconductor microelectronics manufacturing and solar photovoltaic cell manufacturing. Kerf from wafer manufacturing and scrap, or defective wafers are also available at recycled material prices.

b. Materials for Passivation

The Group IVA particles disclosed herein are functionalized with at least one layer of material over at least a portion of the particle. The layer of material may be covalently bonded to the Group IVA particle. The layer of material may be a non-dielectric layer of material, such as a hydrocarbon. The passivated Group IVA particle may be stable to oxidation in air at room temperature.

The Group IVA particles may be passivated with a variety of compounds, also referred to as "modifiers" or "modifier reagents." The compound may be an organic compound, such as a hydrocarbon based organic compound. In certain embodiments, the compound may be selected from the group consisting of alkenes, alkynes, aromatics, heteroaromatics, cycloalkenes, alcohols, glycols, thiols, disulfides, amines, amides, pyridines, pyrrols, furans, thiophenes, cyanates, isocyanates, isothiocyanates, ketones, carboxylic acids, amino acids, and aldehydes. In certain embodiments, the compound may be selected from the group consisting of toluene, benzene, a polycyclic aromatic, a fullerene, a metallofullerene, a styrene, a cyclooctatetraene, a norbornadiene, a primary $C_2$-$C_{18}$ alkene, a primary $C_2$-$C_{18}$ alkyne, a saturated or unsaturated fatty acid, a peptide, a protein, an enzyme, 2,3,6,7-tetrahydroxyanthracene, catechol, 2,3-hydroxynaphthalene, 9,10-dibromoanthracene, and any combination thereof.

Hydrocarbons chosen for passivation may bear other functional groups that upon activation will form covalent bonds with other reagents. This property provides a basis for covalently linking the Group IVA particles as structural units in building reticular covalent networks. Hydrocarbons chosen for passivation can vary in size and polarity. Both size and polarity can be exploited for targeted particle size selectivity by solubility limits in particular solvents. Partitioning of particle size distributions based on solubility limits is one tactic for narrowing of particle size distributions in commercial scale processes.

While the possibilities of structure and function for Group IVA submicron particles made by the methods disclosed herein are unlimited, the following embodiments are given as examples to demonstrate the range of flexibility for building functional particles through low energy reactions conducted at or near room temperature.

In certain embodiments, the Group IVA particle may be passivated with toluene.

In certain embodiments, the Group IVA particle may be passivated with benzene. A benzene passivated Group IVA particle may serve as a stable intermediate for further modification. Benzene is one of few organic hydrocarbons that will bond reversibly to silicon surfaces. Thus, a benzene passivated Group IVA material is a convenient stable intermediate for introducing other functional hydrocarbons to the particle surface. This is one of few forms of Group IVA material in which thermodynamics plays an important role in the surface chemistry as opposed to be being dominated by kinetics.

In certain embodiments, the Group IVA particle may be passivated with an aromatic hydrocarbon, such as a polycyclic aromatic hydrocarbon. Aromatic hydrocarbons provide for charge mobility across the passivated particle surface. Hydrocarbons with extended pi systems through which charge can travel may be preferred in certain embodiments for non-dielectric passivation of Group IVA material surfaces.

In certain embodiments, the Group IVA particle may be passivated with a carbon nanotube, a fullerene, or a metallofullerene. Such materials may be applied to the particle surfaces either directly to hydrogen passivated surfaces, or by replacement of benzene passivated surfaces. Fullerenes have a very high capacity to disperse electric charge and may impart properties useful in microelectronic applications.

In certain embodiments, the Group IVA particle may be passivated with styrene. Such materials may be applied directly to hydrogen or benzene passivated surfaces. Styrene is known to bond primarily through the pendant vinyl group, leaving the aromatic ring unchanged and free to interact with surrounding solvents, electrolytes, or to be modified by aromatic ring substitution reactions. Functional groups on the phenyl ring may be used as a reactive precursor for forming covalent bonds to a surrounding framework.

In certain embodiments, the Group IVA particle may be passivated with cyclooctatetraene (COT). Such a material may be applied to hydrogen or benzene passivated surfaces, with alternating carbon atoms formally bonded to the particle surface while the other four carbon atoms not bonded directly to the particle surface are connected by two parallel double bonds, providing a diene site capable of Diels-Alder type reactions.

In certain embodiments, the Group IVA particle may be passivated with a norbomadiene reagent. Such materials may be applied to hydrogen or benzene passivated surfaces with attachment of one or both double bonds. If both double bonds interact with the particle surface, a strained structure comparable to quadracyclane may result. Norbomadiene/quadracyclane is known to be an energy storage couple that needs a sensitizer (acetophenone) to capture photons. In certain embodiments, silicon or germanium may also function as a sensitizer.

In certain embodiments, the Group IVA particle may be passivated with a normal primary alkene or alkyne having 6-12 carbon chain lengths. The alkene or alkyne can be used as the reactive medium for the purpose of attaching hydrocarbons to the surface of the Group IVA particles to increase particle size or to change solubility properties of the particles. The longer alkane chain lengths may gamer more intermolecular attraction to solvents, resulting in increased solubility of the particles. Changing the size of Group IVA particles by attaching hydrocarbons may alter photoluminescence properties.

In certain embodiments, the Group IVA particle may be passivated with a biologically active reactive media. Such materials can be used to replace hydrogen passivated surfaces to synthesize biological markers that respond to photons. Fatty acids may bond to active surfaces through the carboxylate group or through one of the chain's unsaturated bonds. Amino acids are water soluble and may bond either though the primary amine or through the acid end, depending on pH. Similarly, peptides, proteins, enzymes all have particular biological functions that may be linked to Group IVA nanoparticle markers.

In certain embodiments, passivated Group IVA nanoparticles may reside in communication with a porous framework capable of transmitting charge in communication with liquid crystal media having charge conduction properties. Such particles may be used for the purpose of capturing and selectively sequestering chemical components of a complex mixture, as a method of measuring their relative concentrations in the mixture. The method of measurement may be by capture of photons by the semiconductor nanoparticles and measurement of electrical impulses generated from photovoltaic properties of said nanoparticles or by sensing photoluminescence as a result of reemitted photons from the media that has been influenced by the captured chemical components.

Figure 4:
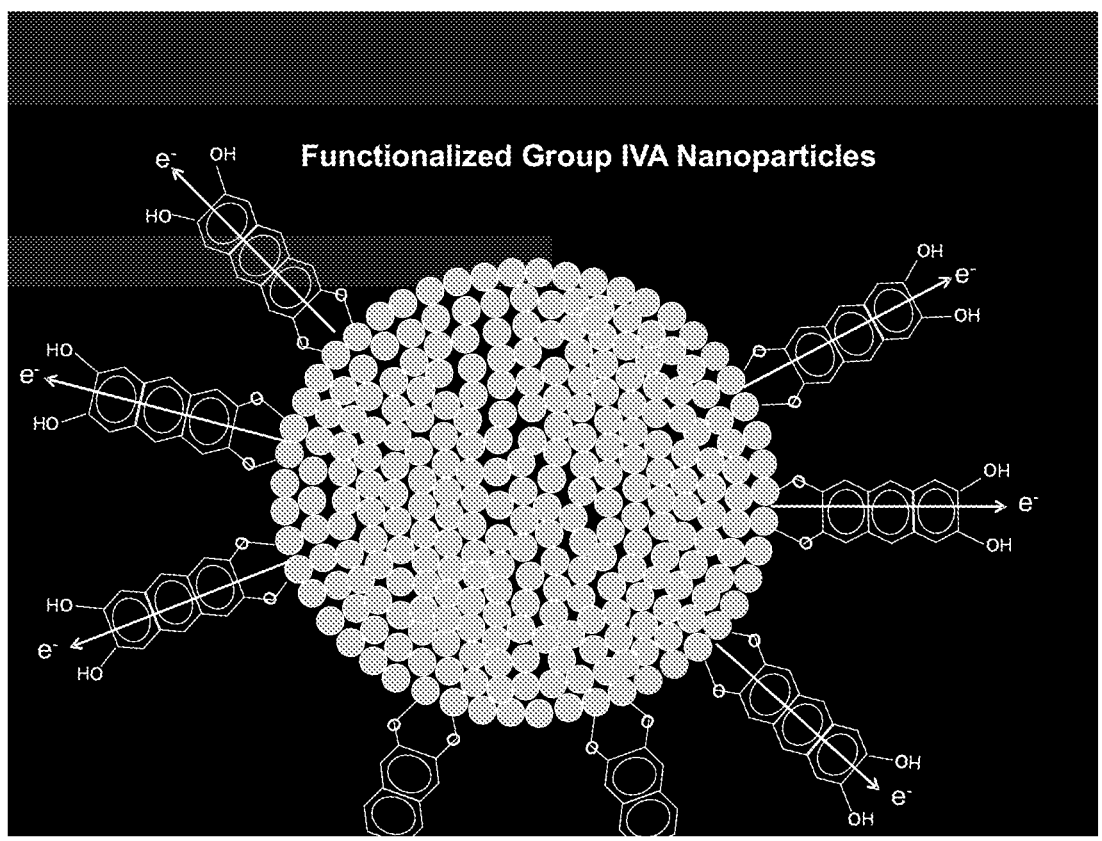
FIG. 4 depicts Group IVA nanoparticles functionalized with 2,3,6,7-tetrahydroxyl-anthracene groups.

In certain embodiments, bifunctional organic chains may be used to replace hydrogen or benzene passivated surfaces. For example, 2,3,6,7-tetrahydroxyanthracene has two hydroxyl groups at each end of a fused chain of three aromatic rings. This hydrocarbon chain may be used to build a covalent framework and may be used to link Group IVA nanoparticles to the framework. The chain length structure and functional groups at the ends of the chains can vary. Some functional groups used for cross-linking between building units can include, but are not limited to: aldehydes, carboxylates, esters, borates, amines, amides, vinyl, halides, and any other cross-linking functional group used in polymer chemistry. Frameworks based on covalently linked porphyrin may have extraordinarily high charge (hole conducting) mobility, greater than amorphous silicon and higher than any other known hydrocarbon composite. Si nanoparticles linked covalently to porous covalent frameworks may serve as high capacity electrode composites for lithium-ion batteries. FIG. 4 depicts Group IVA nanoparticles functionalized with 2,3,6,7-tetrahydroxyanthracene groups.

In certain embodiments, aromatic passivating hydrocarbons may be used to replace hydrogen bonded to reactive surfaces of the Group IVA particles. The aromatic hydrocarbons may promote high charge mobility and can interact with other planar pi systems in the media surrounding the particle. This embodiment may be applied to functioning solar photovoltaic (PV) cells. The aromatic hydrocarbons that form the passivating layer on the particle may or may not possess functional groups that form covalent bonds to the particle or the surrounding media. For example, toluene bonds to active surfaces on silicon, effectively passivating the surface and permitting electrical charge to move from photon generated electron hole pairs in p-type crystalline silicon particles. Sustained electrical diode properties have been measured in films made with high K-dielectric solvents and both p-type and n-type silicon particles passivated with toluene.

In certain embodiments, the Group IVA particle may be passivated with benzene, toluene, catechol, 2,3-dihydroxynaphthalene, 2,3-dihydroxyanthracene, 2,3,6,7-tetrahydroxyanthracene, 9,10-dibromoanthracene, or a combination thereof. It is to be understood that the term "passivated," as used herein, refers to Group IVA particles that may be partially or fully passivated. For example, in certain embodiments, the Group IVA particle may be partially passivated with benzene, toluene, catechol, 2,3-dihydroxynaphthalene, 2,3-dihydroxyanthracene, 2,3,6,7-tetrahydroxyanthracene, 9,10-dibromoanthracene, or a combination thereof. In certain embodiments, the Group IVA particle may be fully passivated with benzene, toluene, catechol, 2,3-dihydroxynaphthalene, 2,3-dihydroxyanthracene, 2,3,6,7-tetrahydroxyanthracene, 9,10-dibromoanthracene, or a combination thereof.

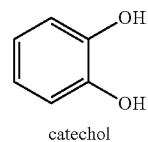

catechol

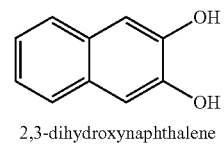

2,3-dihydroxynaphthalene

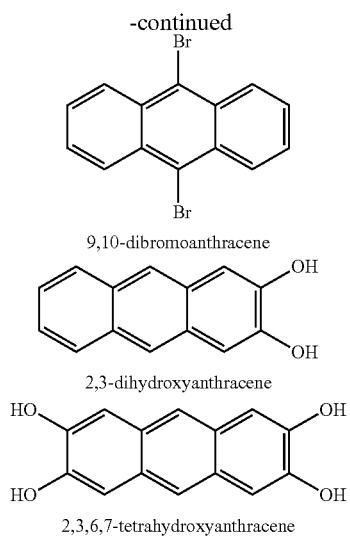

9,10-dibromoanthracene 2,3-dihydroxyanthracene 2,3,6,7-tetrahydroxyanthracene c. Methods of Passivation

The methods of passivation disclosed herein may be conducted at or near room temperature. The methods allow functionalization of Group IVA materials for any application on any substrate/carrier that would otherwise require heat, sintering, environmentally controlled clean rooms and environmentally unfriendly etching, and substrates that would stand up to the heat processing, etc.

In certain embodiments, passivated Group IVA particles may be prepared by providing a first Group IVA micron or submicron sized particle; and treating the particle with a material for passivation to provide a passivated Group IVA particle.

In certain embodiments, passivated Group IVA particles may be prepared by providing a first Group IVA micron or submicron sized particle; and treating the first particle with a compound (preferably other than hydrogen) to provide a passivated Group IVA particle. In certain embodiments, the compound may be benzene. In certain embodiments, the compound may be a material for passivating the Group IVA particle by forming one or more covalent bonds therewith.

In certain embodiments, passivated Group IVA particles may be prepared by subjecting a material comprising a Group IVA element (e.g., bulk crystalline silicon (c-Si) ingots and/or silicon powder such as 325 mesh silicon powder) to comminution in the presence of benzene and optionally one or more non-competing solvents to provide sub-micron to nano-sized benzene-passivated Group IVA particles (e.g., 200-300 nm Group IVA particles); and treating the benzene-passivated Group IVA particles with a material for passivation (e.g., 2,3-dihydroxynaphthalene), optionally in the presence of a non-competing solvent (e.g., triglyme). Optionally, the passivated Group IVA particles may be combined with one or more additives (e.g., conductive adhesion additives and/or dopant additives) to provide a composition or a composite.

In certain embodiments, passivated Group IVA particles may be prepared by subjecting a material comprising a Group IVA element (e.g., bulk crystalline silicon (c-Si) ingots and/or silicon powder such as 325 mesh silicon powder) to comminution in the presence of a material for passivation (other than benzene or hydrogen). The comminution may include use of benzene and/or a non-competing solvent (e.g., triglyme) to provide the sub-micron to nano-sized passivated Group IVA particles (e.g., 200-300 nm Group IVA particles). Optionally, the passivated Group IVA particles may be combined with one or more additives (e.g., conductive adhesion additives and/or dopant additives) to provide a composition or a composite.

In certain embodiments, passivated Group IVA particles may be prepared by subjecting a material comprising a Group IVA element (e.g., bulk crystalline silicon (c-Si) ingots and/or silicon powder such as 325 mesh silicon powder) to comminution in the presence of benzene and optionally one or more non-competing solvents to provide sub-micron to nano-sized benzene-passivated Group IVA particles (e.g., 200-300 nm Group IVA particles); isolating the benzene-passivated Group IVA particles (e.g., by removing solvent(s) under vacuum); treating the benzene-passivated Group IVA particles with a modifier reagent (e.g., 2,3-dihydroxynaphthalene), optionally in the presence of a non-competing solvent (e.g., triglyme) for a selected time (e.g., 6 hours) and temperature (e.g., 220° C.); and isolating the modified Group IVA particles. Optionally, the modified Group IVA particles may be combined with one or more conductive adhesion additives (e.g., $C_{60}$, $C_{70}$ Fullerene derivatives) and/or dopant additives (e.g., $C_{60}F_{48}$) in a selected solvent (e.g., dichloromethane) to provide a slurry; sonicated for a selected time period (e.g., 10 minutes); and optionally dried to provide a composition of modified Group IVA particles and additives.

In certain embodiments, passivated Group IVA particles may be prepared by subjecting a material comprising a Group IVA element (e.g., bulk crystalline silicon (c-Si) ingots and/or silicon powder such as 325 mesh silicon powder) to comminution in the presence of a material for passivation (other than benzene or hydrogen) and optionally one or more non-competing solvents and/or benzene to provide sub-micron to nano-sized passivated Group IVA particles (e.g., 200-300 nm Group IVA particles); and isolating the passivated Group IVA particles (e.g., by removing solvent(s) under vacuum). Optionally, the modified Group IVA particles may be combined with one or more conductive adhesion additives (e.g., $C_{60}$, $C_{70}$ Fullerene derivatives) and/or dopant additives (e.g., $C_{60}F_{48}$) in a selected solvent (e.g., dichloromethane) to provide a slurry; sonicated for a selected time period (e.g., 10 minutes); and optionally dried to provide a composition of modified Group IVA particles and additives.

In certain embodiments, passivated Group IVA particles may be prepared by providing a first Group IVA micron or submicron sized particle; and treating the first particle with a compound (preferably other than hydrogen, and optionally other than benzene) to provide a passivated Group IVA particle.

In certain embodiments, passivated Group IVA particles may be prepared by providing a first Group IVA micron or submicron sized particle; treating the first particle with benzene to yield a benzene passivated Group IVA particle; and treating the benzene passivated Group IVA particle with a compound (preferably other than hydrogen and benzene) to provide a passivated Group IVA particle.

In certain embodiments, passivated Group IVA particles may be prepared by providing a first Group IVA micron or submicron sized particle; treating the first particle with a protic acid to provide a hydrogen passivated Group IVA particle; and treating the hydrogen passivated Group IVA particle with a compound (preferably other than hydrogen) to provide a passivated Group IVA particle.

In certain embodiments, passivated Group IVA particles may be prepared by providing a first Group IVA micron or submicron sized particle; treating the first particle with a protic acid to provide a hydrogen passivated Group IVA particle; treating the hydrogen passivated Group IVA particle with benzene to yield a benzene passivated Group IVA particle; and treating the benzene passivated Group IVA particle with a compound (preferably other than hydrogen) to provide a passivated Group IVA particle.

In cases where it is desirable to replace benzene monolayers with functional hydrocarbons other than solvents, it may be necessary to stir the benzene passivated particles in a non-functional solvent (also referred to herein as a "non-competing solvent") with the desired functional hydrocarbon dissolved or suspended in it. Exemplary non-functional solvents useful in methods of preparing surface-modified Group IVA particles include, but are not limited to, 1,2-dimethoxyethane (also referred to as glyme, monoglyme, dimethyl glycol, or dimethyl cellosolve); 1-methoxy-2-(2-methoxyethoxy)ethane (also referred to as diglyme, 2-methoxyethyl ether, di(2-methoxyethyl) ether, or diethylene glycol dimethyl ether); 1,2-bis(2-methoxyethoxy)ethane (also referred to as triglyme, triethylene glycol dimethyl ether, 2,5,8,11-tetraoxadodecane, 1,2-bis(2-methoxyethoxy)ethane, or dimethyltriglycol); 2,5,8,11,14-pentaoxapentadecane (also referred to as tetraglyme, tetraethylene glycol dimethyl ether, bis[2-(2-methoxyethoxy)ethyl] ether, or dimethoxytetraglycol); dimethoxymethane (also referred to as methylal); methoxyethane (also referred to as ethyl methyl ether); methyl tert-butyl ether (also referred to as MTBE); diethyl ether; diisopropyl ether; di-tert-butyl ether; ethyl tert-butyl ether; dioxane; furan; tetrahydrofuran; 2-methyltetrahydrofuran; and diphenyl ether. For example, naphthalene dissolved in triglyme replaces benzene on the surface of Group IVA particles upon stirring at reflux temperature under nitrogen atmosphere.

The first Group IVA micron or submicron sized particle may be derived from a variety of feedstocks. In certain embodiments, the first particles may be derived from wafers, such as silicon wafers. Of the refined crystalline and polycrystalline bulk materials, wafers from ingots with specific resistivity are available from semiconductor microelectronics manufacturing and solar photovoltaic cell manufacturing. Kerf from wafer manufacturing and scrap, or defective wafers are available at recycled material prices.

The first Group IVA micron or submicron sized particle may be prepared from feedstocks by any suitable process. In certain embodiments, the first Group IVA particle may be prepared from bulk Group IVA materials by comminution processes known in the art. Particle size ranges obtainable from comminution of bulk Group IVA materials has improved with the development of new milling technologies in recent years. Using milling techniques such as high energy ball milling (HEBM), fluidized bed bead mills, and steamjet milling, nanoparticle size ranges may be obtained. Bulk materials are available commercially in a wide range of specifications with narrow ranges of measured electrical resistivity and known dopant concentrations, and can be selected for milling. Other embodiments can be created to produce micron- to nano-sized particles using n-type Group IVA wafers, or wafers with higher or lower resistivity or bulk MG Group IVA ingot material following a similar procedure as above.

Any protic acid may be used to provide the hydrogen passivated Group IVA particle. In certain embodiments, the protic acid is a strong protic acid. In certain embodiments, the protic acid is selected from the group consisting of nitric acid ($HNO_3$), hydrochloric acid (HCl), hydrofluoric acid (HF), and hydrobromic acid (HBr). The protic acid may function to passivate the first Group IVA particle by leaching metal element impurities from the particles, which forms soluble metal chloride salts and gaseous hydrogen ($H_2$), such that the remaining surface (e.g., Si surface) from which impurities have been leached become weakly passivated with hydrogen.

Hydrogen can then be replaced from the Group IVA particles with a selected compound. In certain embodiments, the hydrogen passivated Group IVA particles may be treated with certain functional organic materials (e.g., hydrocarbons) that form strong covalent bonds with Group IVA element. Examples of functional groups that form bonds with Group IVA surfaces (e.g., Si surfaces) include, but are not limited to, alkenes, alkynes, phenyl (or any aromatic cyclic organic compounds), alcohols, glycols, thiols, disulfides, amines, amides, pyridines, pyrrols, furans, thiophenes, cyanates, isocyanates, isothiocyanates, ketones, carboxylic acids, amino acids, aldehydes, and other functional groups able to share electrons through pi bonds or lone pair electrons.

In certain embodiments, following the above sequence of treatments, silicon particles made from impure grades of bulk Si may have irregular shapes, but include a monolayer of hydrocarbons on Si surfaces that have been freshly exposed by leaching gettered impurities or by fracturing during a milling process. Hydrocarbons can be chosen to replace hydrogen bonding to the Si surface that allow a high degree of charge mobility, thus rendering the Si surface effectively non-dielectric. Further reaction of the Si surface with oxygen leading to $SiO_2$ formation may be inhibited by the presence of the hydrocarbon monolayer. Even if areas of the nanoparticle surface are not completely free of dielectric oxides, charge mobility from the nanoparticle to a surrounding framework, or vice versa, may still occur through the non-dielectric passivated areas on the surfaces.

In certain embodiments, passivated Group IVA particles may be prepared by providing a Group IVA powder; reducing the Group IVA powder to submicron particles; within a closed container treating at least a portion of the submicron particles with an aqueous liquid comprising a protic acid; agitating the container for a time sufficient to passivate the submicron particles therein with hydrogen; separating at least a portion of the aqueous liquid from the hydrogen passivated submicron particles; and within a closed container treating the hydrogen passivated submicron particles with a compound (other than hydrogen) to provide passivated Group IVA particles.

The Group IVA powder may be provided by using a mortar and pestle to crush a material comprising Group IVA elements (e.g., silicon wafers), and passing the crushed material through a sieve. The powder may be reduced to submicron particles using a ball mill. In an exemplary embodiment, the powder may be reduced to submicron particles by a Netzsch Dynostar mill using 0.4-0.6 mm yttrium-stabilized zirconia beads. Further processing to smaller average particle size (APS) may be accomplished by using a smaller bead size. A 0.1 mm diameter bead or smaller may allow APS reduction to less than 100 nm.

The treatment of the submicron particles with the protic acid may be conducted in the presence of an agitation device, such as a stir bar or ceramic balls. The agitation of the container to passivate the particles with hydrogen may be accomplished with a roller mill (e.g., at 60 rpm for two hours). The container may be a screw top container. After agitating the container for hydrogen passivation (e.g., for two hours), the container may be allowed to stand motionless (e.g., for another two hours). The container may then be opened to release pressure and at least a portion of the liquid phase removed. Optionally, additional protic acid may be added and the hydrogen passivation step repeated. After hydrogen passivation, the container may be opened to release pressure and the liquid portion may be separated from the solids (e.g., by decantation). In the same or different container and under agitation, the hydrogen passivated submicron particles may be treated with the compound for passivation for a sufficient time (e.g., four to six hours) to affect passivation. The liquid phase may thereafter be removed from the solids (e.g., by syringe).

The solid passivated submicron particles may be dried by evaporation, optionally at reduced pressure at room temperature. Optionally, evaporation may be achieved under reduced pressure. Preferably, when under reduced pressure, care is taken to provide sufficient heat to the evacuated vessel to avoid freezing of the solvent(s). Preferably, care is taken to avoid sweeping nano particles into the receiving flask when the velocity of the solvent vapors is high.

In an industrial process, solvents may be removed by circulating dry nitrogen gas across heated evaporations plates covered with a slurry of the particles/solvent at near atmospheric pressure. The solvent saturated gas may be passed through a condenser to recover the solvents and restore the unsaturated gas for further recirculation. This process may minimize carryover of nanoparticles into the solvent condenser.

Figure 5:
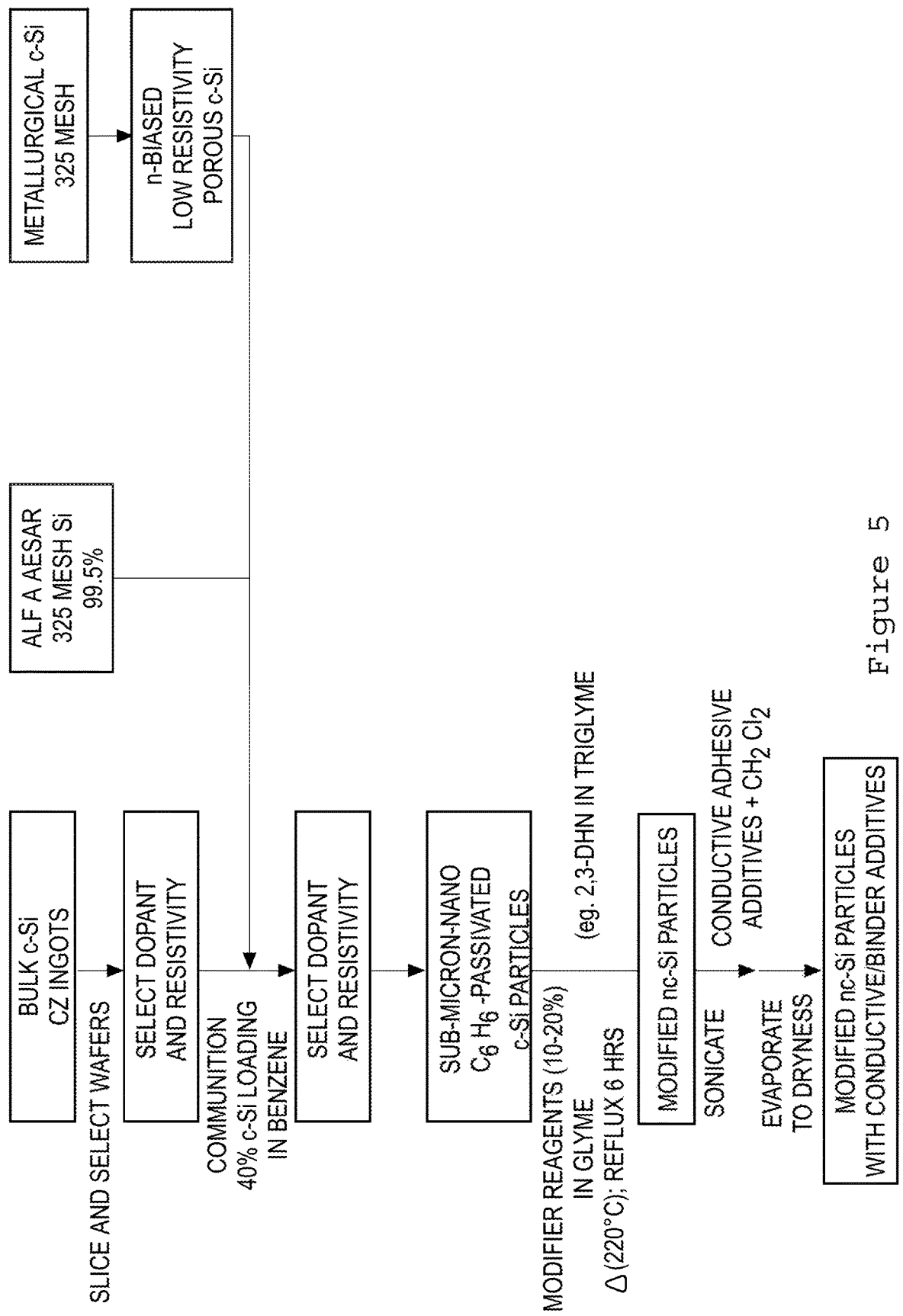
FIG. 5 depicts one exemplary process for preparing functionalized Group IVA particles.

FIG. 5 shows one exemplary process for preparing functionalized Group IVA particles. The Group IVA particles may be derived from bulk crystalline silicon (c-Si) ingots (e.g., P-doped (n-type) silicon having a resistivity of 0.4-0.6 $\Omega cm^{-1}$), and/or silicon powder such as 325 mesh silicon powder (e.g., 325 mesh Si, 99.5% available from Alfa Aesar, 26 Parkridge Rd Ward Hill, MA 01835 USA; or metallurgical grade c-Si 325 mesh). The bulk c-Si ingots can be sliced into wafers. Where metallurgical c-Si 325 mesh is used, the material may be subjected to acid leaching and hydrofluoric (HF) acid etching to provide n-biased low resistivity porous c-Si. The sliced wafers and/or the silicon powder may be subjected to comminution in benzene to provide sub-micron to nano-sized benzene-passivated c-Si particles (e.g., 200-300 nm particles). The initial solids loading in the comminution slurry may be between 30 wt % to 40 wt %, and decrease (by adding additional solvent) as the particle size distribution declines in order to maintain an optimum slurry viscosity. The benzene solvent may be removed via vacuum distillation followed by vacuum drying (e.g., for 6 hours at 23° C.) to provide the benzene-passivated c-Si particles. A selected amount (e.g., 1 gram) of the benzene-passivated c-Si particles may be treated with a modifier reagent (e.g., 2,3-dihydroxynaphthalene) in a non-functional solvent (e.g., triglyme) and refluxed for a selected time (e.g., 6 hours) and temperature (e.g., 220° C.). After refluxing, the modified nc-Si particles may be allowed to settle and the non-functional solvent removed (e.g., by decanting, or filtering). The modified nc-Si particles may be washed (e.g., with an ether solvent) and then dried. The modified nc-Si particles (e.g., optionally in a dried and powdered form) may be combined with one or more conductive adhesion additives (e.g., $C_{60}$, $C_{70}$ Fullerene derivatives) in a selected solvent (e.g., dichloromethane) to provide a slurry. Optionally, a dopant additive (e.g., $C_{60}F_{48}$) may also be added to the slurry. The slurry may be sonicated for a selected time period (e.g., 10 minutes) and then dried (e.g., air dried or vacuum) to provide a composition of modified nc-Si particles and conductive/binder additives.

d. Characterization of Group IVA Particles

The Group IVA particles may be characterized by a variety of methods. For example, characterization of the passivated particles may be accomplished with scanning electron microscopy (SEM), thermogravimetric analysis—mass spectrometry (TGA-MS), and/or molecular fluorescence spectroscopy.

SEM images may be used to measure individual particles and to gain more assurance that particle size measurements truly represent individual particles rather than clusters of crystallites. While SEM instruments also have the capability to perform Energy Dispersive X-ray Spectrometry (EDS), it is also possible with sufficiently small particle sizes that an elemental composition will confirm the presence of carbon and the absence of oxides through observance and absence respectively of their characteristic K-alpha signals. Iron and other metal impurities may be observed and do not interfere with the observance of lighter elements.

Another analytical method that can be used to demonstrate the presence of and identify the composition of monolayers on nanoparticles is the combined method of thermogravimetric analysis and mass spectrometry (TGA-MS). With sufficient surface area, the fraction of surface molecules to the mass of the particles may be sufficiently high enough that mass of the monolayer can be detected gravimetrically as it desorbs or disbonds from the particle surfaces when a sample is heated. Excess solvent evolved as the mass is heated will appear near the normal boiling point of that solvent, while solvent molecules that belong to the bonded monolayer will be released at a significantly higher temperature. If the release of the monolayer comprises too small of a fraction of the total mass weight to be seen on a percentage scale of total mass lost, it may still be detected by a mass-spectrometer used to monitor off gases during a TGA experiment. Monitoring the total ion current derived from the major mass fragments of the surface molecules' parent ion is a very sensitive tool to verify composition and the precise temperature at which these molecules are released.

Still another very sensitive test to detect the presence of surface-bound unsaturated or aromatic hydrocarbons is by its fluorescence spectrum. While the measurement of a fluorescence spectrum can be accomplished by more than one method, a reflectance spectrum from a slurry or suspension of Group IVA particles in a non-fluorescing solvent flowing in a HPLC stream through a fluorescence detector can be employed with nanoparticles. By measuring shifts in the irradiation maxima and the resulting fluorescence spectra of the bound monolayer compared with that of the free solvent, the perturbation due to the surface bonding interactions can be assessed.

For nanoparticles less than about 50 nm, the use of nuclear magnetic resonance (NMR) becomes a feasible method to measure the effects of bonding of the surface molecules by observing the resonance of singlet state isotopes that have strong gyromagnetic ratios. Carbon 13, hydrogen, and silicon 29 are all candidates that exhibit reasonable sensitivity toward NMR. Because these nanoparticles may be insoluble in all solvents, a preferred technique to acquire NMR spectra in the solid state is by the method of cross-polarization-magic angle spinning (CP-MAS) NMR spectrometry. Significant resonance shifts would be expected from bonding interactions with surface molecules compared to the unperturbed or natural resonance positions. These resonance shifts may indicate the predominant mode of bonding between specific atoms of the surface molecules and the surface Group IVA atoms. The presence of any paramagnetic or ferromagnetic impurities in the Group IVA material may interfere with and prevent the acquisition of NMR spectra. Thus, preferably only highly pure, iron-free Group IVA particles of less than 50 nm diameter are candidates for NMR analysis.

3. COMPOSITIONS AND COMPOSITES

The functionalized Group IVA particles may be provided in compositions (e.g., inks, pastes, and the like) or composites. The compositions or composites may include the functionalized Group IVA particles, and optionally one or more additive components. In certain embodiments, a composition or composite includes functionalized Group IVA particles and a conductive cohesion additive. In certain embodiments, a composition or composite includes functionalized Group IVA particles and a dopant additive. In certain embodiments, a composition or composite includes functionalized Group IVA particles and a solvent. In certain embodiments, a composition or composite includes functionalized Group IVA particles, a conductive cohesion additive, and a dopant additive. In certain embodiments, a composition or composite includes functionalized Group IVA particles, a conductive cohesion additive, and a solvent. In certain embodiments, a composition or composite includes functionalized Group IVA particles, a dopant additive, and a solvent. In certain embodiments, a composition or composite includes functionalized Group IVA particles, a conductive cohesion additive, a dopant additive, and a solvent.

The functionalized Group IVA particles may be present in a composite in an amount ranging from 50 wt % to 100 wt %, 60 wt % to 100 wt %, or 75 wt % to 100 wt %. In certain embodiments, the functionalized Group IVA particles may be present in a composite in an amount of about 50 wt %, about 60 wt %, about 65 wt %, about 70 wt %, about 75 wt %, about 80 wt %, about 85 wt %, about 90 wt %, about 95 wt %, or about 100 wt %. In certain embodiments, the functionalized Group IVA particles may be present in a composite in an amount of 50 wt %, 51 wt %, 52 wt %, 53 wt %, 54 wt %, 55 wt %, 56 wt %, 57 wt %, 58 wt %, 59 wt %, 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, 95 wt %, 96 wt %, 97 wt %, 98 wt %, 99 wt %, or 100 wt %.

Suitable conductive cohesion additives include, but are not limited to, $C_{60}$, $C_{70}$, and other Fullerene derivatives. In certain embodiments, the conductive cohesion additive may be $C_{60}$ Fullerene. The conductive cohesion additive may be present in a composite in an amount ranging from 0 wt % to 1 wt %, 0 wt % to 2 wt %, 0 wt % to 3 wt %, 0 wt % to 4 wt %, 0 wt % to 5 wt %, 0 wt % to 10 wt %, 0 wt % to 15 wt %, 0 wt % to 20 wt %, 0 wt % to 30 wt %, 0 wt % to 40 wt %, or 0 wt % to 50 wt %. In certain embodiments, the conductive cohesion additive may be present in a composite in an amount of about 0 wt %, about 5 wt %, about 10 wt %, about 15 wt %, about 20 wt %, about 25 wt %, about 30 wt %, about 35 wt %, about 40 wt %, about 45 wt %, or about 50 wt %. In certain embodiments, the conductive cohesion additive may be present in a composite in an amount of 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, 45 wt %, 46 wt %, 47 wt %, 48 wt %, 49 wt %, or 50 wt %.

Suitable dopant additives include, but are not limited to, Fullerene $(F)_n$, Fullerene $(CF_3)_n$, polycyclic aromatic hydrocarbon $(CF_3)_n$, polycyclic aromatic hydrocarbon $(F_n)$. In certain embodiments, the dopant additive may be $C_{60}F_{48}$. The dopant additive may be present in a composite in an amount ranging from 0 wt % to 1 wt %, 0 wt % to 2 wt %, 0 wt % to 3 wt %, 0 wt % to 4 wt %, 0 wt % to 5 wt %, or 0 wt % to 10 wt %. In certain embodiments, the dopant additive may be present in a composite in an amount of about 0 wt %, about 1 wt %, about 2 wt %, about 3 wt %, about 4 wt %, about 5 wt %, about 6 wt %, about 7 wt %, about 8 wt %, about 9 wt %, or about 10 wt %. In certain embodiments, the dopant additive may be present in a composite in an amount of 0.1 wt %, 0.2 wt %, 0.3 wt %, 0.4 wt %, 0.5 wt %, 0.6 wt %, 0.7 wt %, 0.8 wt %, 0.9 wt %, 1.0 wt %, 1.1 wt %, 1.2 wt %, 1.3 wt %, 1.4 wt %, 1.5 wt %, 1.6 wt %, 1.7 wt %, 1.8 wt %, 1.9 wt %, 2.0 wt %, 2.1 wt %, 2.2 wt %, 2.3 wt %, 2.4 wt %, 2.5 wt %, 2.6 wt %, 2.7 wt %, 2.8 wt %, 2.9 wt %, 3.0 wt %, 3.1 wt %, 3.2 wt %, 3.3 wt %, 3.4 wt %, 3.5 wt %, 3.6 wt %, 3.7 wt %, 3.8 wt %, 3.9 wt %, 4.0 wt %, 4.1 wt %, 4.2 wt %, 4.3 wt %, 4.4 wt %, 4.5 wt %, 4.6 wt %, 4.7 wt %, 4.8 wt %, 4.9 wt %, 5.0 wt %, 5.1 wt %, 5.2 wt %, 5.3 wt %, 5.4 wt %, 5.5 wt %, 5.6 wt %, 5.7 wt %, 5.8 wt %, 5.9 wt %, 6.0 wt %, 6.1 wt %, 6.2 wt %, 6.3 wt %, 6.4 wt %, 6.5 wt %, 6.6 wt %, 6.7 wt %, 6.8 wt %, 6.9 wt %, 7.0 wt %, 7.1 wt %, 7.2 wt %, 7.3 wt %, 7.4 wt %, 7.5 wt %, 7.6 wt %, 7.7 wt %, 7.8 wt %, 7.9 wt %, 8.0 wt %, 8.1 wt %, 8.2 wt %, 8.3 wt %, 8.4 wt %, 8.5 wt %, 8.6 wt %, 8.7 wt %, 8.8 wt %, 8.9 wt %, 9.0 wt %, 9.1 wt %, 9.2 wt %, 9.3 wt %, 9.4 wt %, 9.5 wt %, 9.6 wt %, 9.7 wt %, 9.8 wt %, 9.9 wt %, or 10.0 wt %.

Suitable solvents include, but are not limited to, dichloromethane (also referred to as methylene chloride); 1,2-dichloroethane; 1,1-dichloroethane; 1,1,1-trichloropropane; 1,1,2-trichloropropane; 1,1,3-trichloropropane; 1,2,2-trichloropropane; 1,2,3-trichloropropane; 1,2-dichlorobenzene (also referred to as ortho-dichlorobenzene); 1,3-dichlorobenzene (also referred to as meta-dichlorobenzene); 1,4-dichlorobenzene (also referred to as para-dichlorobenzene); 1,2,3-trichlorobenzene; 1,3,5-trichlorobenzene; α,α,α-trichlorotoluene; and 2,4,5-trichlorotoluene. Suitable solvents may also include N-methyl pyrrolidinone (NMP), dimethylsulfoxide (DMSO), tetrahydrofuran (THF), nitromethane, hexamethylphosphoramide (HMPA), dimethylforamide (DMF), and sulfalone. The solvent may be present in a composite in an amount ranging from 0 wt % to 0.05 wt %, 0 wt % to 0.1 wt %, 0 wt % to 0.5 wt %, 0 wt % to 1 wt %, 0 wt % to 2 wt %, or 0 wt % to 3 wt %. The solvent may be present in a composite in an amount of 3 wt % or less, 2 wt % or less, 1 wt % or less, 0.5 wt % or less, 0.1 wt % or less, 0.01 wt % or less, or 0.001 wt % or less.

The solids loading (e.g., functionalized Group IVA particles, and optional additives) in an ink (e.g., for ink jet printing) may range from 1 wt % to 60 wt %, or 10 wt % to 50 wt %. In certain embodiments, the solids loading in an ink may be about 1 wt %, about 5 wt %, about 10 wt %, about 15 wt %, about 20 wt %, about 25 wt %, about 30 wt %, about 35 wt %, about 40 wt %, about 45 wt %, or about 50 wt %. In certain embodiments, the solids loading in an ink may be 1 wt %, 2 wt %, 3 wt %, 4 wt %, 5 wt %, 6 wt %, 7 wt %, 8 wt % 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, 45 wt %, 46 wt %, 47 wt %, 48 wt %, 49 wt %, or 50 wt %. The balance of weight may be attributed to one or more solvents of the ink.

The solids loading (e.g., functionalized Group IVA particles, and optional additives) in a composition (e.g., for spreading or paintbrush application) may range from 1 wt % to 60 wt %, 10 wt % to 50 wt %, or 25 wt % to 40 wt %. In certain embodiments, the solids loading in a composition may be about 1 wt %, about 5 wt %, about 10 wt %, about 15 wt %, about 20 wt %, about 25 wt %, about 30 wt %, about 35 wt %, about 40 wt %, about 45 wt %, about 50 wt %, about 55 wt %, about 60 wt %, or about 65 wt %. In certain embodiments, the solids loading in a composition may be 1 wt %, 2 wt %, 3 wt %, 4 wt %, 5 wt %, 6 wt %, 7 wt % 8 wt %, 9 wt %, 10 wt %, 11 wt % 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, 45 wt %, 46 wt %, 47 wt %, 48 wt %, 49 wt %, 50 wt %, 51 wt %, 52 wt %, 53 wt %, 54 wt %, 55 wt %, 56 wt %, 57 wt %, 58 wt %, 59 wt %, 60 wt %, 61 wt %, 62 wt %, 63 wt %, 64 wt %, or 65 wt %. The balance of weight may be attributed to one or more solvents of the composition.

Figure 6:
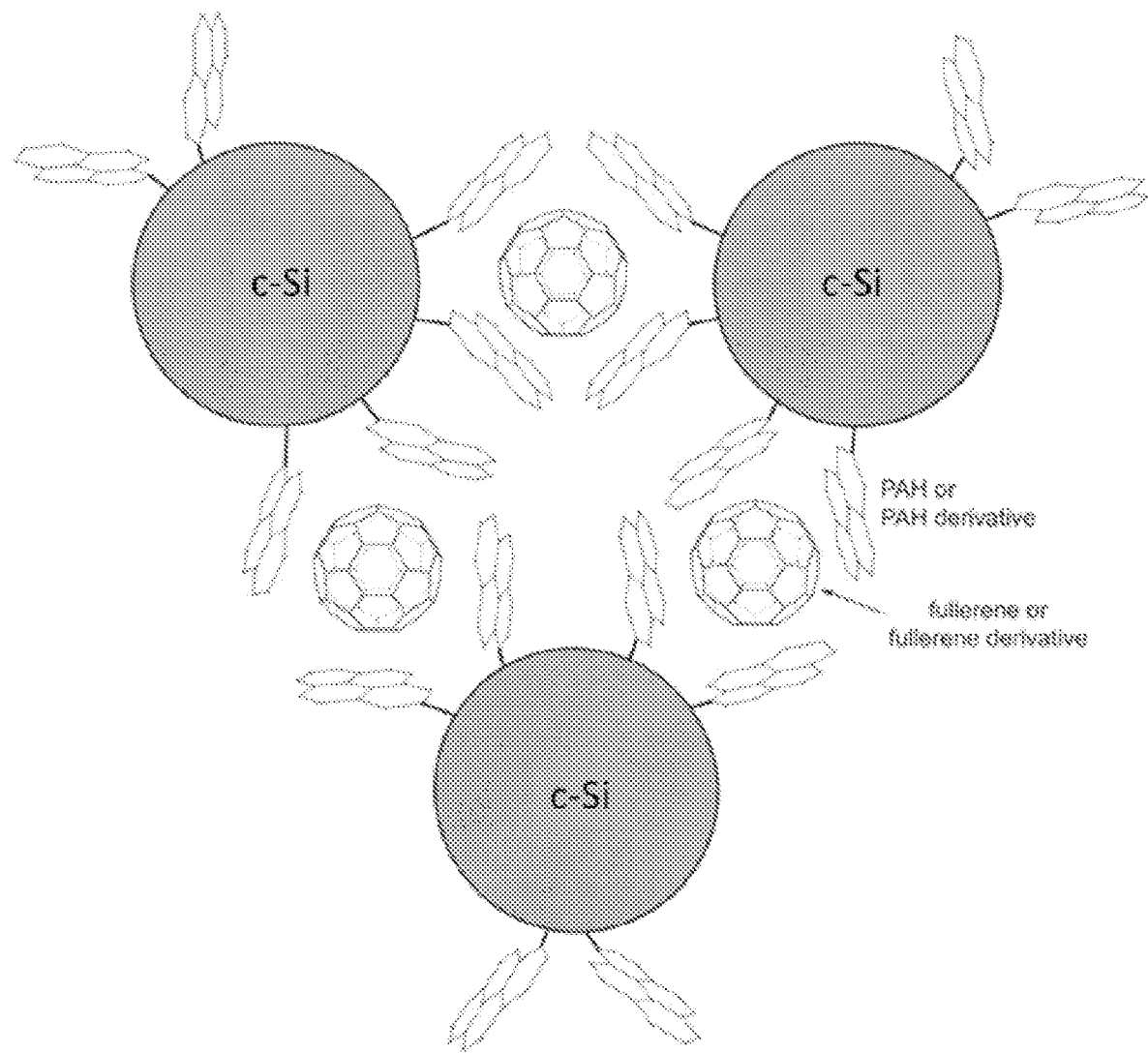
FIG. 6 depicts one exemplary composite for c-Si conductive films.

FIG. 6 shows one exemplary composite for c-Si conductive films. The composite includes a plurality of silicon particles functionalized with polycyclic aromatic hydrocarbon (PAH) compounds, which are covalently bound to the silicon particles. The composite further comprises Fullerene or Fullerene derivatives, which may serve as electron acceptor additives.

4. SET FILMS

As described above, Group IVA particles may be incorporated into a porous covalent framework to provide a composite for use in anodes of lithium ion batteries, functioning as high capacity anodes having high charge mobility. The composite can provide optimum porosity, allowing ion flow in all directions, thereby reducing internal resistance that can lead to the generation of heat. The composite can accommodate space requirements for lithium at the anode, and resist mechanical breakdown as compared to known silicon based composites. The composite can also provide conduits for electrical charge mobility to and from sites where lithium ions ($Li^+$) become reduced to lithium metal ($Li^0$), and the reverse process in which $Li^0$ atoms become oxidized to $Li^+$. The facile electron mobility may be beneficial also in suppressing the formation of solid electrolyte interface (SEI) films believed to form from solvent decomposition as a consequence of localized electrical potentials. While SEI formation is essential for the continued operation of all secondary Li+ batteries, too much buildup of SEI leads to high internal resistance and capacity fade with eventual complete failure of the battery. Silicon (Si) surfaces that are not modified with an electrically conductive passivation layer tend to form multiple SEI layers as cycling occurs due to the delamination of the previously formed SEI layer from the Si surface by $Li^+$ expansion between the SEI and the Si surface and reformation of a new SEI layer.

The benefit of a covalently bonded conductive monolayer on the silicon surface is that it forces the Li+ permeable SEI layer to form above the Si surface, allowing Li atoms to reside close to the Si surface without delaminating the SEI layer. By selecting the optimum length, shape, and electronic properties of the molecules that comprise the conductive monolayer that modify the Si surface, the monolayer becomes an integral part of the conductive framework while it also prevents the initial formation of SEI too close to the Si surface and provides space to accommodate Li atoms. The original SEI layer stays in-tact because the composite as described above suppresses delamination of the original SEI layer and the formation of additional SEI layers. The composite, which conducts charge efficiently, can provide increased recharge rate, decreasing the time required to recharge the battery.

5. APPLICATIONS

The functionalized Group IVA particles, including compositions and composites comprising the functionalized Group IVA particles, may be used in a variety of applications. The Group IVA particles may be used where spectral shifting due to quantum confinement is desirable, and particle size distributions under 15 nanometers (nm) are required. The Group IVA particles may be used where particle size compatibility with a porous framework is desired, or it is desired to have material properties that resist amalgamation with other metals such as lithium (Li). The Group IVA particles may be used to provide viable commercial products using specific particle size distribution ranges.

The Group IVA particles may be prepared and stored for use.

The Group IVA particles may be provided into a selected solvent and applied to a selected substrate to provide a conductive film. The surface-modified Group IVA particle/solvent mixture useful for application to a substrate may be referred to as an "ink," a "paste," or an "anode paste." Suitable solvents for preparing the inks include, but are not limited to, dichloromethane (also referred to as methylene chloride); 1,2-dichloroethane; 1,1-dichloroethane; 1,1,1-trichloropropane; 1,1,2-trichloropropane; 1,1,3-trichloropropane; 1,2,2-trichloropropane; 1,2,3-trichloropropane; 1,2-dichlorobenzene (also referred to as ortho-dichlorobenzene); 1,3-dichlorobenzene (also referred to as meta-dichlorobenzene); 1,4-dichlorobenzene (also referred to as para-dichlorobenzene); 1,2,3-trichlorobenzene; 1,3,5-trichlorobenzene; α,α,α-trichlorotoluene; and 2,4,5-trichlorotoluene. Substrates coated with the ink may be further processed for fabrication of products and devices including the conductive film.

Fields of useful applications for the functionalized Group IVA particles and conductive films including the particles include, but are not limited to, rendering solubility of functional nano particles in various solvent systems for the purpose of separation of particle size distributions; to enhance transport properties in biological systems such as blood or across diffusible membranes; to alter quantum effects of nanoparticles and to optimize the properties of electronic films used in solar photovoltaics, luminescence, biosensors, field-effect transistors, pigments, electromagnetic energy sensitizers and catalysts involving electron transfers.

a. Battery Applications

Figure 7:
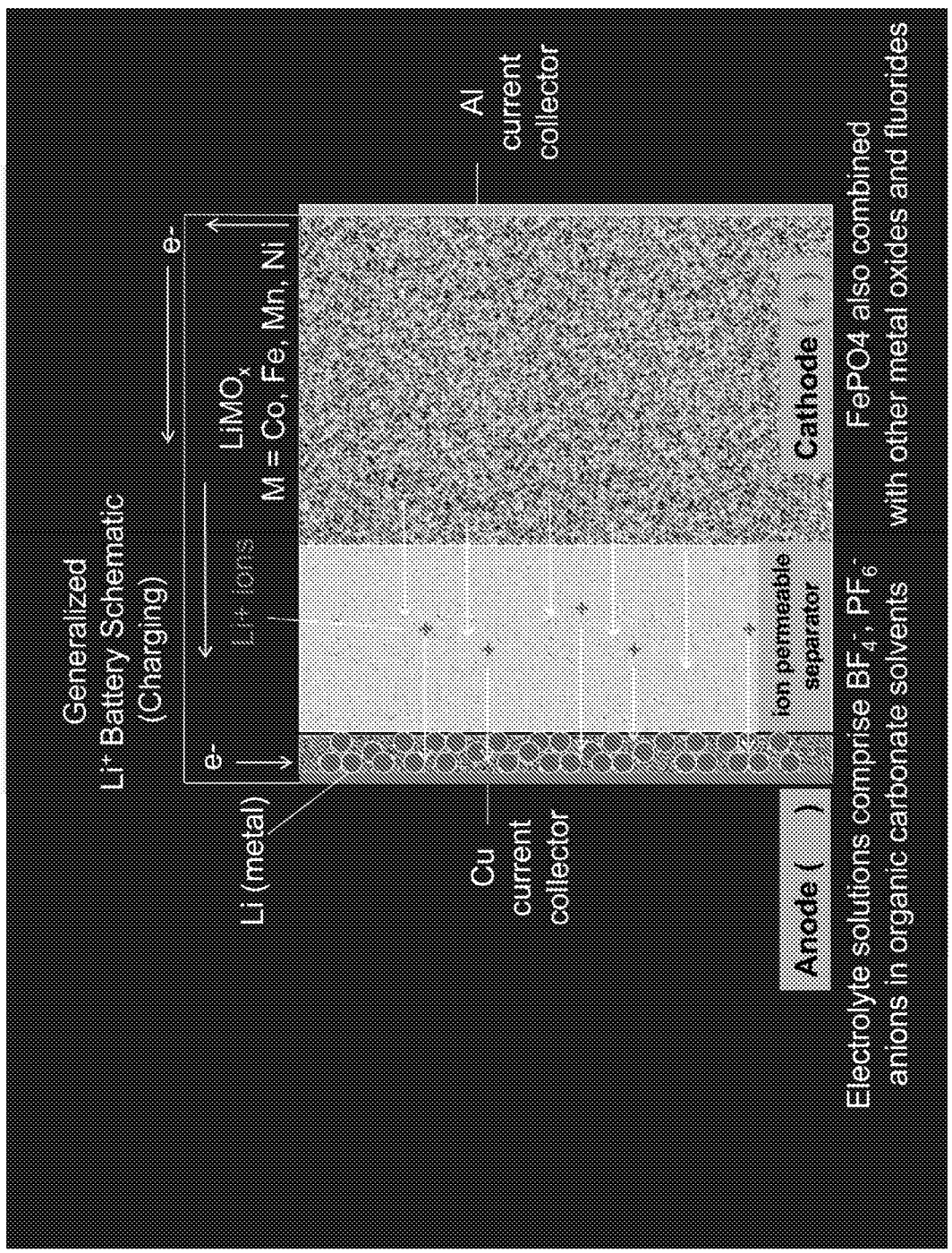
FIG. 7 depicts a lithium ion battery using a silicon-covalent porous framework anode.

The functionalized Group IVA particles may be useful in battery applications, particularly in anodes of lithium ion batteries. FIG. 7 depicts a lithium ion battery using a anode fabricated using functionalized Group IVA (e.g., a composite comprising Group IVA particles, conductive cohesion additives, and/or dopant additives).

Anodes fabricated from the functionalized Group IVA particles may exhibit suitable performance in one or more of specific charge capacity, fade, and discharge/recharge current, such that secondary lithium-ion ($Li^+$) batteries containing anodes made with the surface-modified Group IVA particles are commercially viable. The term "specific charge capacity," as used herein, may refer to how much energy a battery can deliver per gram of surface-modified Group IVA particles in the battery anode. The term "fade," as used herein, may refer to how many discharge/recharge cycles a battery can undergo before a given loss of charge capacity occurs (e.g., no more than 2% over 100 cycles, or 10% over 500 cycles, or some other value determined in part by how the battery will be used). The term "discharge/recharge current," as used herein, may refer to how fast a battery can be discharged and recharged without sacrificing charge-capacity or resistance to fade.

Specific charge capacity, fade, and discharge/recharge current may not be dependent on one another. In certain embodiments, a battery comprising an anode fabricated with the surface-modified Group IVA particles may exhibit good specific charge capacity but poor resistance to fade. In certain embodiments, a battery comprising an anode fabricated with the surface-modified Group IVA particles may exhibit a modest specific charge capacity but very good resistance to fade. In certain embodiments, a battery comprising an anode fabricated with the surface-modified Group IVA particles may exhibit either good specific charge capacity, good resistance to fade, or both, with either a good (high) discharge/recharge current or a poor (low) discharge/recharge current. In certain embodiments, a battery comprising an anode fabricated with the surface-modified Group IVA particles may exhibit a high specific charge capacity (as close to the theoretical maximum of 4,000 mAh/g as possible), excellent resistance to fade, and very fast discharging/recharging.

Figure 8:
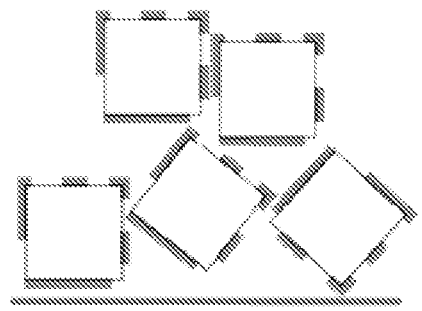
FIG. 8 depicts a simplified representation of an anode material including functionalized Group IVA particles.
Figure 9:
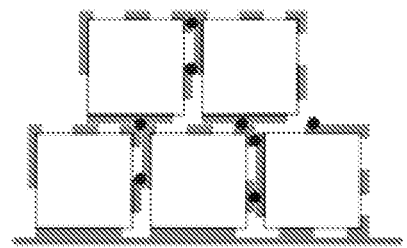
FIG. 9 depicts a simplified representation of an anode material including functionalized Group IVA particles and a conductive adhesion additive.
Figure 10:
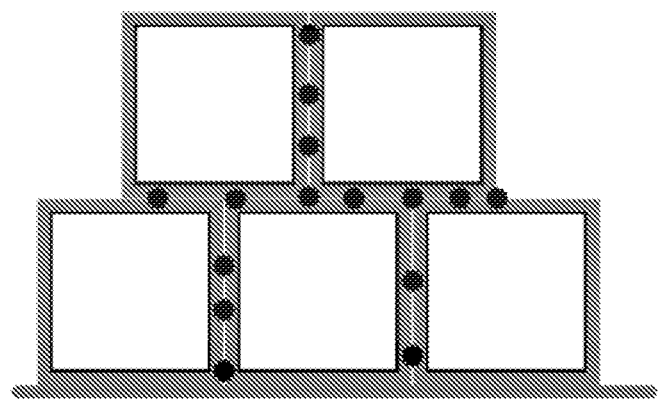
FIG. 10 depicts a simplified representation of an anode material including functionalized Group IVA particles, and a conductive adhesion additive and/or a dopant additive.

Anodes prepared with unmodified, partially-oxidized particles have poor conductivity (hence low discharge/recharge current) because the particles are only in electrical contact over a fraction of their surface, and they have poor specific charge capacity because some of the particles are not in electrical contact with the majority of the particles. This situation can be mitigated to some extent when the Group IVA are modified (e.g., with 2,3-dihydroxynaphthalene) before they are made into anodes. FIGS. 8-10 depict a simplified representation of plurality of passivated Group IVA particles in electrical contact in an anode. An anode material according to FIG. 8 may provide batteries with poor specific charge capacity but good resistance to fade. FIG. 9 shows an anode of surface-modified Group IVA particles in the presence of a $C_{60}$ conductive adhesion additive (the $C_{60}$ molecules are dark-blue Vercro-like circles). When $C_{60}$ is added to the anode paste before making the anode, the density of the anode per unit volume increases, the specific-charge capacity of the anode increases, and in some cases the discharge/recharge current increases. The $C_{60}$ molecules may "glue" the particles together, increasing the fraction of particles in electrical contact and increasing the electrical conductivity (and hence increasing the speed at which $Li^+$ ions are initially charged into, are discharged out of, or are recharged into, the anode). When an additional dopant additive $C_{60}F_{48}$ is present (not shown in FIG. 9), one or more of specific charge capacity, fade, and discharge/recharge current may be improved. FIG. 10 shows an anode fabricated from an anode paste comprising un-oxidized functionalized Group IVA particles, a conductive adhesion additive, and a dopant additive. The anode of FIG. 10 may exhibit superior performance in all of specific charge capacity, fade, and discharge/recharge current.

Figure 11:
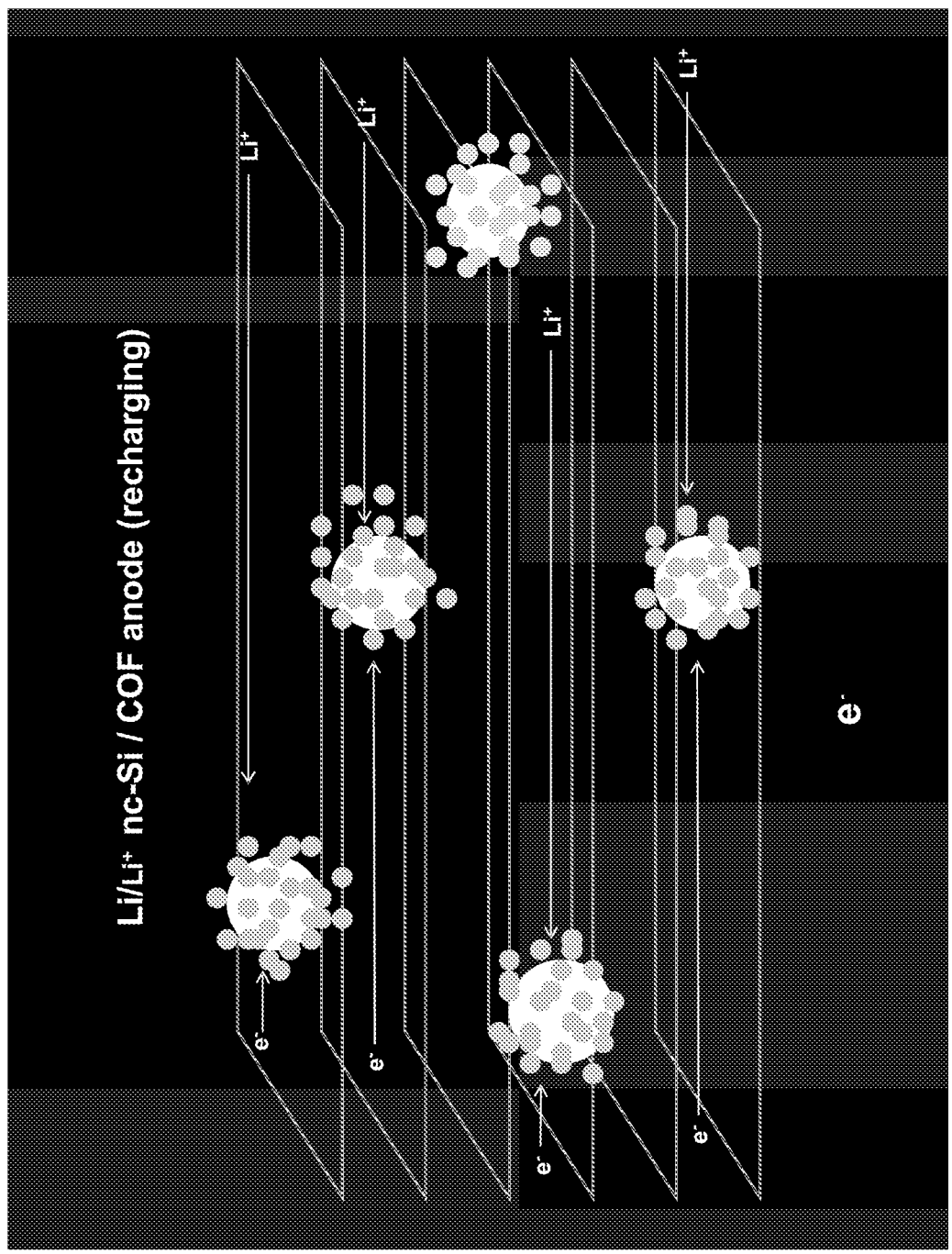
FIG. 11 depicts a porous framework composite including functionalized Group IVA particles.

In certain embodiments, the passivated Group IVA particles may be covalently bonded to a porous covalent framework. The framework including the Group IVA particles may be particularly useful in lithium ion battery applications. The framework may be a covalent organic framework, a metal organic framework, or a zeolitic imidazolate framework. The framework may be a 2-dimensional framework or a 3-dimensional framework. A complete framework composite may comprise multiple sheets of frameworks stacked and aligned on top of one another. The sheets may be aligned and stacked in close proximity with one another to provide electron mobility in the perpendicular direction to the plane of the sheets. FIG. 11 depicts one porous framework composite according to the present invention that may serve as an anode in a lithium ion battery application.

Submicron silicon particles bonded to a porous covalent framework with high charge mobility may provide a high capacity anode in lithium-ion batteries. Silicon is known to form amalgams with lithium having the capacity to attract a greater mass of lithium than any other known element. Anodes with silicon have the capacity to attract more than 10 times the mass of lithium than conventional carbon-based anode composites. Consequently, material scientists and battery manufacturers have attempted to form silicon bearing composites that function as the anode in lithium-ion batteries. The primary hurdle facing these efforts relates the charge/recharge cycle stability of the anode composites. This is because no structural form of bulk silicon (or germanium) can accommodate the spatial requirement imposed by the accumulated lithium and the composites degrade mechanically after the first charge cycle.

Because lithium-ion batteries are often developed as secondary batteries (rechargeable) they must undergo many charge/recharge cycles (1000 or more) without significant loss of charge capacity. Thus, if silicon is used in lithium-ion battery anodes, the structure of the composite must be capable of accommodating large amounts of lithium (approximately 4 times the volume with a full Li charge compared to the composite with no Li accumulation). Si particles must also be small enough to resist amalgamation by lithium. Si nanowires and nanoporous silicon and quantum dots have all demonstrated the ability to attract lithium without causing mechanical changes to the silicon particles. Thus, a nano-porous composite comprising surface-modified crystalline silicon particles may be produced to provide porosity and high surface area that allows access to lithium ions and space in between particles for expansion for the growth of reduced lithium metal.

A framework that supports silicon particles may allow $Li^+$ ions to migrate. The porous framework may accommodate solvents and electrolytes and allow free migration of ions ideally in all directions. The frameworks can be designed with optimum porosity (see Example 1). The reticular pattern with which the structural units are assembled may result in perfectly even porosity throughout the framework, allowing ion flow in all directions with no "hot spots" or areas of restricted flow that contribute to a battery's internal resistance leading to the generation of heat (see Example 2). A framework may be constructed from efficient packing of particles of random shapes within a size distribution that provides adequate porosity for permeation of Li$^+$ ions and electrolyte solutions.

Porous electrode composites may allow charge to be conducted from sites where reduction and oxidation occurs to the current collector. The conduction path is bidirectional since the direction of charge and electrolyte flow are reversed when the battery is being recharged as opposed to when the battery is providing electrical power. Frameworks using planar porphyrin structural units or other conductive structural units within appropriate geometric shapes (i.e, Fullerenes or polycyclic aromatic hydrocarbons (PACs)) have the ability to accommodate electrical charge in its extended pi system and the alignment of the structural units by the reticular assembly provides an efficient path for electrons as demonstrated by charge mobility measurements. While some electrode designs require the inclusion of conductive carbon in the composite, the electrode with conductive frameworks may or may not. For example, the functional cells may use no added conductive carbon-based Fullerenes or PAHs other than by passivating monolayer bonded to and modifying the crystalline particle surface.

While many conductive frameworks could be constructed, examples of organic boronic ester frameworks are of particular interest because their syntheses can be accomplished using mild non-toxic reagents and conditions and because they have interesting fire-retardant properties. Covalent Organic Frameworks (COFs) that incorporate either trisboronic- or tetraboronicester vertices bound by aromatic struts builds layered two-dimensional or three-dimensional frameworks, respectively. Two aromatic precursors, 1,2,4,5-tetrahydroxybenzene and 2,3,6,7-tetrahydroxyanthracene have been described and have been combined with boronic acids, building COFs that have very high electron mobility and remarkably good fire suppression properties. Incorporating Group IVA particles functionalized with these symmetric tetraols provides a means of covalently bonding the Group IVA particles to the COF matrix. Functionalization of benzene passivated Group IVA particles with either of these symmetric tetraols can be accomplished by refluxing the benzene functionalized Group IVA particles suspended with the tetraol in benzene or in a non-competing solvent such as tryglyme. While benzene can leave the particle surface without decomposition, the tetraol forms a chelate and once bonded to the particle surface will not leave.

While Group IVA particles covalently bonded to a conductive organic framework could make a novel composite for lithium battery anodes, a functionalized Group IVA particle incorporated in layered graphite, stacked carbon nanotubes, Fullerenes, activated carbon or other less structured porous carbon or polymer composites could also significantly enhance the properties of those materials toward lithium storage or other properties outlined above. In other words, the incorporation of functionalized Group IVA particles does not necessarily have to be formally bonded into a coherent framework to realize benefits in the composites. In these applications, the choice of dopants that render "n-type" (nitrogen, phosphorous, antimony) and "p-type" (boron) would be chosen to populate the conduction band or depopulate the valence band respectively of these Group IVA semiconductors with electrons. While the n-type configuration would behave more like a conductor, the p-type configuration would be prone to capturing photon energy and converting it to charged particles. Furthermore, incorporation of photo-active semiconductors capable of capturing and transferring photon energy to electrical charge could be useful when combined with porous electrically active materials that bear functional groups capable of producing unstable radicals. These radicals are known to catalyze chemical transformations, particularly the oxidation of stable hydrocarbons and the oxidation of stable metals in low valence states to higher valence states. Such activity could be useful for treatment of chemical waste, water and air purification and the capture of toxic metals such as arsenic, selenium, lead and mercury.

Figure 12:
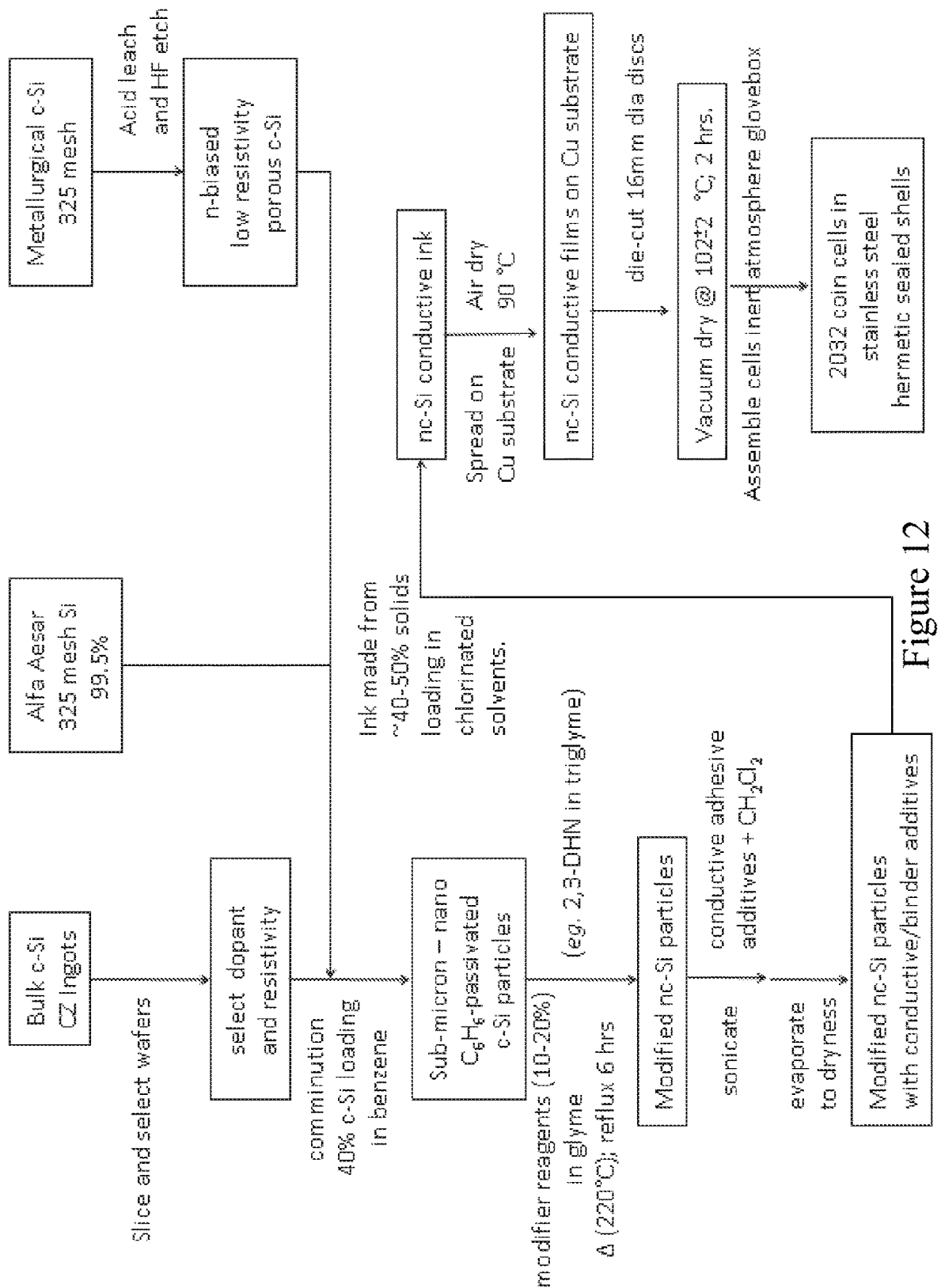
FIG. 12 depicts one exemplary process for preparing a battery including functionalized Group IVA particles.

FIG. 12 depicts one exemplary process for preparing a battery comprising the functionalized Group IVA particles. The Group IVA particles may be derived from bulk crystalline silicon (c-Si) ingots (e.g., P-doped (n-type) silicon having a resistivity of 0.4-0.6 $\Omega cm^{-1}$), and/or silicon powder such as 325 mesh silicon powder (e.g., 325 mesh Si, 99.5% available from Alfa Aesar, 26 Parkridge Rd Ward Hill, MA 01835 USA; or metallurgical grade c-Si 325 mesh). The bulk c-Si ingots can be sliced into wafers and surface orientation can be selected and the precise resistivity of individual wafers can be measured and selected prior to comminution. Where metallurgical c-Si 325 mesh is used, the material may be subjected to acid leaching and hydrofluoric (HF) acid etching to provide n-biased low resistivity porous c-Si. The sliced wafers and/or the silicon powder may be subjected to comminution in benzene to provide sub-micron to nano-sized benzene-passivated c-Si particles (e.g., 200-300 nm particles). The benzene solvent may be removed via vacuum distillation followed by vacuum drying (e.g., 6 hours at 23° C.) to provide the benzene-passivated c-Si particles. A selected amount (e.g., 1 gram) of the benzene-passivated c-Si particles may be treated with a modifier reagent (e.g., 2,3-dihydroxynaphthalene) in a non-functional solvent (e.g., triglyme) and refluxed for a selected time (e.g., 6 hours) and temperature (e.g., 220° C.). After refluxing, the modified nc-Si particles may be allowed to settle and the non-functional solvent removed (e.g., by decanting, or filtering). The modified nc-Si particles may be washed with an ether solvent and then dried. The modified nc-Si particles (e.g., in a dried and powdered form) may be combined with one or more conductive adhesion additives (e.g., $C_{60}$, $C_{70}$, Fullerene derivatives) in a selected solvent (e.g., dichloromethane) to provide a slurry. Optionally, a dopant additive (e.g., $C_{60}F_{48}$) may also be added to the slurry. The slurry may be sonicated for a selected time period (e.g., 10 minutes) and then dried (e.g., air dried or vacuum) to provide the modified nc-Si particles with conductive/binder additives.

Figure 13:
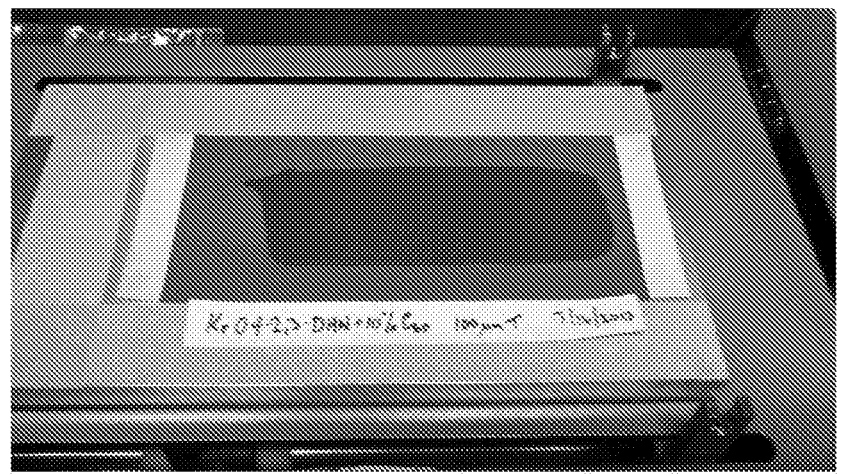
FIG. 13 depicts an exemplary copper substrate to which a conductive ink was applied.
Figure 14:
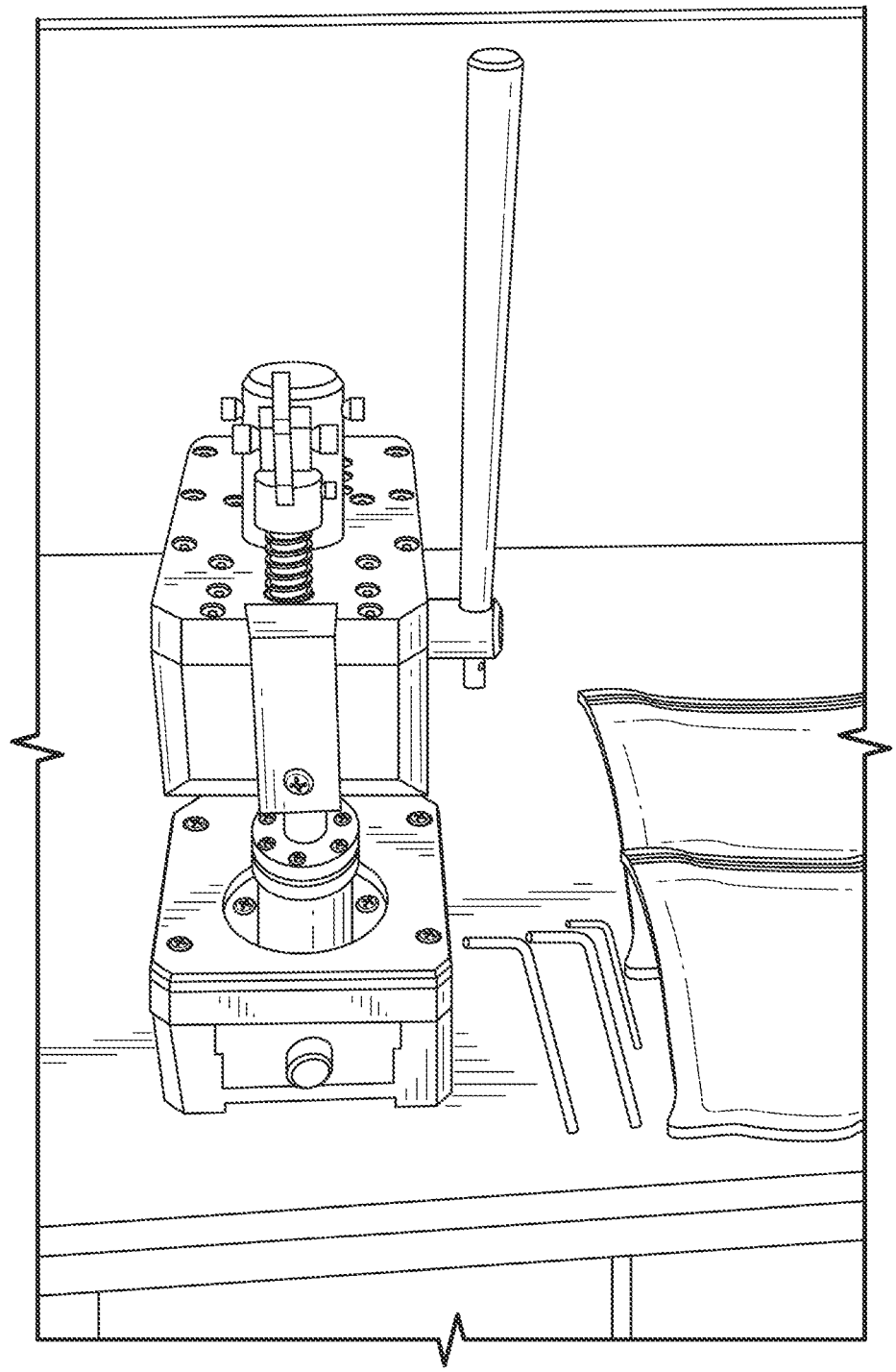
FIG. 14 depicts a die cutter useful for preparing disc anodes from a substrate.

The modified nc-Si particles with the conductive/binder additives may be combined with a selected solvent (e.g., a chlorinated solvent such as trichloropropane) to provide a conductive ink (e.g., 40-50 wt % solids loading). The conductive ink may be applied (e.g., paintbrush application, film spreader) to a selected substrate (e.g., a copper substrate, with or without a carbon coating) and thereafter dried under a selected atmosphere (e.g., air) and temperature (e.g., 90° C.). FIG. 13 depicts an exemplary copper substrate to which the conductive ink was applied. The ink-coated substrate may then be die-cut to discs (e.g., 16 millimeter discs) using a die cutter such as that depicted in FIG. 14. The discs may then be dried under a vacuum for a selected time period (e.g. 2 hours) at a selected temperature (e.g., 100° C.).

Figure 15A:
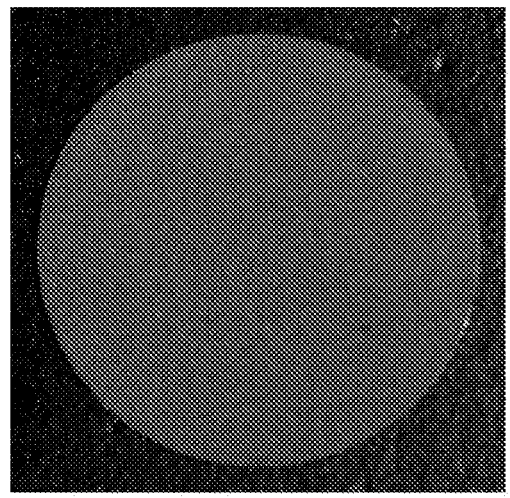
FIG. 15a depicts a photograph of a disc anode prepared with functionalized Group IVA particles.
Figure 15B:
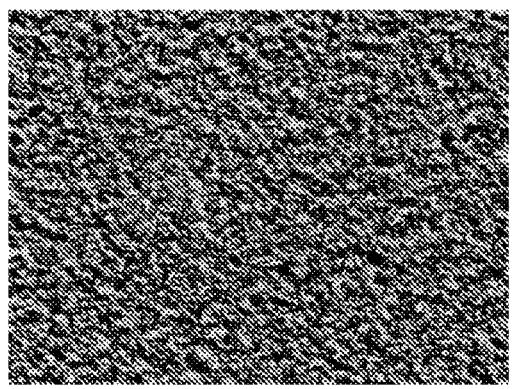
FIG. 15b depicts a photograph at 40× magnification of a disc anode prepared with functionalized Group IVA particles.
Figure 15C:
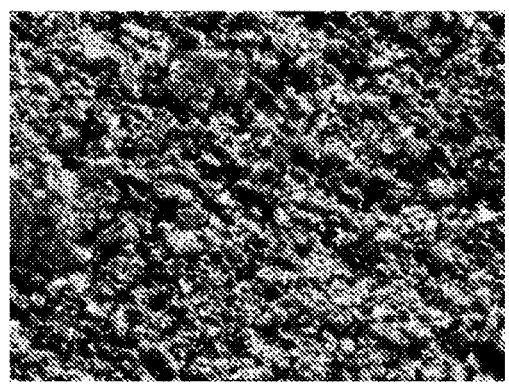
FIG. 15c depicts a photograph at 100× magnification of a disc anode prepared with functionalized Group IVA particles.

A disc anode comprising functionalized Group IVA particles was prepared photographed on a black metallic background with a Nikon digital camera and at 40× and 100× power with a AmScope 40×-2000× trinocular compound microscope equipped with a AmScope MA-1000 digital camera. The anode was prepared using 99.5% pure intrinsic silicon surface modified with 2,3-dihydroxynaphthalene with 10% $C_{60}$ conductive adhesion additive mixed in by slurrying with sonication in dichloromethane. The photographs are shown below in FIGS. 15a-15c.

Figure 16:
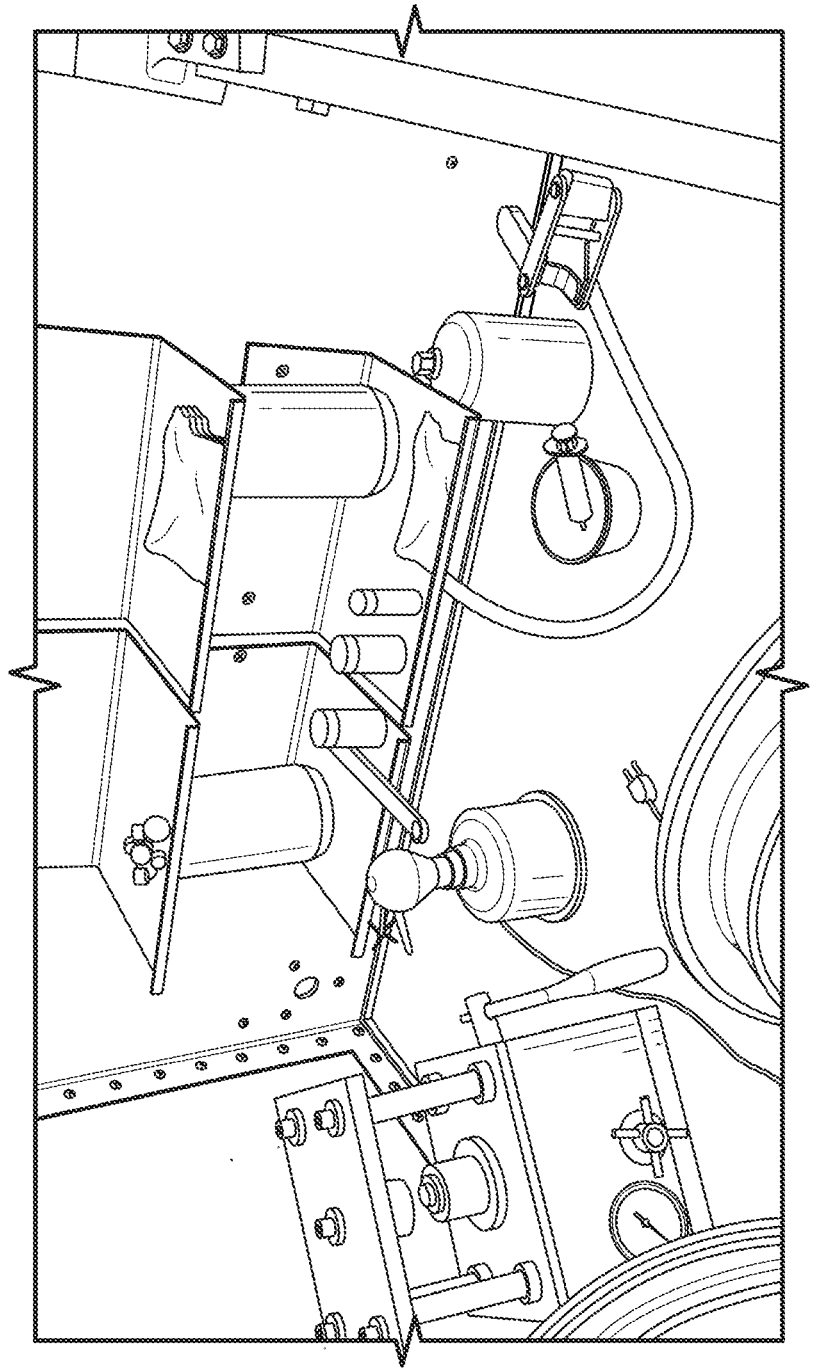
FIG. 16 depicts a controlled atmosphere glovebox with coin cell assembling equipment.

The discs, along with other components for preparing a coin cell battery (e.g., cathode, separator, electrolyte), may be assembled into a coin cell under an inert atmosphere (e.g., in a glove box). FIG. 16 depicts a controlled atmosphere glovebox with coin cell assembling equipment, including a hydraulic crimper for crimping 2032 coin cells. The coin cells may include a stainless steel container that includes a polymer to seal the top and bottom and sides of the cell from each other.

b. Photovoltaic Applications

The functionalized Group IVA particles may be useful in photovoltaic applications. The Group IVA particles may be used to provide a semiconductor film comprised of submicron Group IVA particles dispersed and in communication with an electrically-conductive fluid matrix or liquid crystal. The film may be prepared by making a semiconductor particle suspension, depositing the semiconductor particle suspension on a substrate, and curing the semiconductor particle suspension at a temperature of 200° C. or less to form the semiconductor film. The semiconductor particles may be comprised of elements from the group consisting of B, Al, Ga, In, Si, Ge, Sn, N, P, As, Sb, O, S, Te, Se, F, Cl, Br, I, Ti, Zr, Hf, V, Nb, Ta, Cr, Mo, W, Mn, Re, Fe, Ru, Os, Co, Rh, Ir, Ni, Pd, Pt, Ag, Cu, Au, Zn, Cd, lanthanides, and actinides. The semiconductor particles may be p-type or n-type. The method may be performed completely at room temperature.

The semiconductor films that may be applied in sequence on a substrate, rigid or flexible, may be integral parts of a functioning semiconductor device having been assembled monolithically with no annealing during any part of the manufacturing process. The semiconductor films may be applied as inks printed on the substrate by ink-jet or any known printing process capable of creating uniform films on a substrate surface. Conductive circuitry may also be printed in the same manner as the semiconductor films, all becoming integral parts of the complete electronic device.

Figure 17:
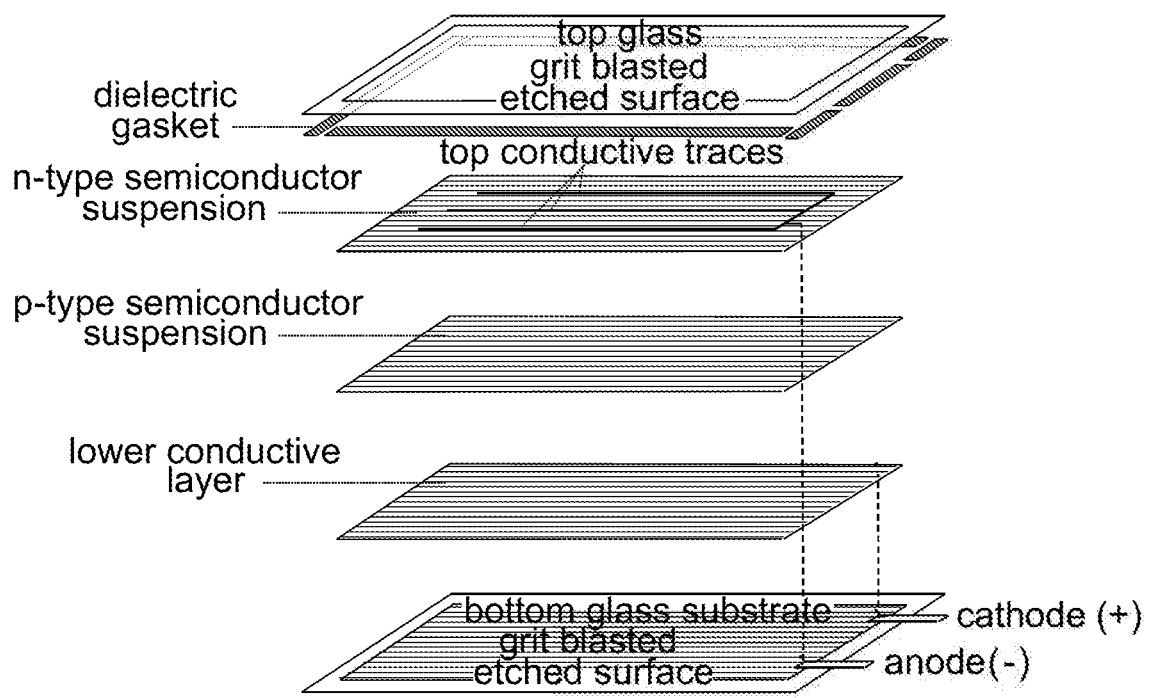
FIG. 17 depicts a schematic diagram of a photovoltaic cell including a semiconductor film incorporating functionalized Group IVA particles.

For example, in the case where the semiconductor device is a photovoltaic cell, a p-type semiconductor film (abbreviated as "p-film") may be applied by ink-jet to the substrate with a conductive surface. Upon sufficient curing of the p-film, an n-type semiconductor film (n-film) may be applied directly on the partially cured p-film. After the first two films are sufficiently cured, conductive circuitry may be applied on top of the n-film. The conductive circuitry can be printed through a mask or by such print jet capable of making narrow, wire-like conduction pathways. The conductive circuitry on top may minimize the area that shades incident light on the surface of the semiconductor films. The conductive circuitry on top of the n-film may be connected to the negative terminal (anode), while the conductive surface under the p-film and on the substrate may be connected to the positive terminal (cathode). The cell may then be hermetically sealed with a sunlight-transparent covering, gaskets and cement. A schematic diagram of such a cell is depicted in FIG. 17.

Also disclosed herein is a method of making a photovoltaic cell at room temperature from semiconductor films composed of Group IVA submicron particles. In certain embodiments, photovoltaic activity may be observed in cells made by the methods in this invention using crystalline silicon films having a mean particle size distribution above 1 micron. Yet in other embodiments, higher photovoltaic efficiency may be achieved from films made with nanoparticle size distributions such that quantum confinement becomes an important factor in the absorption of photons and photon-electron transitions. Distinct advantages are gained with the use of nanoparticle films in solar PV collectors, one being the efficiency and breadth of the solar radiation spectrum that can be absorbed and converted to electrical energy using crystalline silicon. For example, solar cells made from bulk silicon wafers are typically 30 thousandths (~0.7 mm) thick, while some silicon nanoparticle thin films that have equivalent photon absorption capacity need only be less than 100 nm.

Bulk crystalline silicon is inherently an indirect band gap semiconductor, which explains why photon absorption efficiency is low even though the natural band gap for silicon is nearly perfectly centered in the solar spectrum. For absorption and conversion of a photon to an electron hole pair to occur in indirect band gap semiconductors (p-type), the conversion must be accompanied with the production of a phonon (a smaller packet of thermal energy). Not only is some energy lost in each conversion of photon to electron, but these conversions do not readily occur because it is a forbidden transition. Still, forbidden transitions can and do occur, but they happen much less frequently than in direct band-gap semiconductors. Similarly, florescence (resulting in the annihilation of an electron or electron hole pair with the emission of a photon) also is forbidden in indirect band-gap semiconductors and allowed in direct band-gap semiconductors. Consequently, silicon is a poor luminescence semiconductor, but it is capable of preserving energy in the form of an electron hole pair for long enough to allow the charge to migrate to the p-n junction where it meets an electron from the conduction band of the n-semiconductor layer.

Under ideal conditions the maximum theoretical photovoltaic efficiency of bulk crystalline silicon is just over 30%, while in practice the best photovoltaic efficiency in crystalline silicon wafer solar cells is 22-24%. Still, crystalline silicon wafer technology is most commonly used in commercial solar PV panels because their efficiency is far better than amorphous silicon films and the PV efficiency fade over time is very low compared to other solar PV technologies. PV efficiency for silicon nanoparticle films has been measured in the laboratory as high as 40-50% with some expectations that even higher efficiencies are attainable. However, these devices have not yet been commercialized presumably because the cost of commercialization is too high to compete with existing technologies.

While others have used expensive heat processing methods to fuse various elements of the semiconductor materials to form functioning semiconductor devices, disclosed herein is a method of making these devices function through the formation of formal covalent bonds and pi overlapping interactions in liquid crystal and covalent framework structures through low temperature reactions. The overlying benefit from this approach is to lower the cost of manufacturing superior performing devices. This is especially important for solar PV manufacturing where the Levelized Cost of Energy (LCOE) must decline for solar power to approach parity with other sources of electrical energy.

Also disclosed herein is a method of applying passivated Group IVA semiconductor particles suspended with an electrically conductive fluid. The semiconductor particles and the constituents of the liquid crystal or electrically conducting fluid or framework may be suspended in a high-K dielectric solvent to form a liquid ink with the appropriate viscosity suitable for the method of application. For jet printing, viscosities in the range of 10 centipoise (cp) to 30 cp may be suitable, while for gravure printing may require viscosities over 100 cp. High K solvents are used to promote the dispersion of nanoparticles and prevent particle agglomeration. Films may require a period of curing to allow the alignment and or self assembly of the fluid matrix or structural units of the framework and to establish electrical communication with the semiconductor particles. The curing process may involve complete or partial evaporation of one or more components of solvent used in making the inks.

Solvents used in making submicron semiconductor inks may include, but are not limited to, N-methyl pyrrolidinone (NMP), dimethylsulfoxide (DMSO), tetrahydrofuran (THF), nitromethane, hexamethylphosphoramide (HMPA), dimethylforamide (DMF), and sulfalone. Many organic-based compounds are available that form columnar discotic liquid crystals. Examples of these include a class of compounds derived from triphenylene-base compounds that align with each other in stacked columns by hydrogen bonding. Similarly, other symmetric and asymmetric polyaromatic hydrocarbons with planar pi systems and ring substituents that participate in their alignment into stack columns may be used for a discotic liquid crystal matrix. Porphyrin based compounds may be used to form stacked arrays that can be classified with liquid crystals, or with appropriate functional groups may form covalent organic frameworks that allow high charge mobility in their frameworks. Some combination of one or more of the above solvents and organic-based liquid crystal or conductive framework structural units may be used for the semiconductor film matrixes.

c. Pollutant Capture

The functionalized Group IVA particles, as well as functionalized and non-functionalized transition metals (e.g., copper), may be useful in the capture of pollutants, and in particular, pollutants from combustion processes. Emission of mercury, for example, from combustion gas sources such as coal-fired and oil-fired boilers has become a major environmental concern. Mercury (Hg) is a potent neurotoxin that can affect human health at very low concentrations. The largest source of mercury emission in the United States is coal-fired electric power plants. Coal-fired power plants account for between one-third and one-half of total mercury emissions in the United States. Mercury is found predominantly in the vapor-phase in coal-fired boiler flue gas. Mercury can also be bound to fly ash in the flue gas.

Mercury and other pollutants can be captured and removed from a flue gas stream by injection of a sorbent into the exhaust stream with subsequent collection in a particulate matter control device such as an electrostatic precipitator or a fabric filter. Adsorptive capture of Hg from flue gas is a complex process that involves many variables. These variables include the temperature and composition of the flue gas, the concentration and speciation of Hg in the exhaust stream, residence time, and the physical and chemical characteristics of the sorbent.

Currently, the most commonly used method for mercury emission reduction is the injection of powdered activated carbon (PAC) into the flue stream of coal-fired and oil-fired plants. However, despite available technologies, there is an ongoing need to provide improved pollution control sorbents and methods for their manufacture.

Aspects of the invention include compositions, methods of manufacture, and systems and methods for removal of heavy metals and other pollutants from gas streams. In particular, the compositions and systems are useful for, but not limited to, the removal of mercury from flue gas streams generated by the combustion of coal. One aspect of the present invention relates to a sorbent comprising a Group IVA functionalized particle as described herein, and/or a functionalized or non-functionalized transition metal (e.g., copper).

In certain embodiments, a method of removing pollutants (e.g., mercury) from a combustion flue gas stream includes injecting into the flue gas stream a sorbent comprising a functionalized Group IVA particle as described herein, and/or a functionalized or non-functionalized transition metal (e.g., copper). The sorbent can be used and maintain functionality under a variety of conditions, including conditions typical of flue gas streams found in combustion processes. In certain embodiments, the sorbent can be provided into a flue gas or process having a temperature of 200° F. to 2100° F., or 400° F. to 1100° F. In certain embodiments, the sorbent can be provided into a flue gas or process having a temperature of 50° F. or greater, 100° F. or greater, 200° F. or greater, 300° F. or greater, 400° F. or greater, 500° F. or greater, 600° F. or greater, 700° F. or greater, 800° F. or greater, 900° F. or greater, 1000° F. or greater, 1100° F. or greater, 1200° F. or greater, 1300° F. or greater, 1400° F. or greater, 1500° F. or greater, 1600° F. or greater, 1700° F. or greater, 1800° F. or greater, 1900° F. or greater, 2000° F. or greater, or 2100° F. or greater. Optionally, the injected sorbent may be collected downstream of the injection point in a solids collection device. Optionally, the injected sorbent can be recycled for repeat use.

In certain embodiments, the Group IVA particles described herein, and/or functionalized or non-functionalized transition metals (e.g., copper), can be used to provide improved capture of mercury at electrostatic precipitators (ESPs). The majority of coal plants now have electrostatic precipitators. The Group IVA particles described herein, and/or functionalized or non-functionalized transition metals (e.g., copper), may be introduced into a scrubbing process before, after, or on the ESP highly charged plates. The captured mercury may then stay on the plates or fall into the fly ash as oxidized. Given the transfer of the energy, hydroxyl radicals may be formed and oxidation of the Hg occurs. In particular, the Group IV particles described herein, and/or functionalized or non-functionalized transition metals (e.g., copper), can be used as photo sensitizers for mercury removal. The photo sensitizers can be combined with activated carbon to remove Hg.

d. Other Applications

Other applications for functionalized Group IVA particles include biosensors, thermoelectric films, and other semiconductor devices.

6. EXAMPLES

The foregoing may be better understood by reference to the following examples, which are presented for purposes of illustration and are not intended to limit the scope of the invention.

Example 1

Toluene Passivated Silicon Particles

In one example, p-type silicon wafers with measured resistivity of 2-4 ohm/cm$^2$ were crushed, then ground with mortar and pestle, then passed through a #60 mesh sieve. The powder was further reduced to submicron particles with a ball mill. In 40 gram batches, the submicron silicon powder was added to a 250 mL polypropylene container with 100 mL of muriatic acid and 4-8 ceramic balls (12 mm dia.) The screw-top lid was closed and the container was turned on a rolling mill at 60 rpm for two hours. Pressure buildup in the container caused the container to bulge. In some instances where larger quantities or lower grades of silicon were treated, the container was subject to bursting due to the buildup of H$_2$ gas. After two hours of agitation on the roller mill, the bottle was allowed to stand for another two hours motionless. The bottle was carefully opened with the release of pressure and the liquid was drawn from the container above the solid in the bottle via syringe. Another 100 mL of fresh muriatic acid was added and the bottle closed and rolled for another 2-hour period followed by a 2-4 hour period of standing in an upright position. The bottle was opened again with release of much less pressure than after the initial acid treatment. The aqueous liquid portion was carefully drawn from the solid as before. The decanted liquid was noticeably clearer than the liquid drawn from the first acid treatment. After thoroughly decanting the aqueous liquid, 100 mL of toluene was added to the solid, the screw-top lid was replaced and the bottle was rolled again for 4-6 hours with the ceramic balls remaining in the container for agitation. After allowing at least 1 hour for settling, the lid was opened with little to no pressure released from the vessel and liquid was drawn away followed by another 100 mL portion of toluene added to the vessel. The vessel was again rolled to agitate the silicon powder in toluene for another 4-6 hours before allowing the mixture to settle and opening the vessel to remove the liquid toluene via syringe. The remaining toluene was removed by evaporation assisted by reduced pressure at room temperature.

Following a similar procedure, other hydrocarbon passivated micron- to nanosized particles can be created using n-type Group IVA wafers, or wafers with higher or lower resistivity or bulk MG Group IVA ingot material. The amounts of material treated can vary depending on the grade of the bulk material and size and burst strength of polypropylene or polyethylene container used.

Example 2

Benzene Passivated Silicon Particles (i) In another example, following the identical milling procedure describe of Example 1, benzene (C$_6$H$_6$) was instead used as the passivating hydrocarbon in place of toluene. Applied similarly, benzene may be replaced in subsequent reactions by other hydrocarbons with more strongly bonding functional groups. Benzene is one of few organic hydrocarbons that will bond reversibly to silicon surfaces. Thus, benzene passivated Group IVA material is a convenient stable intermediate to use for introducing other functional hydrocarbons on to the particle surface. This is one of few forms of Group IVA material in which thermodynamics plays an important role in the surface chemistry as opposed to be being dominated by kinetics.

(ii) In another example, wafers of three different types of silicon were ground to specification. Benzene was the solvent used during the grinding process, but oxygen and trace amounts of water were not excluded. The three types of silicon were (i) phosphorus-doped silicon (i.e., n-type silicon) with a manufacturer-specified resistivity of 0.4-0.6 $\Omega$cm$^{-2}$, (ii) boron-doped silicon (i.e., p-type silicon) with a manufacturer-specified resistivity of 0.014-0.017 $\Omega$cm$^{-2}$, and (iii) 99.5% pure intrinsic silicon. The average particle size (APS) of the ground, benzene-coated n-type silicon particles, measured by electron microscopy, was found to be less than 400 nm (<400 nm).

Example 3

Passivated Silicon Particles

In another example, 325 mesh Si powder was processed by a Netzsch Dynostar mill using 0.4-0.6 mm yttrium-stabilized zirconia beads in benzene. The solids loading of the Si-benzene slurry was 30-40 percent. Particle size distribution (PSD) analysis indicated that the average particle size (APS) was reduced to about 200 nm. Further processing to smaller APS required a change in grinding media to smaller bead size. Changing to 0.1 mm diameter beads or smaller will allow APS reduction to less than 100 nm. Below 100 nm, further APS reduction in benzene becomes difficult due to rapidly increasing viscosity of the slurry. Furthermore, following the APS reduction progress by light-scattering PSDA methods becomes difficult due to particle agglomeration.

Removal of benzene from submicron particles was accomplished by evaporation of benzene under reduced pressure. Care must be taken to provide heat to the vessel with the slurry to avoid freezing of the benzene. A 20 mm glass tube mated between the flask containing the Si/benzene slurry and a receiving flask for the solvent condensate by 24/40 ground glass joints allowed the solvent to be removed from the nano-silicon/benzene slurry. While pressure in the joined flasks was briefly, but repeatedly reduced via vacuum, care was taken not to apply too much dynamic vacuum as solvent vapors easily sweep nano particles into the receiving flask when the velocity of those vapors is high.

On a small laboratory scale, this method is adequate for isolation of the Group IVA particles from solvent slurries. In an industrial process, it may be more efficient to remove solvents by circulating dry nitrogen gas across heated evaporations plates covered with the slurry at near atmospheric pressure. The solvent saturated gas may be passed through a condenser to recover the solvents and restore the unsaturated gas for further recirculation. This process may minimize carryover of nanoparticles into the solvent condenser.

Figure 18:
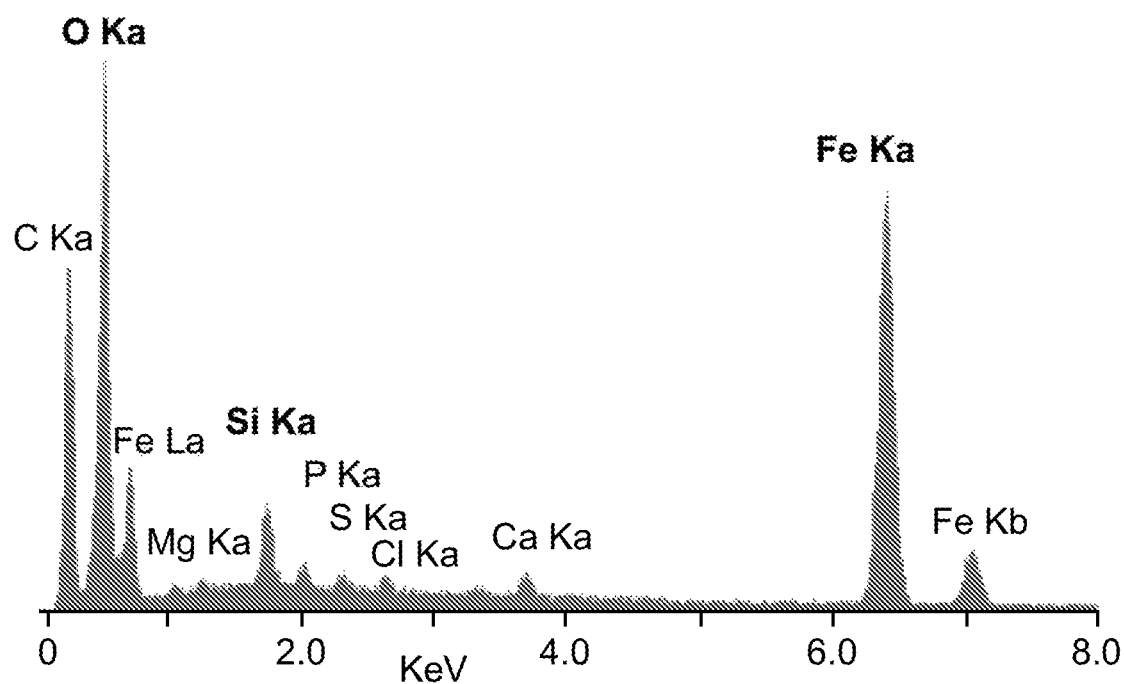
FIG. 18 depicts an Energy Dispersive X-ray Spectrum showing resolved K-alpha signals that include Si, O, and C.

Characterization of the benzene passivated Si particles includes SEM, TGA-MS, and molecular fluorescence spectroscopy. SEM images were used to measure individual particles and to gain more assurance that particle size measurements truly represent individual particles rather than clusters of crystallites. While SEM instruments also have the capability to perform Energy Dispersive X-ray Spectrometry (EDS), it is also possible with sufficiently small particle sizes that an elemental composition will confirm the presence of carbon and the absence of oxides through observance and absence respectively of their characteristic K-alpha signals. FIG. 18 is an EDS spectrum showing resolved K-alpha signals that include Si, O, and C. Iron and other metal impurities could also be observed and do not interfere with the observance of lighter elements.

Figure 19:
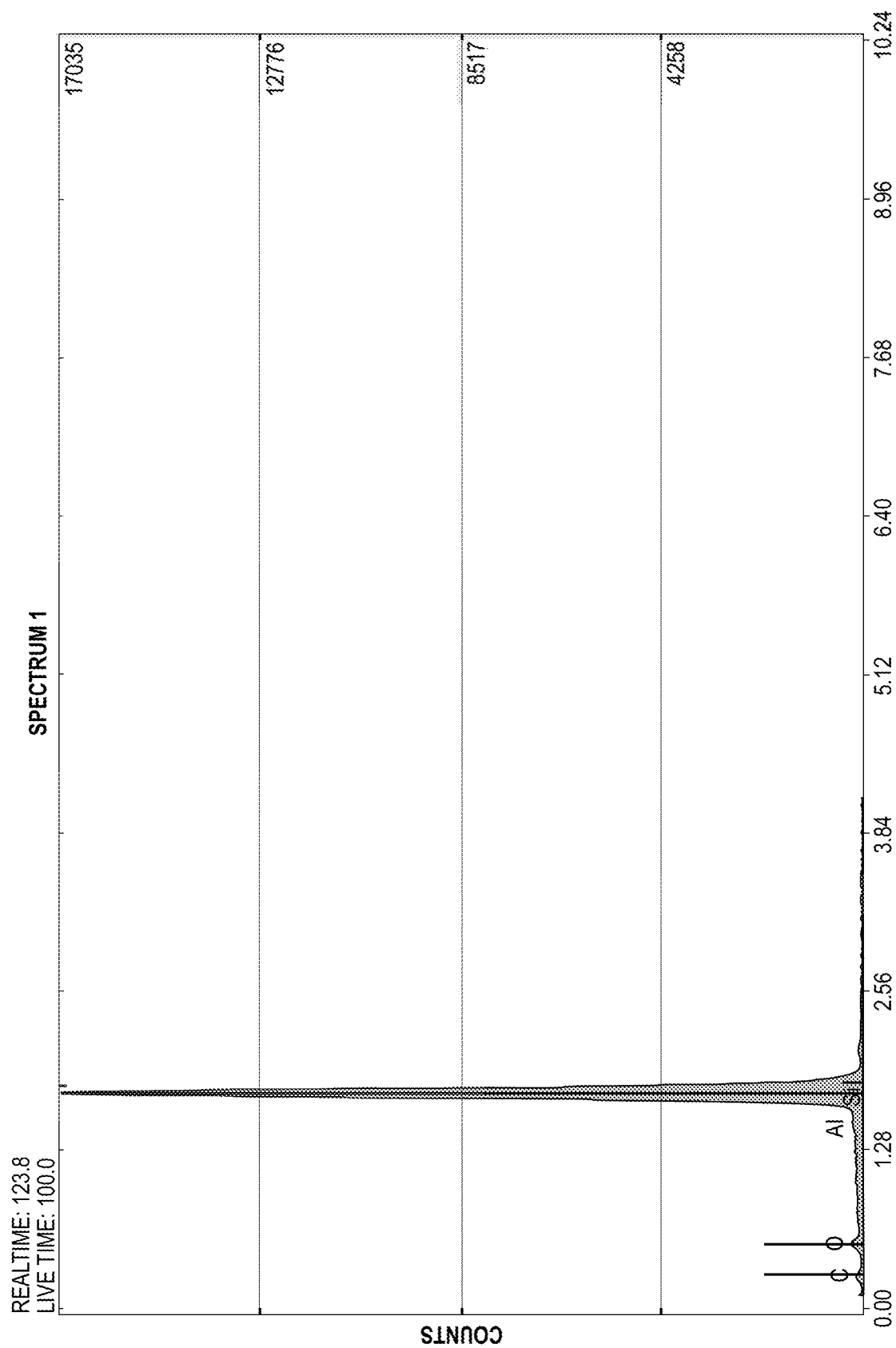
FIG. 19 depicts an Energy Dispersive X-ray Spectrum of benzene functionalized nc-Si (ca. 300 nm) following removal of excess benzene.
Figure 20:
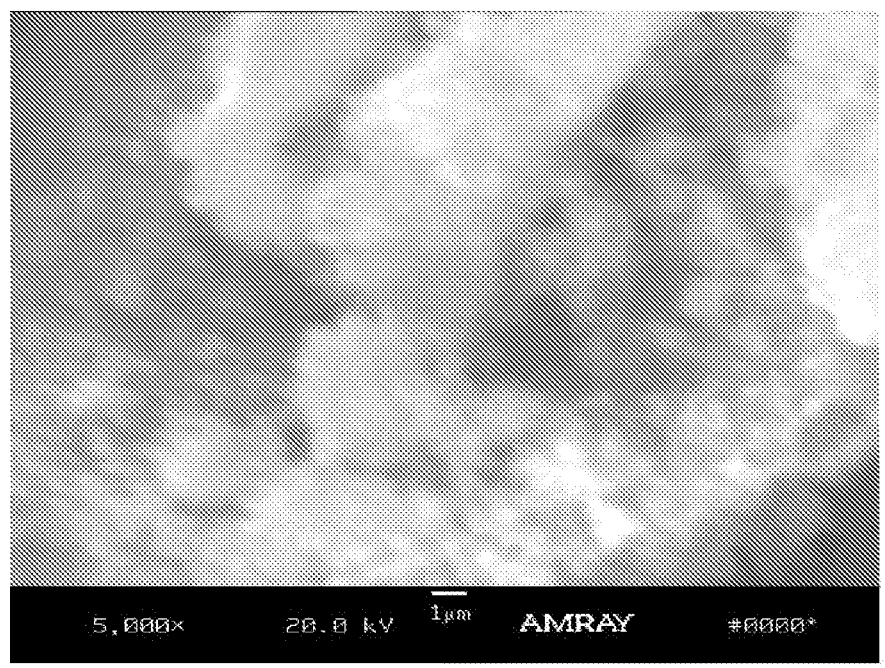
FIG. 20 depicts a SEM image of nc-Si particles functionalized with benzene.

Average Particle Size (APS):

APS as determined by a Microtrac particle size was between 200 and 300 nm. Initial SEM images were recorded in addition to EDXA scans. While the initial SEM images were inadequate to resolve the particle size of the analyzed sample, the EDXA scan revealed good data that confirms the presence of hydrocarbon and minor oxidation (See FIGS. 20 and 19 respectively). The sample was mounted on an aluminum stub, so the signal in the position of Al K-alpha seen in the EDXA scan is most likely a contribution of the Al mounting stub. The image in FIG. 20 indicates that the APS is well below submicron range.

Figure 21:
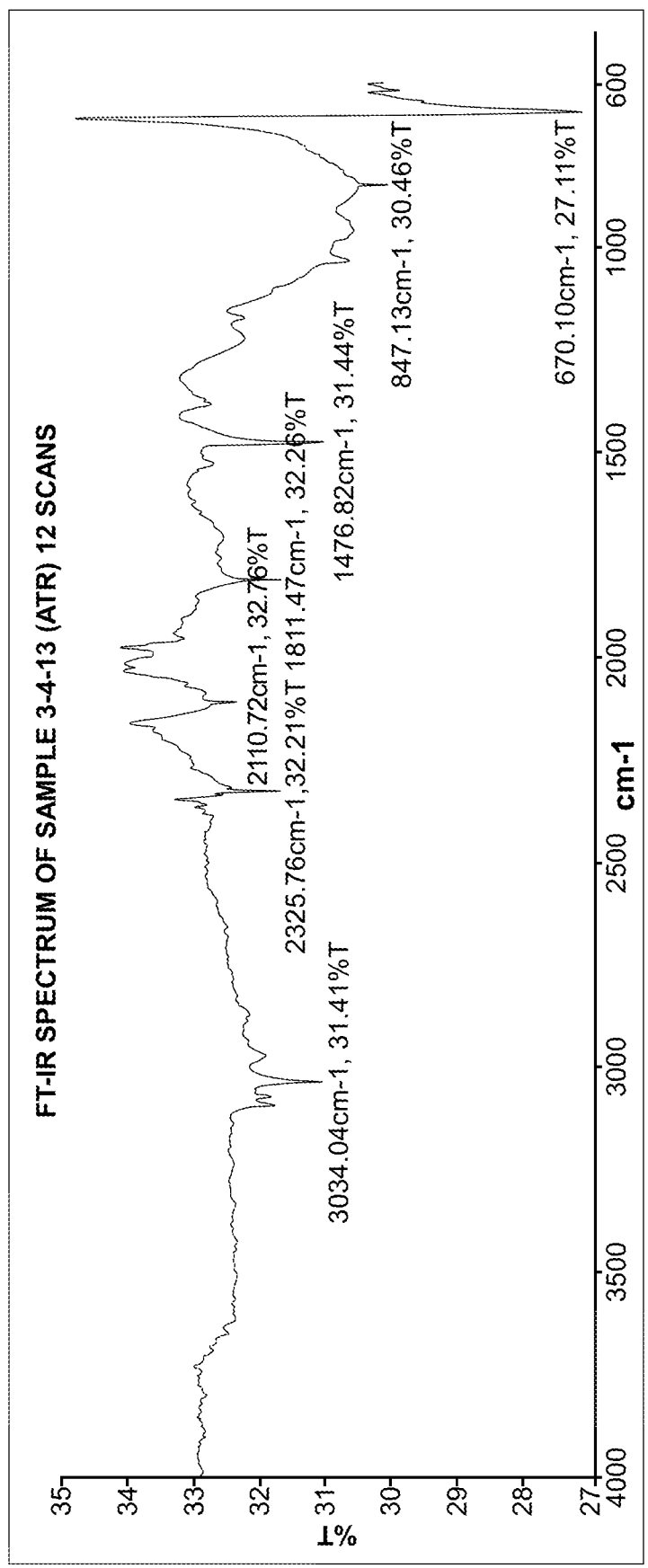
FIG. 21 depicts a FTIR spectrum of nc-Si particles functionalized with benzene.

Identification of Surface Organics:

One qualitative test for surface organics is the measurement of a Fourier Transform InfraRed (FTIR) spectrum. FTIR measures modes of molecular vibrations due to stretching and bending frequencies of molecular bonds. While it is possible in FIG. 21 to see evidence of the FTIR fingerprint left behind by benzene, there are no significant shifts in the C—H stretching frequencies due to perturbations from their bonding interactions to the Si surfaces. C—C bending patterns will have to be examined in more detail. This is where perturbations (wave number shifts) will be most prominent if those interactions are indeed strong enough to shift bands beyond spectral resolution limits (±4 cm$^{-1}$).

Figure 22A:
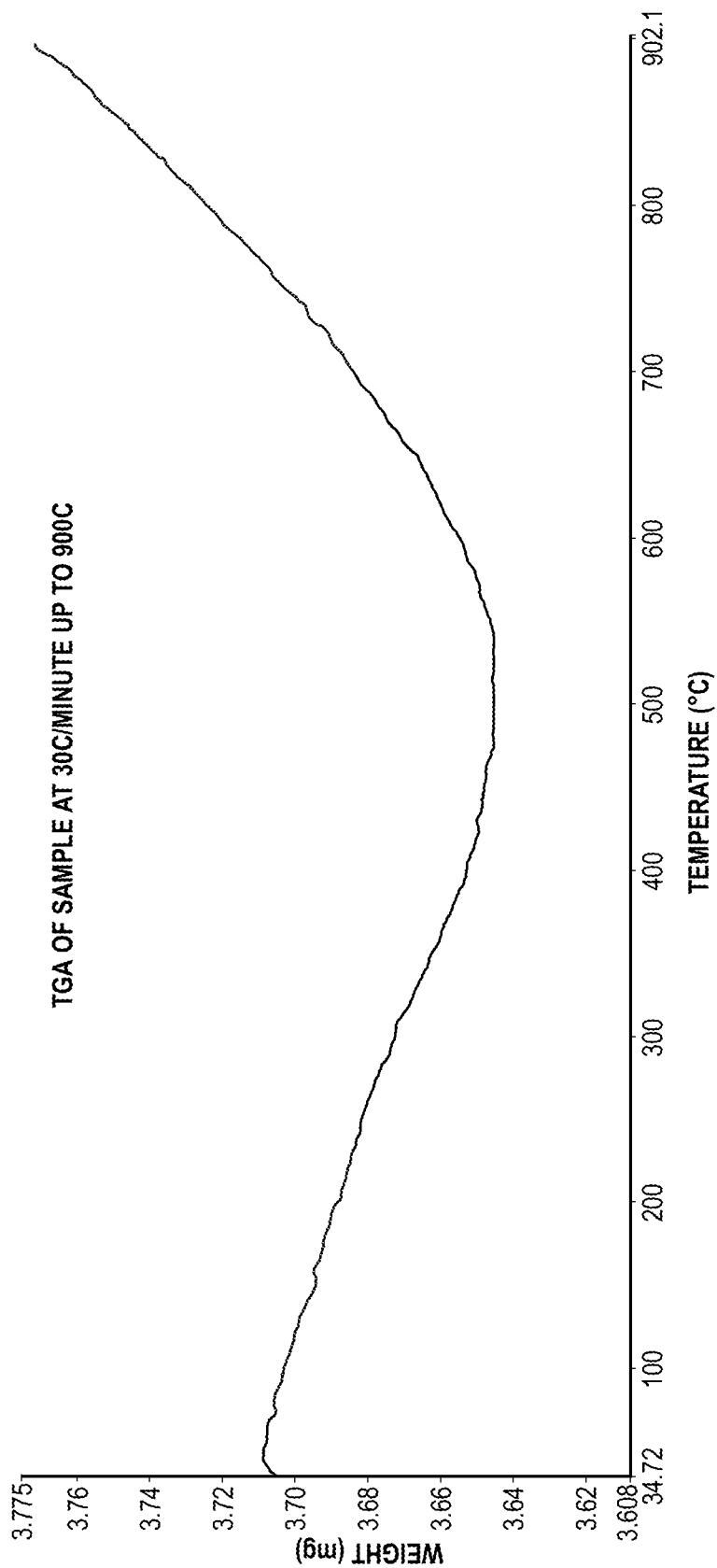
FIG. 22a depicts a TGA scan of benzene passivated nc-Si (estimated APS ~300 nm or less) at 30° C./min.
Figure 22B:
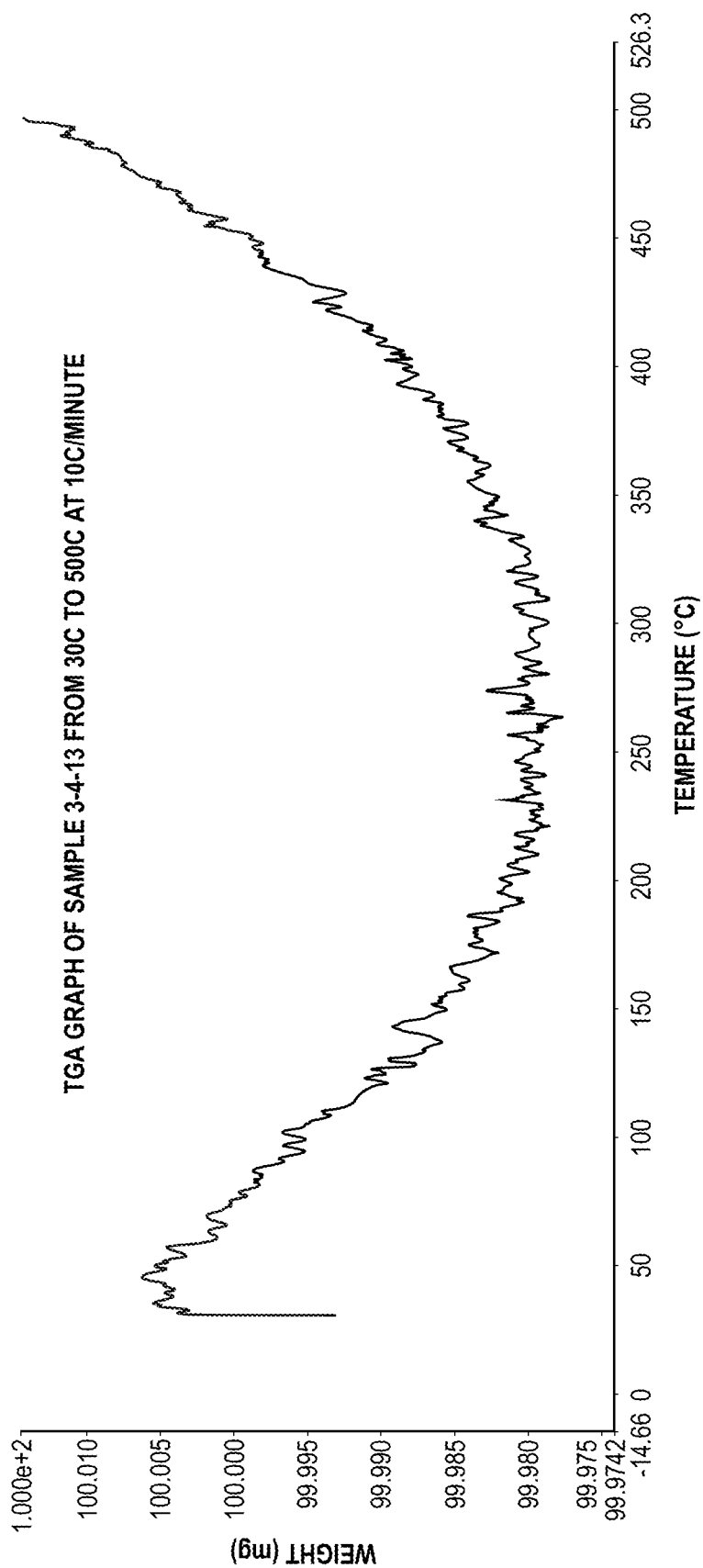
FIG. 22b depicts a TGA scan of benzene passivated nc-Si (estimated APS ~300 nm or less) at 10° C./min.

Further evidence that benzene is bound to the particle surfaces with bonding interactions that appear stronger than hydrogen bonding, but not as well defined as would be expected from a discrete monolayer, is shown in TGA scans. FIGS. 22a and 22b are TGA scans run at heating rates of 30 degrees C./s and 10 degrees C./s respectively. The initial scan at 30 degrees C./s was done to quickly observe the thermal profile up to 500° C. (932° F.). In this scenario, the compound is stable to oxidation up to 500° C. (932° F.) and also notable is the fact that it appears to lose mass gradually. The solvent hangs on well past its boiling point. The slower scan rate in FIG. 22b demonstrates that while benzene is continuously evolved from the sample, throughout the temperature range, the material will survive up to 250° C. for several minutes before beginning to oxidize at this slower scan rate. For this reason, using this material in a fixed (packed) bed reactor held at a sustained temperature may not survive beyond 250° C. (482° F.). However, the dynamic desorption of surface bound benzene does not occur instantly and could protect the Si surface from oxidation briefly at higher temperatures. The mass loss accounts for only 0.02% of the total mass before oxidation begins to occur.

Example 4

Toluene Passivated Silicon Particles

Si particles processed in benzene solvent by milling 325 mesh intrinsic Si (99.99%, Alpha Aesar) with 0.4-0.6 mm yttrium-stabilized beads until reaching about 300 nm apparent APS were passivated by stirring in toluene and heating to reflux under inert atmospheres. To 20 g of the dried particles in a 200 mL round bottom flask was added 50 mL of toluene freshly distilled from sodium. The same procedure was followed with particles made from the previous stock, but further milled with 0.1 mm beads to an apparent APS less than 200 nm. The true APS estimated from SEM images was less than 100 nm. In both cases, the particles were refluxed for 1-2 hours in toluene blanketed under 1 atmosphere of purified nitrogen.

With toluene passivated nc-Si, a sharper decline of the mass loss is expected in the TGA with greater sustained stability at higher temperatures. This would be expected for a passivating layer characterized by stronger, more defined bonding interactions to localized sites. Due to toluene's asymmetry, stronger Si—C bonding interactions will be formed to the ring carbon bound to methyl compared with other C—H ring carbon—silicon interactions. Greater evidence of C—C bond vibrations will also be manifest in the IR spectrum band shifts.

Example 5

Lithium-Ion Coin Cells

Surfaced-modified Group IVA particles were prepared as described herein and used to fabricate anodes, which were subsequently incorporated into lithium-ion coin cells. In general, the surface-modified Group IVA particles were prepared, incorporated into an anode paste or ink, and applied to a copper substrate, which was then fashioned into an anode and incorporated into a coin cell. In certain instances, the surface-modified Group IVA particles were combined with one or more additional components in the anode paste or ink (e.g., conductive adhesion additive, a dopant additive) before application to the copper substrate.

Exemplary lithium-ion coin cells fabricated, along with component and fabrication variables are provided in the tables below. Several cells were cycled for sufficient time to provide meaningful performance data regarding charge capacity, discharge capacity, specific charge capacity and capacity fade. Charge/discharge cycles were measured on Li$^+$ coin cells made from the anode films combined with selected commercial cathode films and electrolytes. Cathodes were made from LiCoO$_2$ on an Al substrate, and the electrolyte was LiPF$_6$ in a blend of organocarbonate solvents. A series of anodes were compared with a single selection of cathode and electrolyte formulation.

The "capacities" for the coin cells refer to charge capacities. However, discharge capacity is also an important parameter because it represents the amount of electrical charge that can be delivered by the coin cell when it has been charged according to a given set of parameters. Charge capacity, which is measured for a given coin cell and is given in units of mAh (milliampere hours) is distinct from specific charge capacity, which is determined for a given anode if the anode was weighed and the weight (mass) of the copper substrate was known and can be subtracted, leaving the net weight (mass) of the anode material deposited on that particular anode. The specific charge capacity is then calculated by dividing the coin cell charge capacity by the mass of anode material, and this quantity is therefore given in mAh g$^{-1}$ (milliampere hours per gram of anode material).

The specific charge capacity of the silicon particles, which make up only part of the anodes, is another parameter. Most of the anodes contain, in addition to particles of a particular type of silicon, some combination of (i) an unknown percentage of a covalently-attached surface modifier (such as 2,3-dihydroxy-naphthalene or 9,10-dibromoanthracene), (ii) a certain percentage of a non-covalently attached conductive adhesion additive (typically 9% or 10% of commercially available 99.5% pure $C_{60}$, although this additive was not added to some anodes), and (iii) a certain percentage of a dopant additive (typically 2% or 7% of commercially available $C_{60}F_{48}$, although this additive was not added to many anodes). The mass of the modifier and, if present, the additives, must be subtracted from the mass of the anode, and the resulting mass of the silicon particles alone would be used in the calculation of the specific charge capacity (i.e., coin-cell charge capacity divided by the mass of silicon particles equals the specific charge capacity, in mAh gi, of the silicon particles in that particular anode in that particular coin cell).

Some of the charge/discharge cycles were performed with different current- and voltage-limit set parameters. These can be discerned by inspecting the figures showing both voltage and current vs. time (the voltage curve is shown in red and the current curve is shown in blue in these figures). In most cases, the voltage limits were set at 3.7 V for charging and 2.0 V for discharging. The current limits varied considerably in order to test whether slow charging/discharging (i.e., 0.01 mA), at least initially, resulted in coin cells more resistant to capacity fade than cells that were charged and/or discharged more quickly (i.e., ≥0.02 mA).

Test results indicate that charge capacity, charging rate and capacity fade are all dependent of the type of c-Si and the surface modifiers used. Examples are based on a n-type c-Si series, however p-type c-Si performs well in some respects for both charge mobility and capacity fade. Intrinsic Si (high purity undoped) does not appear to perform as well.

The addition of charge acceptors to functionalized c-Si composites such as $C_{60}$ and possibly $C_{70}$ fullerenes greatly enhance the charge mobility and therefore, the performance of the battery anodes from both charge capacity and capacity fade perspectives. Furthermore, modified fullerene materials ($C_{60}F_{48}$) exhibit significantly enhanced performance, even in low concentrations as dopants. These results indicate that fluorinated fullerenes and their derivatives may provide significant performance and stability when included in battery anode films made from the surface-modified Group IVA particles. Although not wishing to be bound by theory, it is believed these additives are acting as charge mobility improvers, as well as binders for the composite materials. This allows manufacture of small format battery anodes without the need for polymers used universally by others in the industry.

Charge and discharge capacities of anodes prepared from pastes including the surface-modified Group IVA particles exhibit at least comparable performance to commercial carbon anodes. Optimizing particle size, surface modification, and conductive adhesion additives/dopants may allow for improved performance up to two orders of magnitude.

TABLE 1

Lithium-Ion Coin Cell Fabrication Variables
Coin Cell 4210-2 #1

I. Silicon Particles

| | |
|---|---|
| A. Type of silicon wafer used to produce the particles | 0.4-0.6 Ω cm$^{-1}$ P-doped (n-type) silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |

TABLE 1-continued

Lithium-Ion Coin Cell Fabrication Variables
Coin Cell 4210-2 #1

| | |
|---|---|
| F. Aerobic or anaerobic treatment of silicon particles | Aerobic |

II. Surface Modification (covalently attached aromatic hydrocarbon derivatives)

| | |
|---|---|
| A. Modifier | 2,3-dihydroxynaphthalene |
| B. Method of modification | 20 wt %; triglyme reflux (216° C.) for 6 h |
| C. Aerobic or anaerobic treatment | aerobic |

III. Addition of non-covalently-attached conductive adhesion and/or dopant additives

| | |
|---|---|
| A. Conductive adhesion additive | 10 wt % $C_{60}$ conductive adhesion additive |
| B. Dopant additive | 2 wt % $C_{60}F_{48}$ dopant additive (previously referred to as D48 dopant) |
| C. Method of addition | dichloromethane; 23(2)° C.; 10 min with sonication; air dried |
| D. Aerobic or anaerobic treatment | aerobic |

IV. Preparation of anode sheet

| | |
|---|---|
| A. Solvent, ratio of solvent to silicon particles, sonication | 1,2,3-Trichloropropane; 40 wt % solids loading with sonication |
| B. Method of application | paintbrush |
| C. Anode thickness | unknown thickness |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |

V. Coin cell assembly (strictly anaerobic)

| | |
|---|---|
| A. Cathode | 0.1 mm thick × 19 mm diameter $LiCoO_2$ on Al substrate |
| B. Separator film | Celgard 0.025 mm thick × 20 mm diameter |
| C. Electrolyte solution | EC:DMC:DEC (4:3:3) with 1M LiPF6 (+unknown proprietary additives) |

Figure 23:
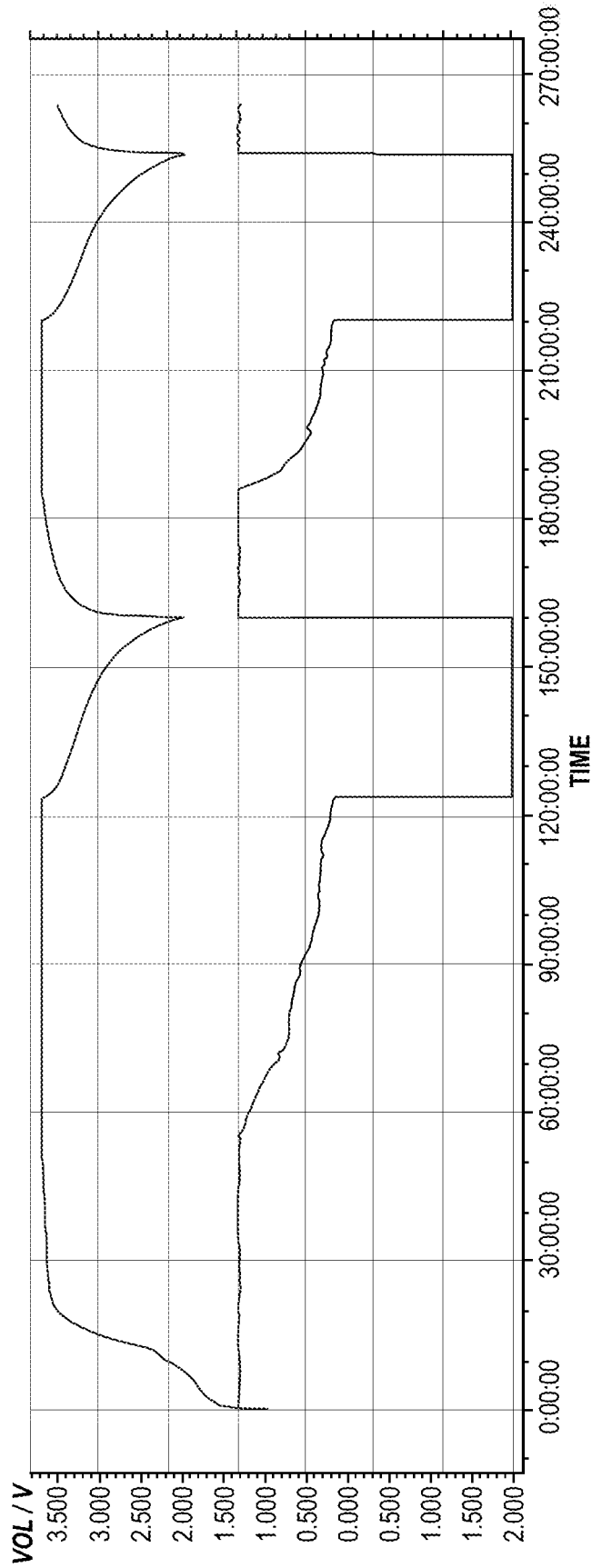
FIG. 23 depicts a charge/discharge plot.

The charge/discharge plot (0.01 mA charge/discharge current throughout) shown in FIG. 23 revealed the following for Coin Cell 4210-2 #1 as described in Table 1. The initial charge capacity was 0.930 mAh. The initial discharge capacity was 0.364 mAh. The initial charging of the cell presumably includes the reduction of trace amounts of impurities as well as the reduction of some electrolyte solvent molecules to form the solid-electrolyte interface (SEI). The second charge capacity was 0.425 mAh, only slightly larger than the first discharge capacity. The second discharge capacity was 0.339 mAh, only slightly smaller than the initial discharge capacity.

TABLE 2

Lithium-Ion Coin Cell Fabrication Variables
Coin Cell 4210-2 #2

I. Silicon Particles

| | |
|---|---|
| A. Type of silicon wafer used to produce the particles | 0.4-0.6 Ω cm$^{-1}$ P-doped (n-type) silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |
| F. Aerobic or anaerobic treatment of silicon particles | Aerobic |

TABLE 2-continued

Lithium-Ion Coin Cell Fabrication Variables
Coin Cell 4210-2 #2

II. Surface Modification (covalently attached aromatic hydrocarbon derivatives)

| | |
|---|---|
| A. Modifier | 2,3-dihydroxynaphthalene |
| B. Method of modification | 20 wt %; triglyme reflux (216° C.) for 6 h |
| C. Aerobic or anaerobic treatment | aerobic |

III. Addition of non-covalently-attached conductive adhesion and/or dopant additives

| | |
|---|---|
| A. Conductive adhesion additive | 10 wt % $C_{60}$ conductive adhesion additive |
| B. Dopant additive | 2 wt % $C_{60}F_{48}$ dopant additive |
| C. Method of addition | dichloromethane; 23(2)° C.; 10 min with sonication; air dried |
| D. Aerobic or anaerobic treatment | aerobic |

IV. Preparation of anode sheet

| | |
|---|---|
| A. Solvent, ratio of solvent to silicon particles, sonication | 1,2,3-Trichloropropane; 40 wt % solids loading with sonication |
| B. Method of application | paintbrush |
| C. Anode thickness | unknown thickness |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |

V. Coin cell assembly (strictly anaerobic)

| | |
|---|---|
| A. Cathode | 0.1 mmthick × 19 mm diameter $LiCoO_2$ on Al substrate |
| B. Separator film | Celgard 0.025 mm thick × 20 mm diameter |
| C. Electrolyte solution | EC:DMC:DEC (4:3:3) with 1M LiPF6 (+unknown proprietary additives) |

Figure 24:
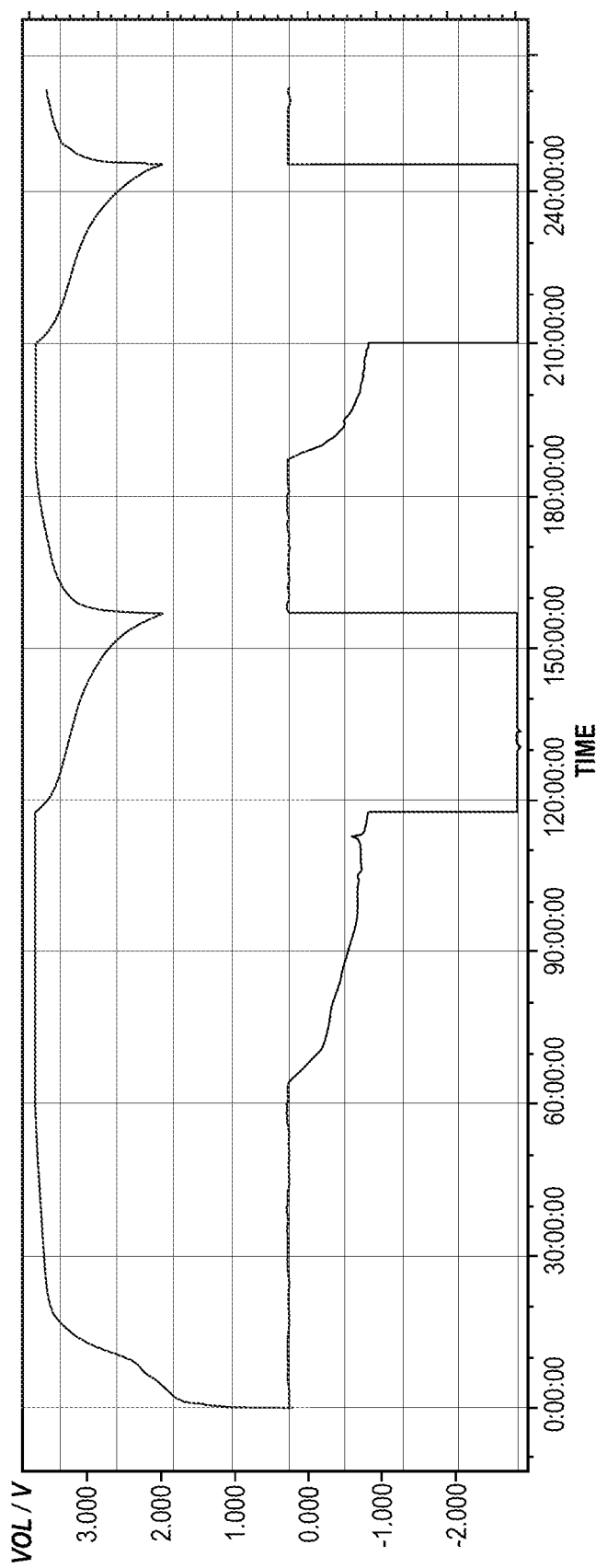
FIG. 24 depicts a charge/discharge plot.

The charge/discharge plot (0.01 mA charge/discharge current throughout) shown in FIG. 24 revealed that Coin Cell 4210-2 #2, as described in Table 2, has almost identical charge/discharge behavior to the previous entry, 4210-2 #1. The initial charge capacity was the same, 0.930 mAh. The initial discharge capacity was 0.391 mAh (it was 0.364 mAh for cell #1). The second charge capacity was 0.424 mAh, nearly identical to the value for cell #1 (0.425 mAh). The second discharge capacity was 0.355 mAh, slightly higher than the value for cell #1 (0.364 mAh).

TABLE 3

Lithium-Ion Coin Cell Fabrication Variables
Coin Cell 4D10-0

I. Silicon Particles

| | |
|---|---|
| A. Type of silicon wafer used to produce the particles | 0.4-0.6 Ω cm$^{-1}$ P-doped (n-type) silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |
| F. Aerobic or anaerobic treatment of silicon particles | Aerobic |

II. Surface Modification (covalently attached aromatic hydrocarbon derivatives)

| | |
|---|---|
| A. Modifier | 9,10-dibromoanthracene |
| B. Method of modification | 20 wt %; triglyme reflux (216° C.) for 6 h |
| C. Aerobic or anaerobic treatment | aerobic |

TABLE 3-continued

Lithium-Ion Coin Cell Fabrication Variables
Coin Cell 4D10-0

III. Addition of non-covalently-attached conductive adhesion and/or dopant additives

| | |
|---|---|
| A. Conductive adhesion additive | 10 wt % $C_{60}$ conductive adhesion additive |
| B. Dopant additive | no dopant additive |
| C. Method of addition | dichloromethane; 23(2)° C.; 10 min with sonication; air dried |
| D. Aerobic or anaerobic treatment | aerobic |

IV. Preparation of anode sheet

| | |
|---|---|
| A. Solvent, ratio of solvent to silicon particles, sonication | 1,2,3-Trichloropropane; 40 wt % solids loading with sonication |
| B. Method of application | Automated film applicator |
| C. Anode thickness | 0.100 mm |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |

V. Coin cell assembly (strictly anaerobic)

| | |
|---|---|
| A. Cathode | 0.1 mm thick × 19 mm diameter $LiCoO_2$ on Al substrate |
| B. Separator film | Celgard 0.025 mm thick × 20 mm diameter |
| C. Electrolyte solution | EC:DMC:DEC (4:3:3) with 1M LiPF6 (+unknown proprietary additives) |

Figure 25:
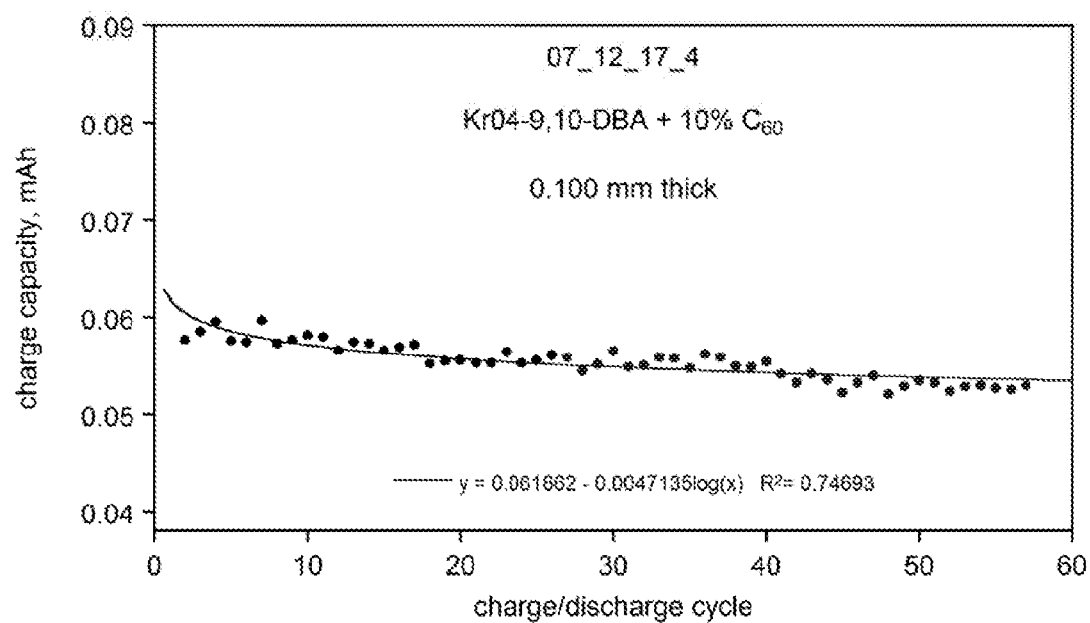
FIG. 25 depicts a charge capacity plot.
Figure 26:
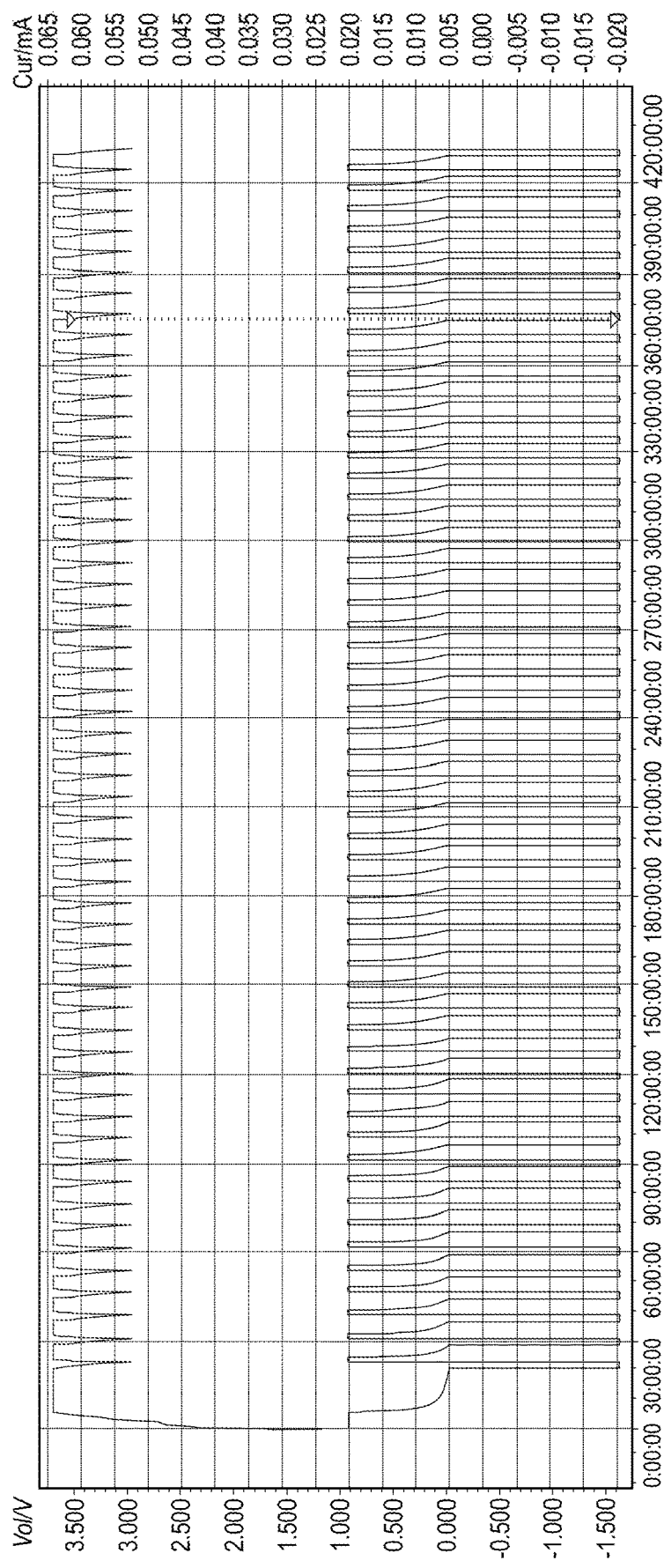
FIG. 26 depicts a charge/discharge plot.

The mass of the anode in Coin Cell 4D10-0 of Table 3 was ca. 7 mg. Therefore, the initial coin-cell charge capacity, extrapolated to 0.062 mAh from the logarithmic fit to these data as shown in FIG. 25, translates into an initial specific charge capacity of 8.9 mAh g$^{-1}$ for this anode material. The capacity fade is less than 10% over these 58 cycles as shown in FIG. 26.

TABLE 4

Lithium-Ion Coin Cell Fabrication Variables
Coin Cell 4D10-2 #1

I. Silicon Particles

| | |
|---|---|
| A. Type of silicon wafer used to produce the particles | 0.4-0.6 Ω cm$^{-1}$ P-doped (n-type) silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |
| F. Aerobic or anaerobic treatment of silicon particles | Aerobic |

II. Surface Modification (covalently attached aromatic hydrocarbon derivatives)

| | |
|---|---|
| A. Modifier | 9,10-dibromoanthracene |
| B. Method of modification | 20 wt %; triglyme reflux (216° C.) for 6 h |
| C. Aerobic or anaerobic treatment | aerobic |

III. Addition of non-covalently-attached conductive adhesion and/or dopant additives

| | |
|---|---|
| A. Conductive adhesion additive | 10 wt % $C_{60}$ conductive adhesion additive |
| B. Dopant additive | 2 wt % $C_{60}F_{48}$ dopant additive (previously referred to as D48 dopant) |
| C. Method of addition | dichloromethane; 23(2)° C.; 10 min with sonication; air dried |
| D. Aerobic or anaerobic treatment | aerobic |

TABLE 4-continued

Lithium-Ion Coin Cell Fabrication Variables
Coin Cell 4D10-2 #1

IV. Preparation of anode sheet

| | |
|---|---|
| A. Solvent, ratio of solvent to silicon particles, sonication | 1,2,3-Trichloropropane; 40 wt % solids loading with sonication |
| B. Method of application | Film Applicator |
| C. Anode thickness | 0.100 mm |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |

V. Coin cell assembly (strictly anaerobic)

| | |
|---|---|
| A. Cathode | 0.1 mmthick × 19 mm diameter LiCoO$_2$ on Al substrate |
| B. Separator film | Celgard 0.025 mm thick × 20 mm diameter |
| C. Electrolyte solution | EC:DMC:DEC (4:3:3) with 1M LiPF6 (+unknown proprietary additives) |

Figure 27:
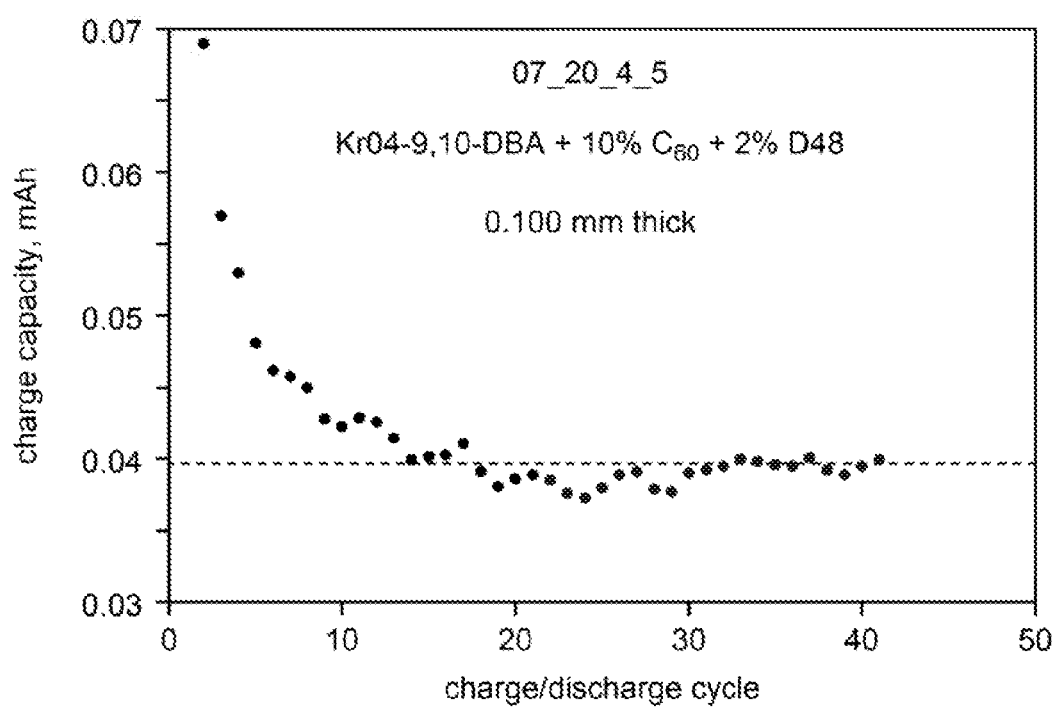
FIG. 27 depicts a charge capacity plot.
Figure 28:
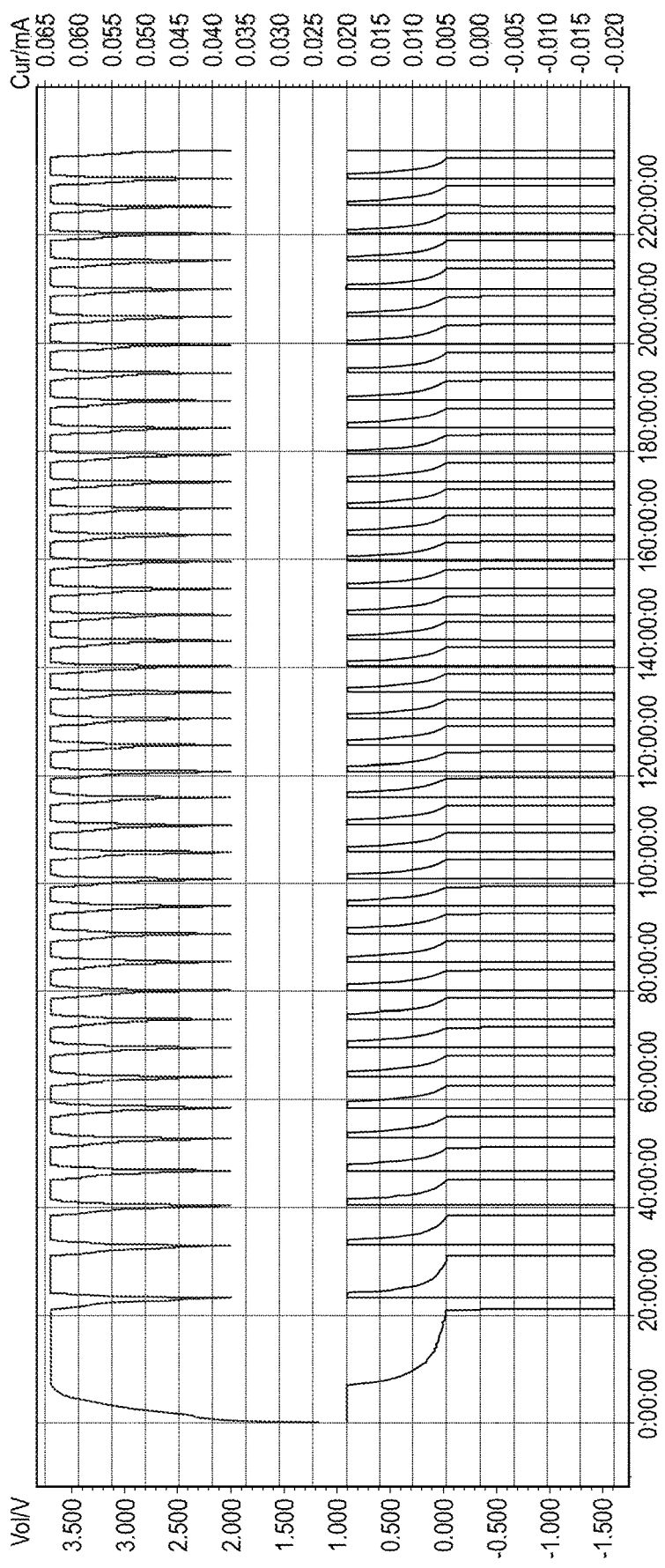
FIG. 28 depicts a charge/discharge plot.

The mass of this anode in Coin Cell 4D10-2 #1 of Table 4 was ca. 7 mg. Therefore, the nominal coin-cell charge capacity of 0.04 mAh from cycle 15 through cycle 41 translates into a specific charge capacity of 5.7 mAh g$^{-1}$ for this anode material, as shown in FIG. 27. The capacity fade appears to be insignificant after cycle 15 as shown in FIG. 28.

TABLE 5

Lithium-Ion Coin Cell Fabrication Variables
Coin Cell 4D10-2 #2

1. Silicon Particles

| | |
|---|---|
| A. Type of silicon wafer used to produce the particles | 0.4-0.6 Ω cm$^{-1}$ P-doped (n-type) silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |
| F. Aerobic or anaerobic treatment of silicon particles | Aerobic |

II. Surface Modification (covalently attached aromatic hydrocarbon derivatives)

| | |
|---|---|
| A. Modifier | 9,10-dibromoanthracene |
| B. Method of modification | 20 wt %; triglyme reflux (216° C.) for 6 h |
| C. Aerobic or anaerobic treatment | aerobic |

III. Addition of non-covalently-attached conductive adhesion and/or dopant additives

| | |
|---|---|
| A. Conductive adhesion additive | 10 wt % C$_{60}$ conductive adhesion additive |
| B. Dopant additive | 2 wt % C$_{60}$F$_{48}$ dopant additive (previously referred to as D48 dopant) |
| C. Method of addition | dichloromethane; 23(2)° C.; 10 min with sonication; air dried |
| D. Aerobic or anaerobic treatment | aerobic |

IV. Preparation of anode sheet

| | |
|---|---|
| A. Solvent, ratio of solvent to silicon particles, sonication | 1,2,3-Trichloropropane; 40 wt % solids loading with sonication |
| B. Method of application | Film Applicator |
| C. Anode thickness | 0.100 mm |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |

TABLE 5-continued

Lithium-Ion Coin Cell Fabrication Variables
Coin Cell 4D10-2 #2

V. Coin cell assembly (strictly anaerobic)

| | |
|---|---|
| A. Cathode | 0.1 mmthick × 19 mm diameter LiCoO$_2$ on Al substrate |
| B. Separator film | Celgard 0.025 mm thick × 20 mm diameter |
| C. Electrolyte solution | EC:DMC:DEC (4:3:3) with 1M LiPF6 (+unknown proprietary additives) |

Figure 29:
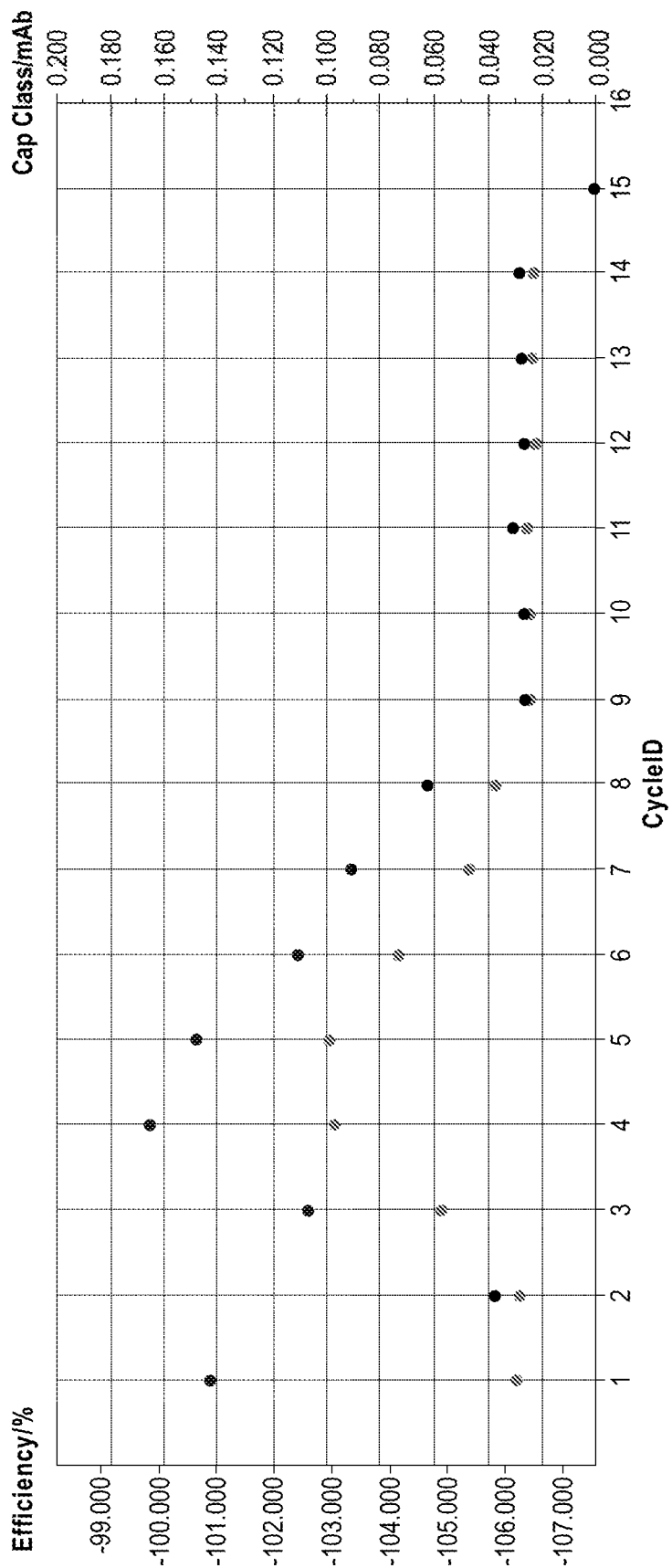
FIG. 29 depicts a charge capacity plot.
Figure 30:
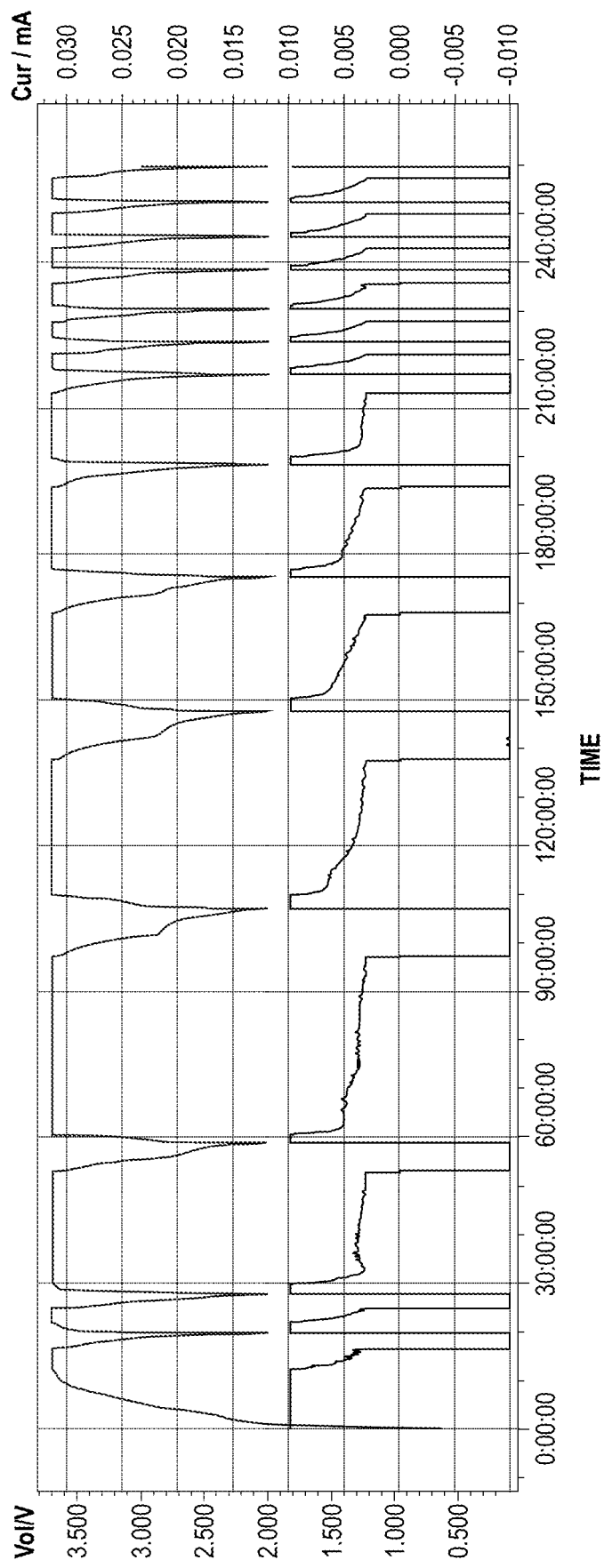
FIG. 30 depicts a charge/discharge plot.

Table 5 shows Coin Cell 4D10-2 #2. FIGS. 29 and 30 show the performance data for the coin cell.

TABLE 6

Lithium-Ion Coin Cell Fabrication Variables
Coin Cell 4D10-2 #3

I. Silicon Particles

| | |
|---|---|
| A. Type of silicon wafer used to produce the particles | 0.4-0.6 Ω cm$^{-1}$ P-doped (n-type) silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |
| F. Aerobic or anaerobic treatment of silicon particles | Aerobic |

II. Surface Modification (covalently attached aromatic hydrocarbon derivatives)

| | |
|---|---|
| A. Modifier | 9,10-dibromoanthracene |
| B. Method of modification | 20 wt %; triglyme reflux (216° C.) for 6 h |
| C. Aerobic or anaerobic treatment | aerobic |

III. Addition of non-covalently-attached conductive adhesion and/or dopant additives

| | |
|---|---|
| A. Conductive adhesion additive | 10 wt % C$_{60}$ conductive adhesion additive |
| B. Dopant additive | 2 wt % C$_{60}$F$_{48}$ dopant additive (previously referred to as D48 dopant) |
| C. Method of addition | dichloromethane; 23(2)° C.; 10 min with sonication; air dried |
| D. Aerobic or anaerobic treatment | aerobic |

IV. Preparation of anode sheet

| | |
|---|---|
| A. Solvent, ratio of solvent to silicon particles, sonication | 1,2,3-Trichloropropane; 40 wt % solids loading with sonication |
| B. Method of application | Film Applicator |
| C. Anode thickness | 0.100 mm |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |

V. Coin cell assembly (strictly anaerobic)

| | |
|---|---|
| A. Cathode | 0.1 mmthick × 19 mm diameter LiCoO$_2$ on Al substrate |
| B. Separator film | Celgard 0.025 mm thick × 20 mm diameter |
| C. Electrolyte solution | EC:DMC:DEC (4:3:3) with 1M LiPF6 (+unknown proprietary additives) |

Figure 31:
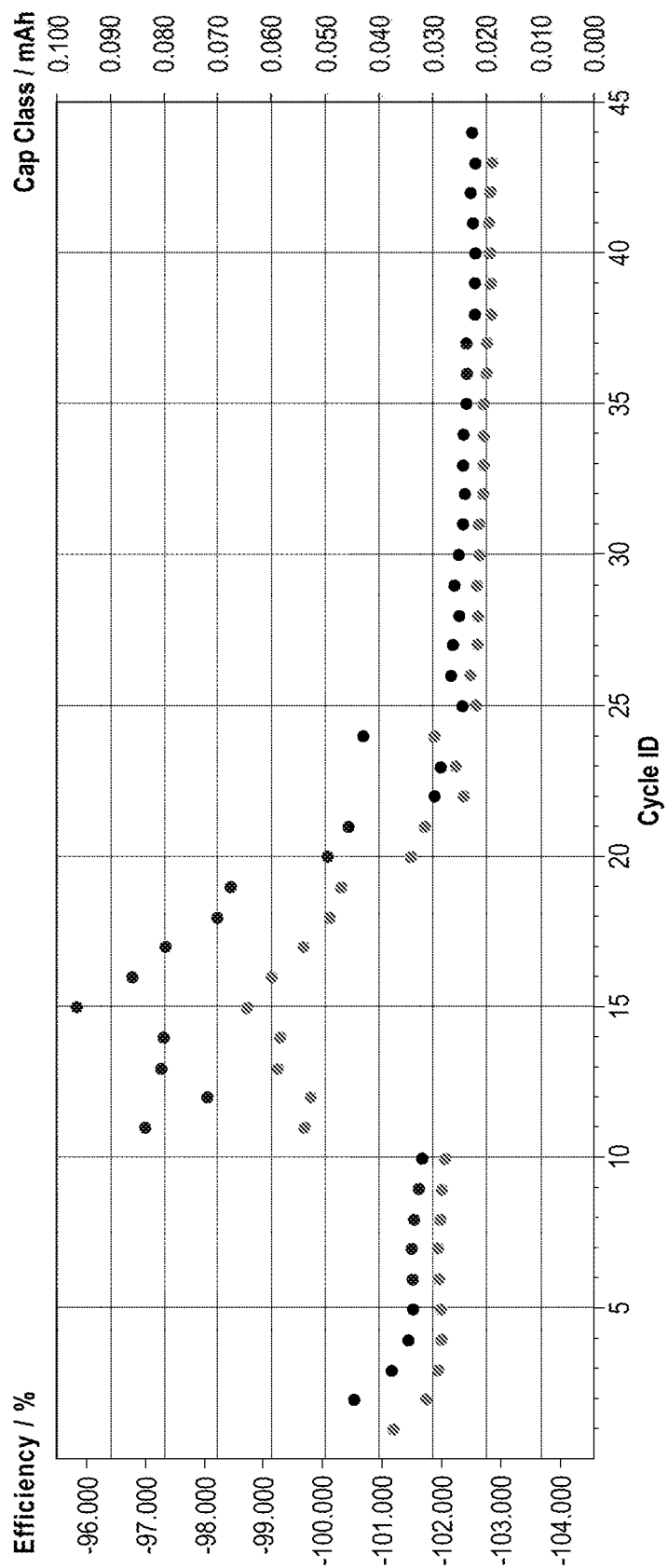
FIG. 31 depicts a charge capacity plot.
Figure 32:
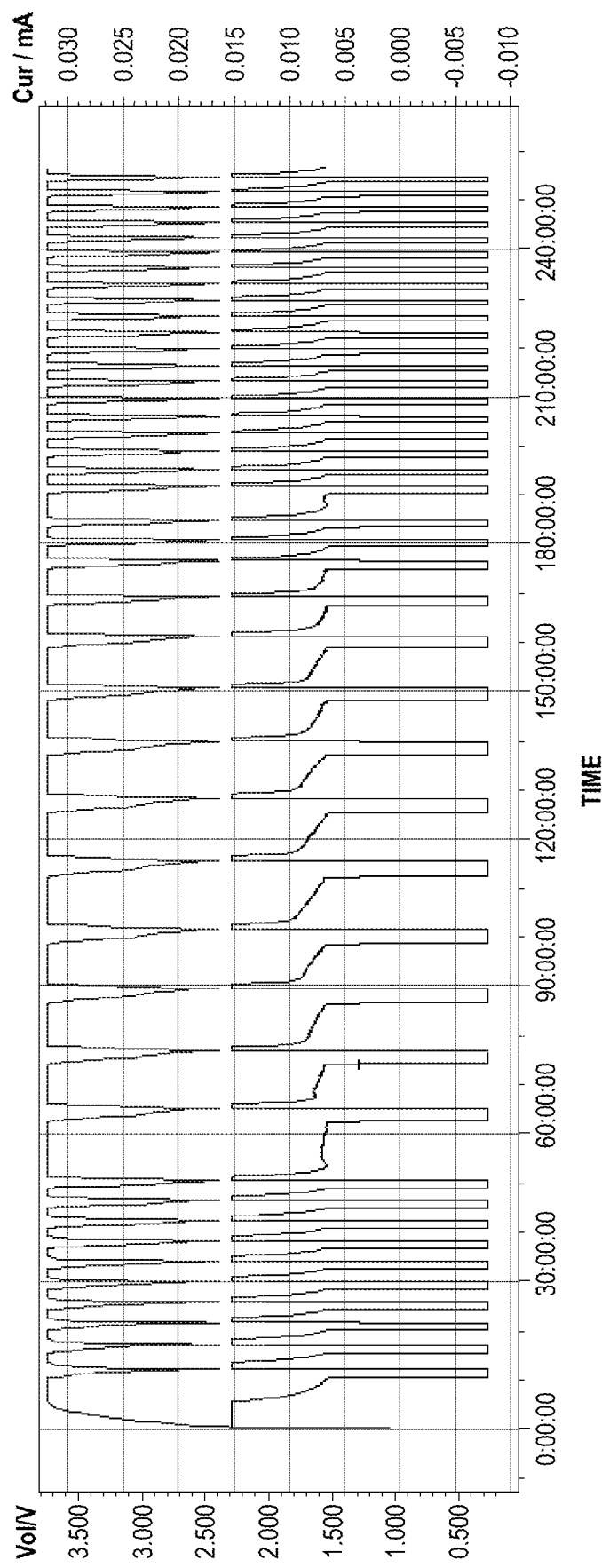
FIG. 32 depicts a charge/discharge plot.

Table 6 shows Coin Cell 4D10-2 #3. FIGS. 31 and 32 show the performance data for the coin cell.

TABLE 7

Lithium-Ion Coin Cell Fabrication Variables
Coin Cell 4D10-2 #4

I. Silicon Particles

| | |
|---|---|
| A. Type of silicon wafer used to produce the particles | 0.4-0.6 Ω cm$^{-1}$ P-doped (n-type) silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |
| F. Aerobic or anaerobic treatment of silicon particles | Aerobic |

II. Surface Modification (covalently attached aromatic hydrocarbon derivatives)

| | |
|---|---|
| A. Modifier | 9,10-dibromoanthracene |
| B. Method of modification | 20 wt %; triglyme reflux (216° C.) for 6 h |
| C. Aerobic or anaerobic treatment | aerobic |

III. Addition of non-covalently-attached conductive adhesion and/or dopant additives

| | |
|---|---|
| A. Conductive adhesion additive | 10 wt % $C_{60}$ conductive adhesion additive |
| B. Dopant additive | 2 wt % $C_{60}F_{48}$ dopant additive (previously referred to as D48 dopant) |
| C. Method of addition | dichloromethane; 23(2)° C.; 10 min with sonication; air dried |
| D. Aerobic or anaerobic treatment | aerobic |

IV. Preparation of anode sheet

| | |
|---|---|
| A. Solvent, ratio of solvent to silicon particles, sonication | 1,2,3-Trichloropropane; 40 wt % solids loading with sonication |
| B. Method of application | Film Applicator |
| C. Anode thickness | 0.100 mm |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |

V. Coin cell assembly (strictly anaerobic)

| | |
|---|---|
| A. Cathode | 0.1 mm thick × 19 mm diameter $LiCoO_2$ on Al substrate |
| B. Separator film | Celgard 0.025 mm thick × 20 mm diameter |
| C. Electrolyte solution | EC:DMC:DEC (4:3:3) with 1M LiPF6 (+unknown proprietary additives) |

Figure 33:
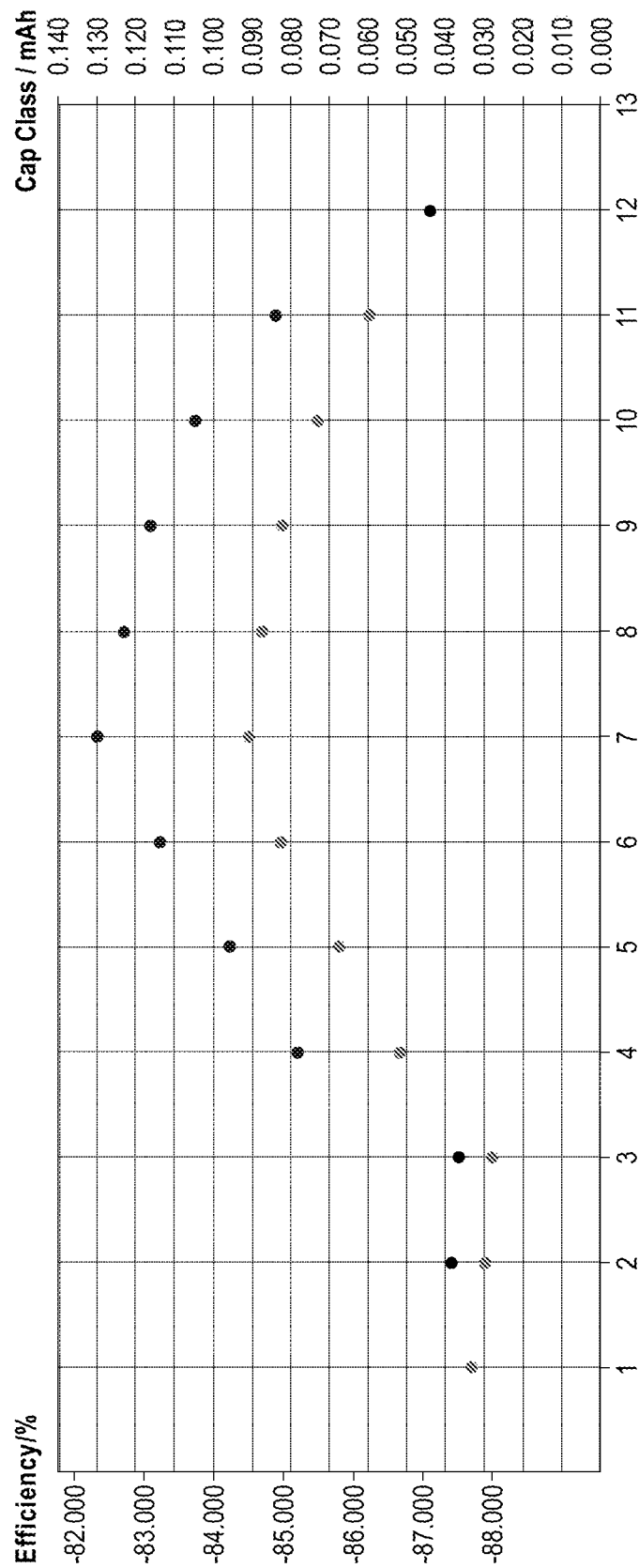
FIG. 33 depicts a charge capacity plot.
Figure 34:
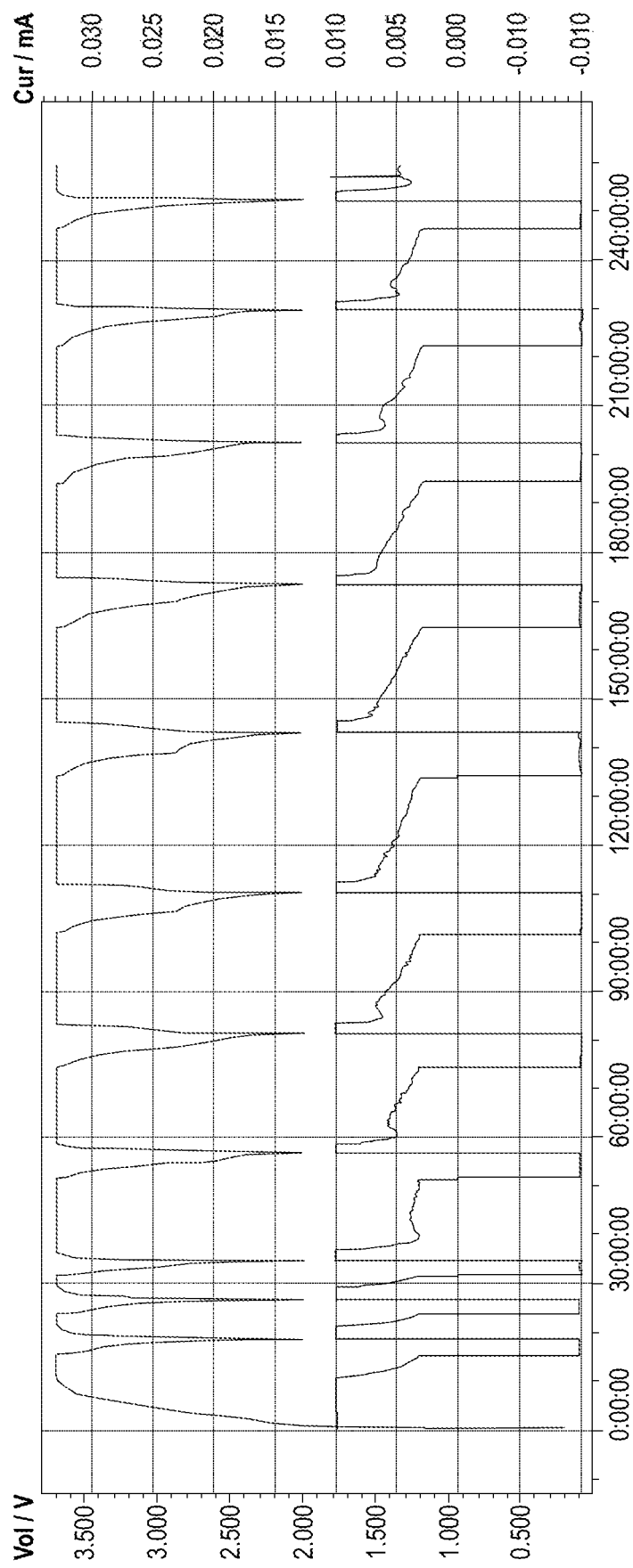
FIG. 34 depicts a charge/discharge plot.

Table 7 shows Coin Cell 4D10-2 #4. FIGS. 33 and 34 show the performance data for the coin cell.

TABLE 8

Lithium-Ion Coin Cell Fabrication Variables
Coin Cell 429-0

I. Silicon Particles

| | |
|---|---|
| A. Type of silicon wafer used to produce the particles | 0.4-0.6 Ω cm$^{-1}$ P-doped (n-type) silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |
| F. Aerobic or anaerobic treatment of silicon particles | Aerobic |

II. Surface Modification (covalently attached aromatic hydrocarbon derivatives)

| | |
|---|---|
| A. Modifier | 2,3-dihydroxynaphthalene |
| B. Method of modification | 20 wt %; triglyme reflux (216° C.) for 6 h |
| C. Aerobic or anaerobic treatment | aerobic |

III. Addition of non-covalently-attached conductive adhesion and/or dopant additives

| | |
|---|---|
| A. Conductive adhesion additive | 9 wt % $C_{60}$ conductive adhesion additive |
| B. Dopant additive | no dopant additive |
| C. Method of addition | dichloromethane; 23(2)° C.; 10 min with sonication; air dried |
| D. Aerobic or anaerobic treatment | aerobic |

IV. Preparation of anode sheet

| | |
|---|---|
| A. Solvent, ratio of solvent to silicon particles, sonication | 1,2,3-Trichloropropane; 40 wt % solids loading with sonication |
| B. Method of application | Film Applicator |
| C. Anode thickness | 0.200 mm |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |

V. Coin cell assembly (strictly anaerobic)

| | |
|---|---|
| A. Cathode | 0.1 mm thick × 19 mm diameter $LiCoO_2$ on Al substrate |
| B. Separator film | Celgard 0.025 mm thick × 20 mm diameter |
| C. Electrolyte solution | EC:DMC:DEC (4:3:3) with 1M LiPF6 (+unknown proprietary additives) |

Figure 35:
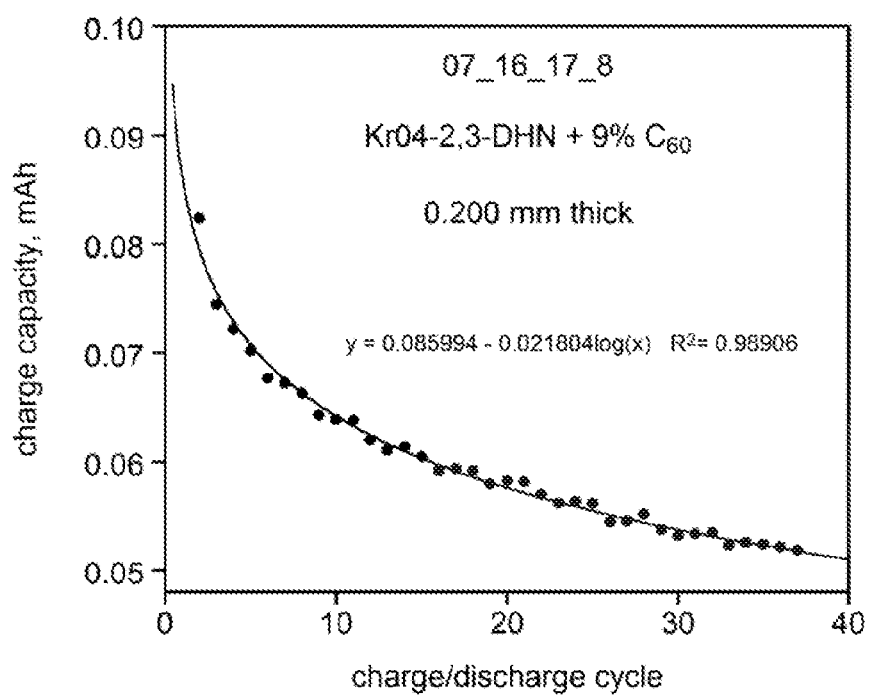
FIG. 35 depicts a charge capacity plot.
Figure 36:
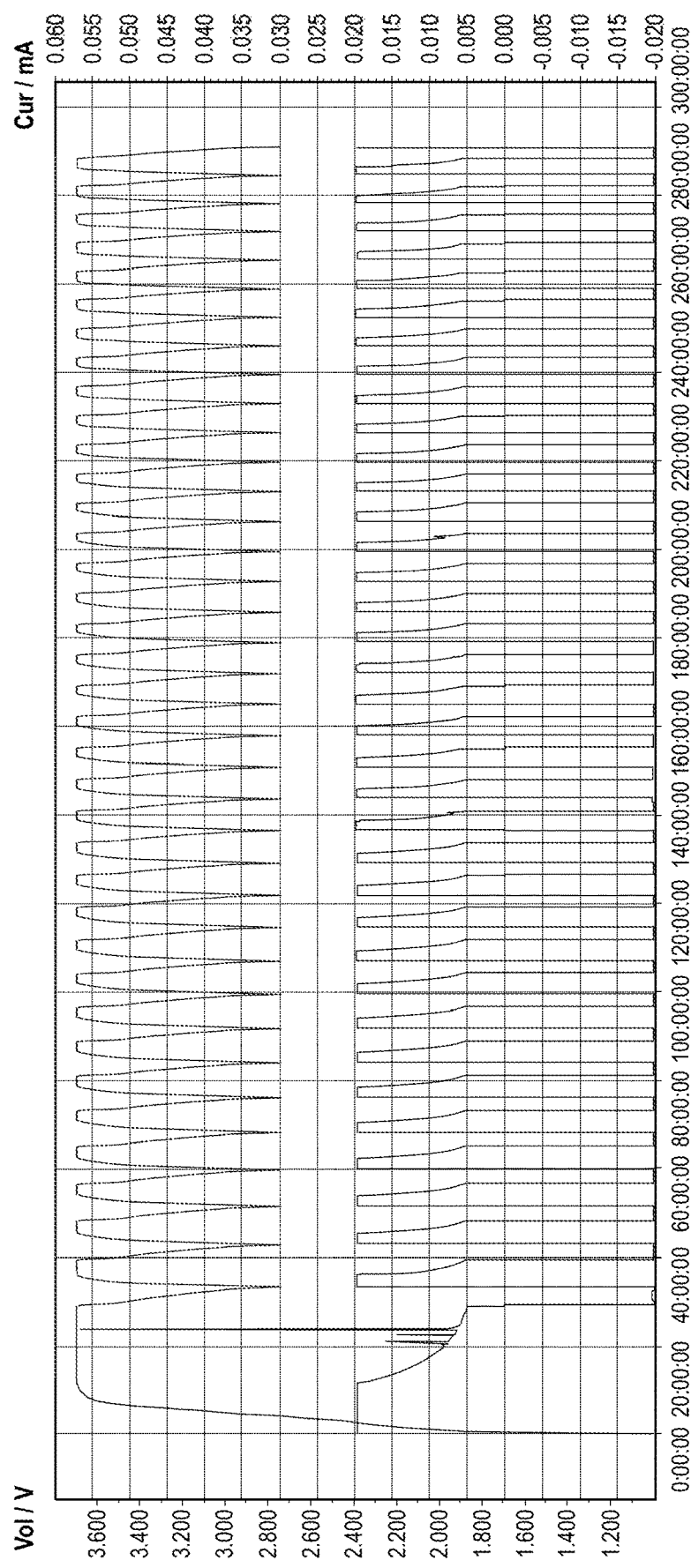
FIG. 36 depicts a charge/discharge plot.

The anode mass of Coin Cell 429-0 of Table 8 is probably ca. 7 mg. The specific charge capacity of the anode material during the third cycle is ca. 11 mAh g$^{-1}$ as shown in FIG. 35. The capacity fade is quite significant as shown in FIG. 36.

TABLE 9

Lithium-Ion Coin Cell Fabrication Variables
Coin Cell 4210-7

I. Silicon Particles

| | |
|---|---|
| A. Type of silicon wafer used to produce the particles | 0.4-0.6 Ω cm$^{-1}$ P-doped (n-type) silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |
| F. Aerobic or anaerobic treatment of silicon particles | Aerobic |

II. Surface Modification (covalently attached aromatic hydrocarbon derivatives)

| | |
|---|---|
| A. Modifier | 2,3-dihydroxynaphthalene |
| B. Method of modification | 20 wt %; triglyme reflux (216° C.) for 6 h |
| C. Aerobic or anaerobic treatment | aerobic |

III. Addition of non-covalently-attached conductive adhesion and/or dopant additives

| | |
|---|---|
| A. Conductive adhesion additive | 10 wt % $C_{60}$ conductive adhesion additive |
| B. Dopant additive | 7 wt % $C_{60}F_{48}$ dopant additive (previously referred to as D48 dopant) |

TABLE 9-continued

Lithium-Ion Coin Cell Fabrication Variables
Coin Cell 4210-7

| | |
|---|---|
| C. Method of addition | dichloromethane; 23(2)° C.; 10 min with sonication; air dried |
| D. Aerobic or anaerobic treatment | aerobic |
| IV. Preparation of anode sheet | |
| A. Solvent, ratio of solvent to silicon particles, sonication | 1,2,3-Trichloropropane; 40 wt % solids loading with sonication |
| B. Method of application | paintbrush |
| C. Anode thickness | unknown thickness |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |
| V. Coin cell assembly (strictly anaerobic) | |
| A. Cathode | 0.1 mmthick × 19 mm diameter $LiCoO_2$ on Al substrate |
| B. Separator film | Celgard 0.025 mm thick × 20 mm diameter |
| C. Electrolyte solution | EC:DMC:DEC (4:3:3) with 1M $LiPF_6$ (+unknown proprietary additives) |

Figure 37:
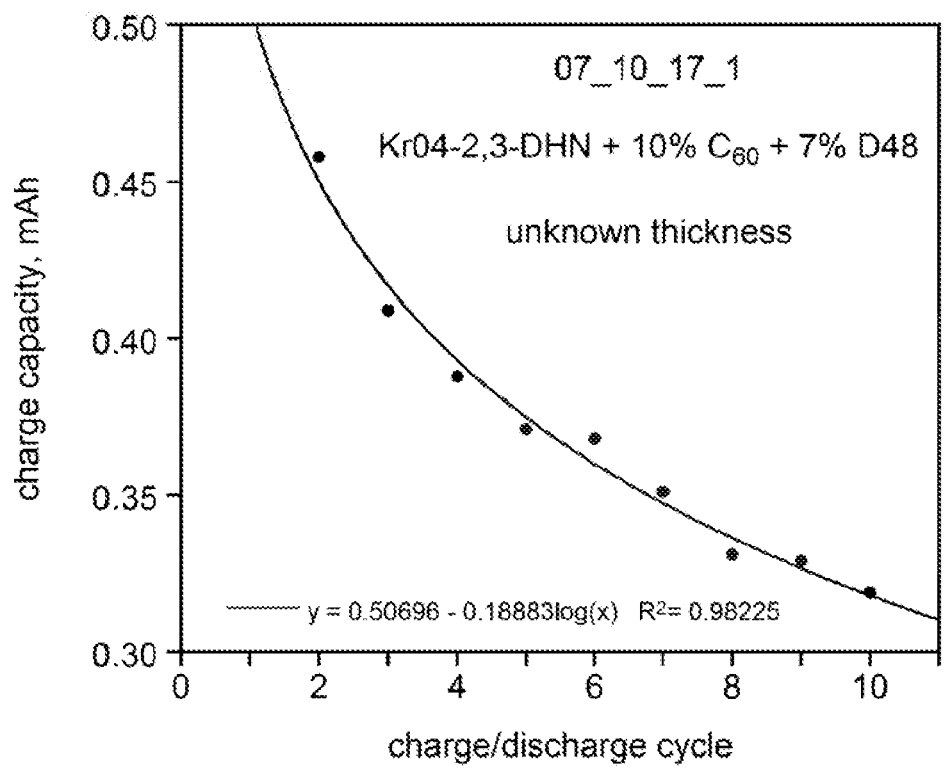
FIG. 37 depicts a charge capacity plot.
Figure 38:
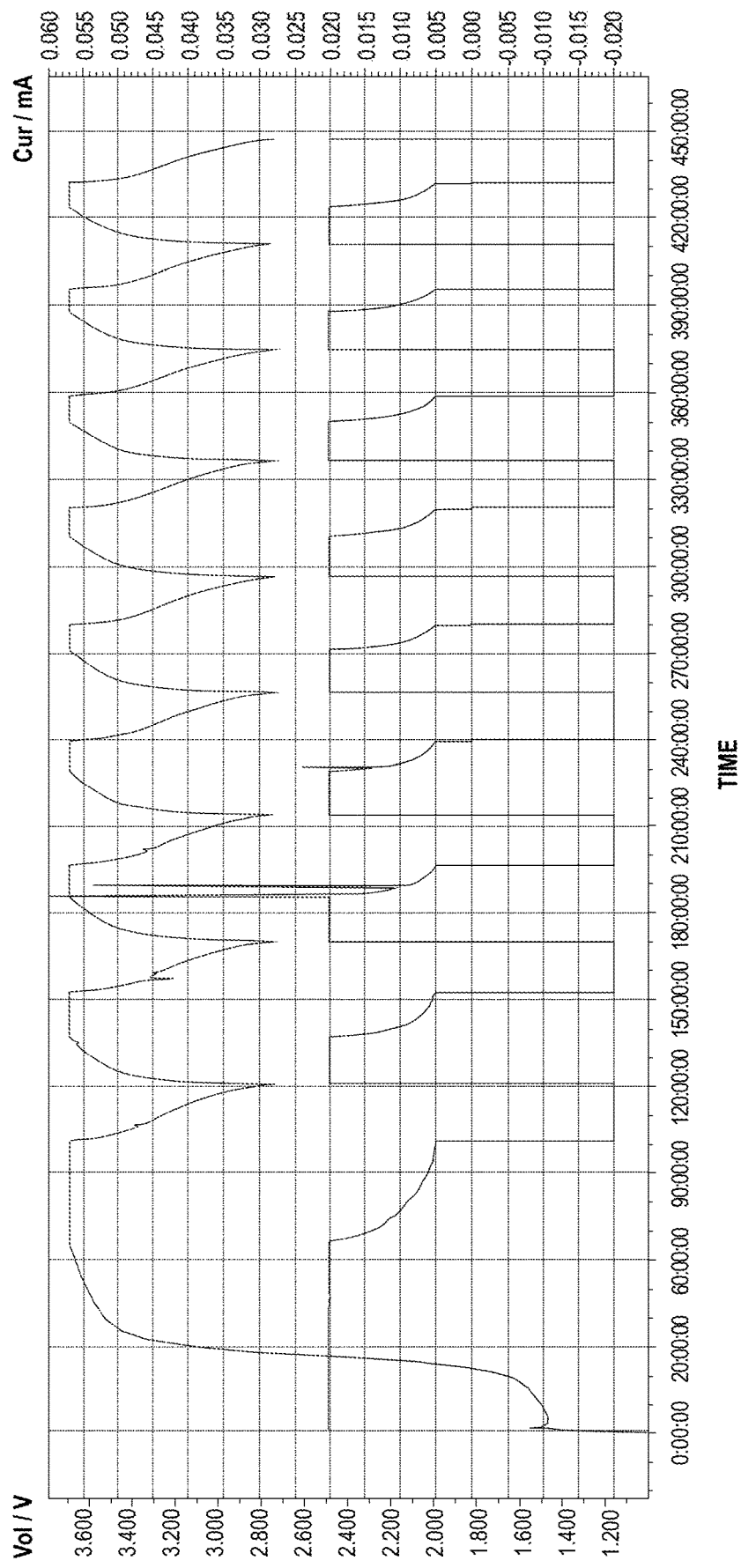
FIG. 38 depicts a charge/discharge plot.

Coin Cell 4210-7 of Table 9 has excellent charge capacity but only marginal fade characteristics as shown in FIGS. 37 and 38. Taking the coin cell charge capacity after the first 10 cycles, 0.319 mAh, the specific charge capacity of this anode material, assuming that the anode weighed ca. 7 mg, is ca. 46 mAh g 1. Note that the theoretical specific charge capacity of silicon, ca. 4,000 mAh $g^{-1}$, is ca. 87 times higher. However, the amount of silicon in this anode is almost certainly 20+% lower than 7 mg (it contains 10% $C_{60}$ conductive adhesion additive, 7% $C_{60}F_{48}$ dopant additive, and an unknown amount of 2,3-DHN surface modifier). Therefore, the specific charge capacity of the silicon in this anode material is probably ca. 58 mAh $g^{-1}$. Furthermore, that is the specific charge capacity after 10 cycles, during which time the cell lost more than 25% of the charge capacity during the second cycle. Calculating the specific charge capacity of the silicon in the anode based on that, it is ca. 76 mAh $g^{-1}$.

TABLE 10

Lithium-Ion Coin Cell Fabrication Variables
Coin Cell 1210-0 #1 and Coin Cell 1210-0 #3

| | |
|---|---|
| I. Silicon Particles | |
| A. Type of silicon wafer used to produce the particles | 99.5% pure intrinsic silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |
| F. Aerobic or anaerobic treatment of silicon particles | Aerobic |
| II. Surface Modification (covalently attached aromatic hydrocarbon derivatives) | |
| A. Modifier | 2,3-dihydroxynaphthalene |
| B. Method of modification | 20 wt %; triglyme reflux (216° C.) for 6 h |
| C. Aerobic or anaerobic treatment | aerobic |

TABLE 10-continued

Lithium-Ion Coin Cell Fabrication Variables
Coin Cell 1210-0 #1 and Coin Cell 1210-0 #3

| | |
|---|---|
| III. Addition of non-covalently-attached conductive adhesion and/or dopant additives | |
| A. Conductive adhesion additive | 10 wt % $C_{60}$ conductive adhesion additive |
| B. Dopant additive | no dopant additive |
| C. Method of addition | dichloromethane; 23(2)° C.; 10 min with sonication; air dried |
| D. Aerobic or anaerobic treatment | aerobic |
| IV. Preparation of anode sheet | |
| A. Solvent, ratio of solvent to silicon particles, sonication | 1,2,3-Trichloropropane; 40 wt % solids loading with sonication |
| B. Method of application | Automated film applicator |
| C. Anode thickness | 0.100 mm |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |
| V. Coin cell assembly (strictly anaerobic) | |
| A. Cathode | 0.1 mmthick × 19 mm diameter $LiCoO_2$ on Al substrate |
| B. Separator film | Celgard 0.025 mm thick × 20 mm diameter |
| C. Electrolyte solution | EC:DMC:DEC (4:3:3) with 1M $LiPF_6$ (+unknown proprietary additives) |

Coin Cell 1210-0 #1 of Table 10 had still not reached 3.7 V after many hours; the voltage seemed to have stabilized at ca. 3.6 V and continued to charge. The voltage limit was changed to 3.6 V and the cell was restarted. It was still charging at 0.0075 mA after an additional 20 h. Coin Cell 1210-0 #3 exhibited essentially the same behavior, and the same voltage-limit switch was made. The only difference was that it was still charging at 0.0131 mA after the additional 20 h. Note, 0.02 mA for constant current phases; down to 0.005 mA for constant voltage phase during charging.

TABLE 11

Lithium-Ion Coin Cell Fabrication Variables
Coin Cell 4210-0 #1 and Coin Cell 4210-0 #3

| | |
|---|---|
| I. Silicon Particles | |
| A. Type of silicon wafer used to produce the particles | 0.4-0.6 Ω $cm^{-1}$ P-doped (n-type) silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |
| F. Aerobic or anaerobic treatment of silicon particles | Aerobic |
| II. Surface Modification (covalently attached aromatic hydrocarbon derivatives) | |
| A. Modifier | 2,3-dihydroxynaphthalene |
| B. Method of modification | 20 wt %; triglyme reflux (216° C.) for 6 h |
| C. Aerobic or anaerobic treatment | aerobic |
| III. Addition of non-covalently-attached conductive adhesion and/or dopant additives | |
| A. Conductive adhesion additive | 10 wt % $C_{60}$ conductive adhesion additive |
| B. Dopant additive | no dopant additive |

TABLE 11-continued

Lithium-Ion Coin Cell Fabrication Variables
Coin Cell 4210-0 #1 and Coin Cell 4210-0 #3

| | |
|---|---|
| C. Method of addition | dichloromethane; 23(2)° C.; 10 min with sonication; air dried |
| D. Aerobic or anaerobic treatment | aerobic |
| IV. Preparation of anode sheet | |
| A. Solvent, ratio of solvent to silicon particles, sonication | 1,2,3-Trichloropropane; 40 wt % solids loading with sonication |
| B. Method of application | Automated film applicator |
| C. Anode thickness | 0.100 mm |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |
| V. Coin cell assembly (strictly anaerobic) | |
| A. Cathode | 0.1 mmthick × 19 mm diameter $LiCoO_2$ on Al substrate |
| B. Separator film | Celgard 0.025 mm thick × 20 mm diameter |
| C. Electrolyte solution | EC:DMC:DEC (4:3:3) with 1M $LiPF_6$ (+unknown proprietary additives) |

Coin Cell 4210-0 #1 of Table 11 had not reached 0.005 mA during the first constant voltage (3.7 V) phase after 27 h. Coin Cell 4210-0 #3 of Table 11 had not reached 3.7 V during the first constant current phase after 17 h. Note, 0.02 mA for constant current phases; down to 0.005 mA for constant voltage phase during charging.

TABLE 12

Lithium-Ion Coin Cell Fabrication Variables
Coin Cell 5210-0 #1; Coin Cell 5210-0 #2; Coin Cell 5210-0 #3

| | |
|---|---|
| I. Silicon Particles | |
| A. Type of silicon wafer used to produce the particles | 0.014-0.017 Ω $cm^{-1}$B-doped (p-type) silicon |
| B. Particle Size | APS < 400 nm |
| C. Solvent used for the grinding process | Benzene |
| D. Solvent removal methodology | Vacuum distillation followed by vacuum drying for 6 h at 23(2)° C. |
| E. Treatment with or without aq. HF or anhydrous HF | Not treated with HF |
| F. Aerobic or anaerobic treatment of silicon particles | Aerobic |
| II. Surface Modification (covalently attached aromatic hydrocarbon derivatives) | |
| A. Modifier | 2,3-dihydroxynaphthalene |
| B. Method of modification | 20 wt %; triglyme reflux (216° C.) for 6 h |
| C. Aerobic or anaerobic treatment | aerobic |
| III. Addition of non-covalently-attached conductive adhesion and/or dopant additives | |
| A. Conductive adhesion additive | 10 wt % $C_{60}$ conductive adhesion additive |
| B. Dopant additive | no dopant additive |
| C. Method of addition | dichloromethane; 23(2)° C.; 10 min with sonication; air dried |
| D. Aerobic or anaerobic treatment | aerobic |
| IV. Preparation of anode sheet | |
| A. Solvent, ratio of solvent to silicon particles, sonication | 1,2,3-Trichloropropane; 40 wt % solids loading with sonication |
| B. Method of application | Automated film applicator |
| C. Anode thickness | 0.100 mm |
| D. Method of anode drying | 1 hr air-dry with heat ramp to 90° C.; 100° C.; 1 h under vacuum + 30 min from vacuum to atmospheric pressure |
| E. Aerobic or anaerobic treatment | aerobic |
| V. Coin cell assembly (strictly anaerobic) | |
| A. Cathode | 0.1 mmthick × 19 mm diameter $LiCoO_2$ on Al substrate |
| B. Separator film | Celgard 0.025 mm thick × 20 mm diameter |
| C. Electrolyte solution | EC:DMC:DEC (4:3:3) with 1M $LiPF_6$ (+unknown proprietary additives) |

Figure 39:
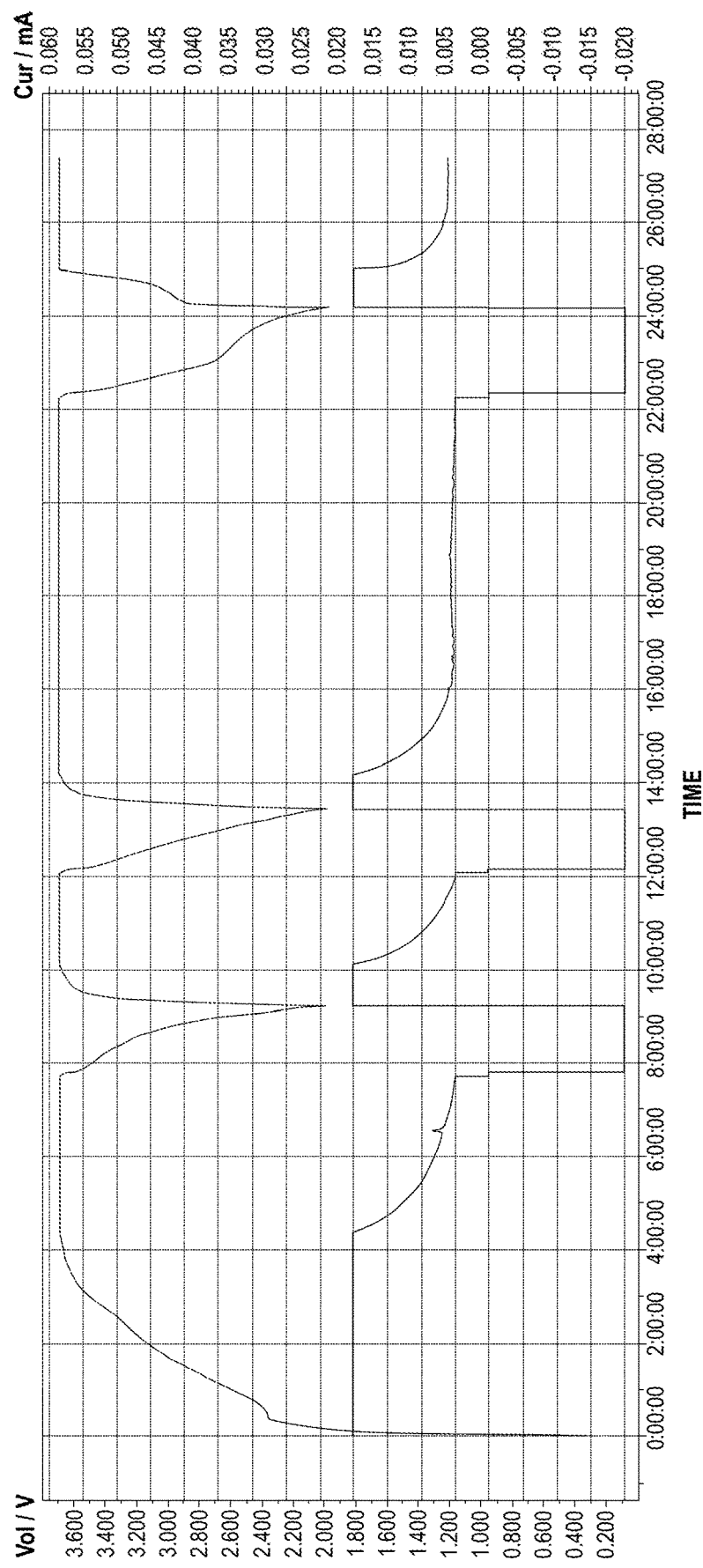
FIG. 39 depicts a charge/discharge plot.
Figure 40:
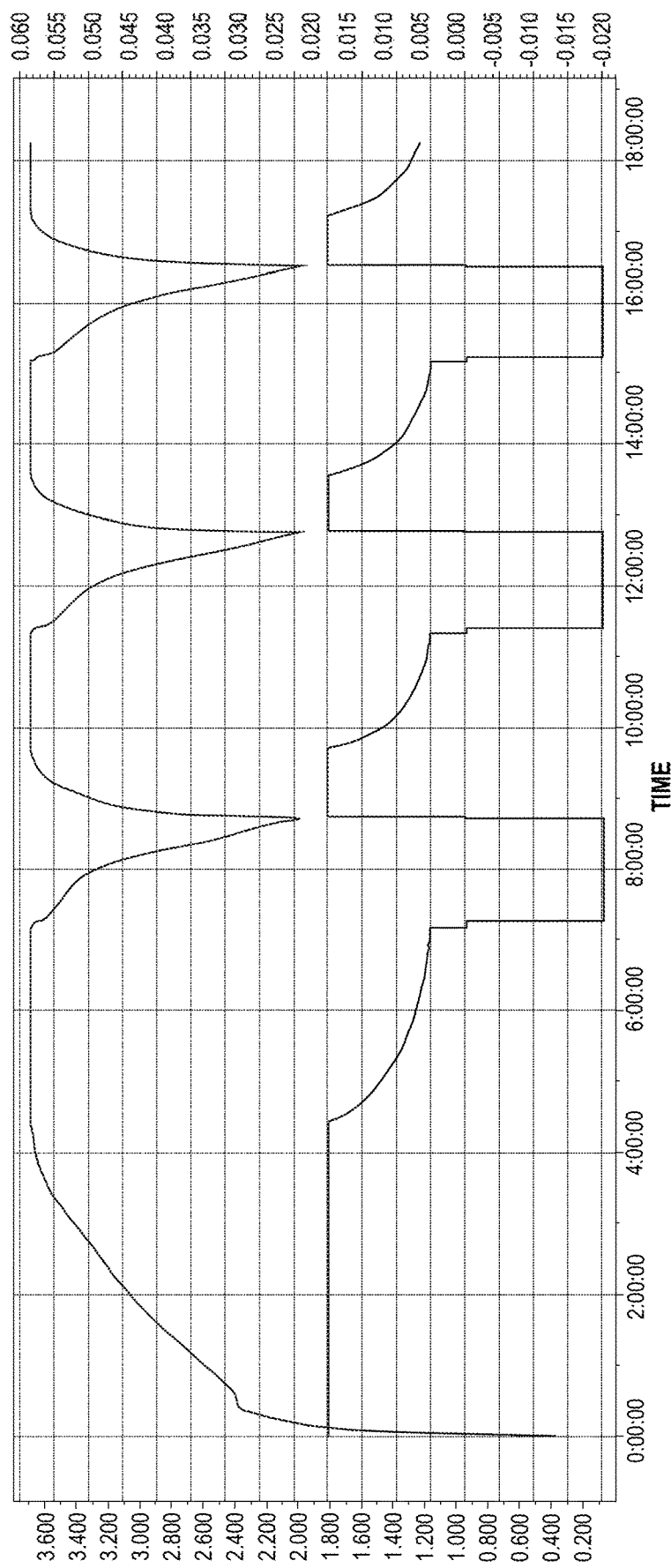
FIG. 40 depicts a charge/discharge plot.
Figure 41:
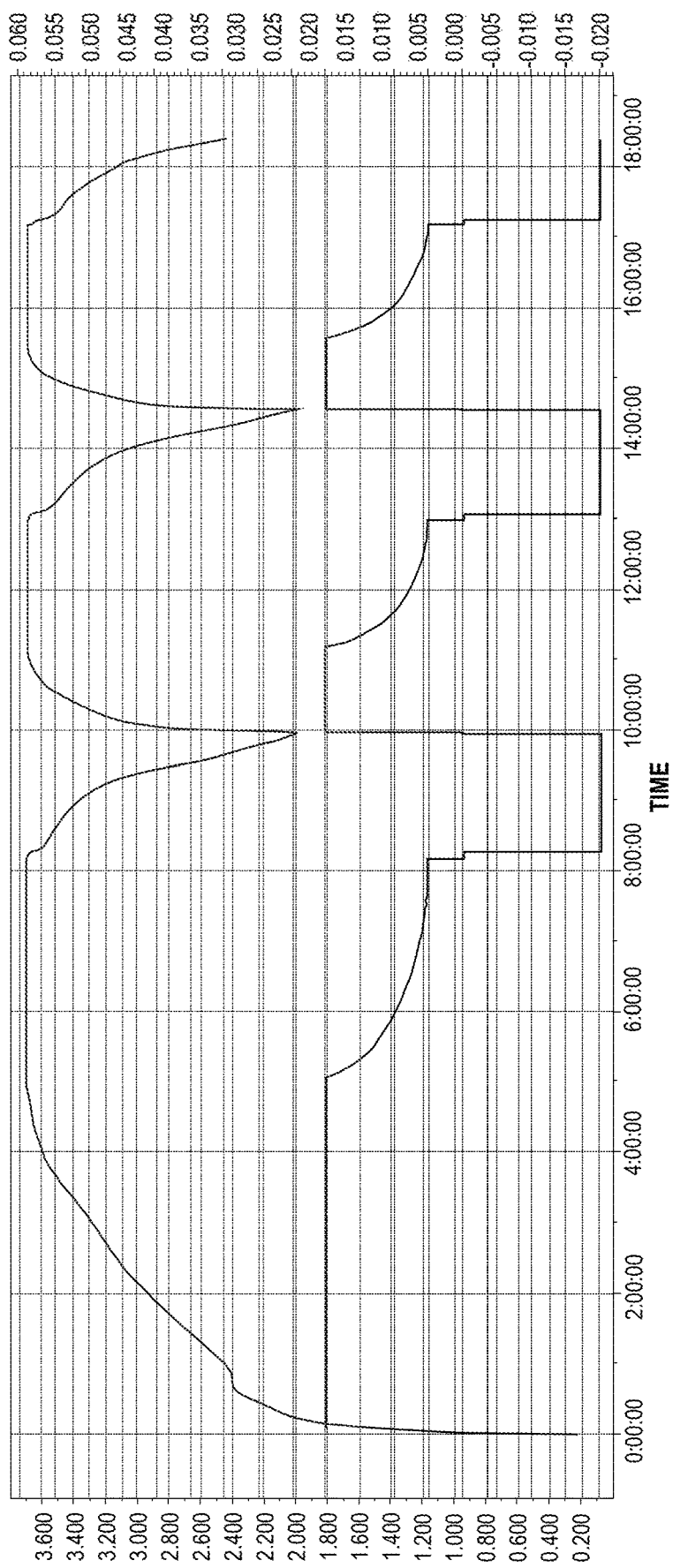
FIG. 41 depicts a charge/discharge plot.

FIGS. 39-41 show charge/discharge cycles for the coin cells of Table 2. Coin Cell 5210-0 #1 showed the following performance: $1^{st}$ cycle: charge capacity=0.119 mAh; discharge capacity=0.029 mAh; $2^{nd}$ cycle: charge capacity=0.037 mAh; discharge capacity=0.026 mAh; $3^{rd}$ cycle: charge capacity=0.069 mAh; discharge capacity=0.037 mAh; and $4^{th}$ cycle: charge capacity=0.027+ mAh (not finished charging at this time). Coin Cell 5210-0 #2 showed the following performance: $1^{st}$ cycle: charge capacity=0.116 mAh; discharge capacity=0.029 mAh; $2^{nd}$ cycle: charge capacity=0.034 mAh; discharge capacity=0.027 mAh; and 3rd cycle: charge capacity=0.031 mAh; discharge capacity=0.026 mAh. Coin Cell 5210-0 #3 showed the following performance: $1^{st}$ cycle: charge capacity=0.130 mAh; discharge capacity=0.034 mAh; and $2^{nd}$ cycle: charge capacity=0.041 mAh; discharge capacity=0.031 mAh.

Tables 13 and 14 show the coin cell data charge capacity, discharge capacity, specific charge capacity, and fade, in a summarized fashion. The data in Table 14 is intended to compare the surface modification trends, all with the same n-type silicon base. As the surface modifier grows in size, there is observed a reduction of resistivity and an increase in specific charge capacity.

TABLE 13

| Anode Formula | * CCC/CVC $V_{max}/V_{min}$ (mA)/(V) | (wet) film thickness/ mass (mg) | Charge Capacity (mAh) | Discharge Capacity (mAh) | Spec. Charge Capacity (mAh/g) | Cap. Fade # cycles |
|---|---|---|---|---|---|---|
| 4210-2 #2 | 0.010/0.003 3.70 V/2.00 V | 0.100 mm 5.3 | 0.425 | 0.364 | 80.1 | 11% 3 |
| 4210-2 #4 | 0.010/0.003 3.70 V/2.00 V | 0.100 mm 5.3 | 0.424 | 0.355 | 80.0 | 11% 3 |
| 4210-0 #1 | 0.020/0.005 3.70 V/2.00 V | 0.100 mm 5.9 | 0.368 | 0.334 | 62.4 | 6% 2 |
| 4210-0 #3 | 0.020/0.005 3.70 V/2.00 V | 0.100 mm 5.9 | 0.232 | 0.193 | 39.3 | 27% 3 |
| 5210-0 #1 | 0.020/0.005 3.70 V/2.00 V | 0.100 mm 5.9 | 0.051 | 0.042 | 8.6 | 14% 20 |

TABLE 13-continued

| Anode Formula | * CCC/CVC $V_{max}/V_{min}$ (mA)/(V) | (wet) film thickness/ mass (mg) | Charge Capacity (mAh) | Discharge Capacity (mAh) | Spec. Charge Capacity (mAh/g) | Cap. Fade # cycles |
|---|---|---|---|---|---|---|
| 5210-0 #2 | 0.020/0.005 3.70 V/2.00 V | 0.100 mm 5.9 | 0.069 | 0.050 | 11.7 | 0%† 14 |
| 1210-0 #1 | 0.020/0.005 3.60 V/2.00 V | 0.100 mm 5.9 | 0.059 | 0.053 | 10.0 | 30% 14 |
| 1210-0 #3 | 0.020/0.005 3.60 V/2.00 V | 0.100 5.9 | 0.110 | 0.095 | 18.6 | 40.7 4 |
| 4B10-0 #2 | 0.02 mA/ 3.70 V/2.75 V | unknown ~7 mg | 0.062 | 0.06 | 8.9 | 10% 60 |
| 4B10-2 #1 | 0.02 mA/ 3.70 V/2.75 V | 0.100 mm/ 7 mg | 0.05 | 0.04 | 5.7 | 30% 45 |
| 429-0 #4 | 0.02 mA/ 3.70 V/2.00 V | 0.200 mm/ 12 mg | 0.13 | 0.075 | 10.8 | 20% 20 |
| CMS graphite anode | 0.02 mA/ 3.7 V/2.0 V | 0.05 mm (dry)/ 16 mg | 0.826 | 0.755 | 51.6 | 16% 3 |

* Anode formulae:
1***-*: (intrinsic) 99.5%; 325 mesh (Alpha Aesar) CAS# 7440-21-3
4***-*: (n-type); P-doped wafer; Resist. = 0.4 – 0.6 Ω cm$^{-1}$
5***-*: (p-type); B-doped wafer; Resist. = 0.014 – 0.016 Ω cm$^{-1}$
Cathode formula: LiCoO$_2$
Solvent/Electrolyte: EC:DMC:DEC (4:3:3 by vol.)/LiPF6 (1M)
**CCC: Constant Current Charge
CVC: Constant Voltage Charge
$V_{max}$: Charging voltage limit
$V_{min}$: Discharge voltage limit
†charge capacity increased during the first few cycles; insufficient cycles have been acquired to show capacity fade.

TABLE 14

| Anode Formula | Resist. MΩ/cm | * CCC/CVC $V_{max}/V_{min}$ (mA)/(V) | (wet) film thickness/ mass (mg) | Charge Capacity (mAh) | Discharge Capacity (mAh) | Spec. Charge Capacity (mAh/g) | Cap. Fade # cycles |
|---|---|---|---|---|---|---|---|
| 4210-0 #1 | 0.020 | 0.020/0.005 3.70 V/2.00 V | 0.100 mm 5.9 | 0.368 | 0.334 | 62.4 | 6% 2 |
| 4110-0 #3 | 0.180 | 0.020/0.005 3.70 V/2.00 V | 0.100 mm 8.1 | 0.347 | 0.323 | 42.8 | |
| 4B #1 | >40 | 0.020/0.005 3.70 V/2.00 V | 0.100 mm 2.9 | 0.043 | 0.033 | 14.8 | 0%† 11 |
| 4B10-0 #1 | 9.8 | 0.020/0.005 3.70 V/2.00 V | 0.100 mm 3.6 | 0.051 | 0.034 | 14.1 | 35% 11 |
| CMS graphite anode | Not meas. | 0.02 mA/ 3.7 V/2.0 V | 0.05 mm (dry)/ 16 mg | 0.826 | 0.755 | 51.6 | 16% 3 |

4B*** = n-type c-Si surface passivated with benzene only.
4110-0 = n-type c-Si surface modified with catechol (dihydroxy benzene)
4210-0 = n-type c-Si surface modified with dihydroxy naphthalene.

Example 6

Comparison to Carbon Anode

Figure 42:
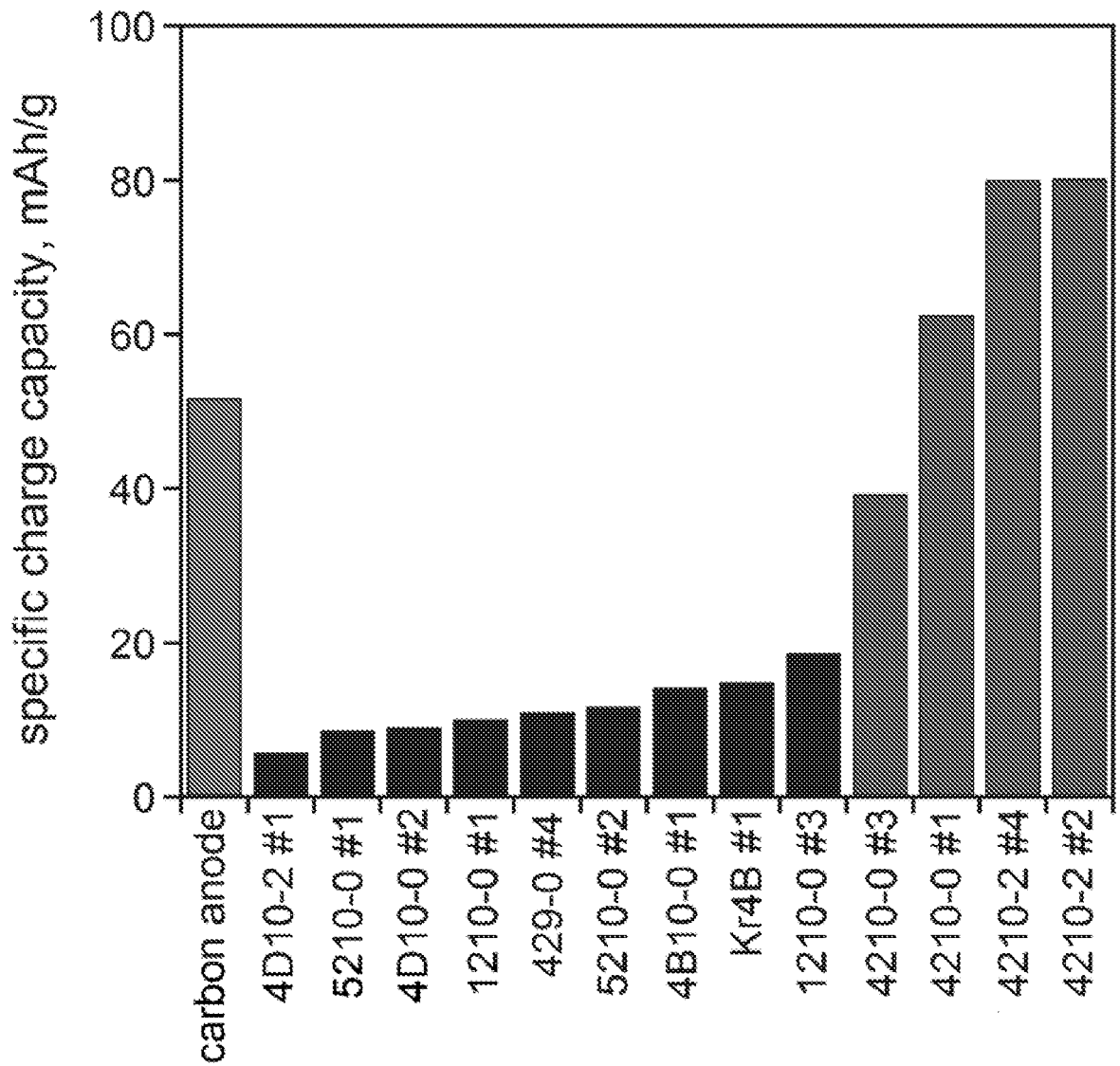
FIG. 42 depicts a comparison of lithium ion batteries prepared with anodes including functionalized Group IVA particles versus batteries prepared with a standard carbon based anode.

FIG. 42 shows a comparison of lithium-ion batteries having anodes prepared with functionalized Group IVA particles versus batteries prepared with a standard carbon based anode. Performance of the carbon-based anode is shown in red, performance of anodes prepared according to the present invention are shown in purple and green. As shown, the batteries of 4210-0 and 4210-2 outperformed the standard carbon based anode.

Example 7

Prediction of Specific Charge Capacity

Figure 43:
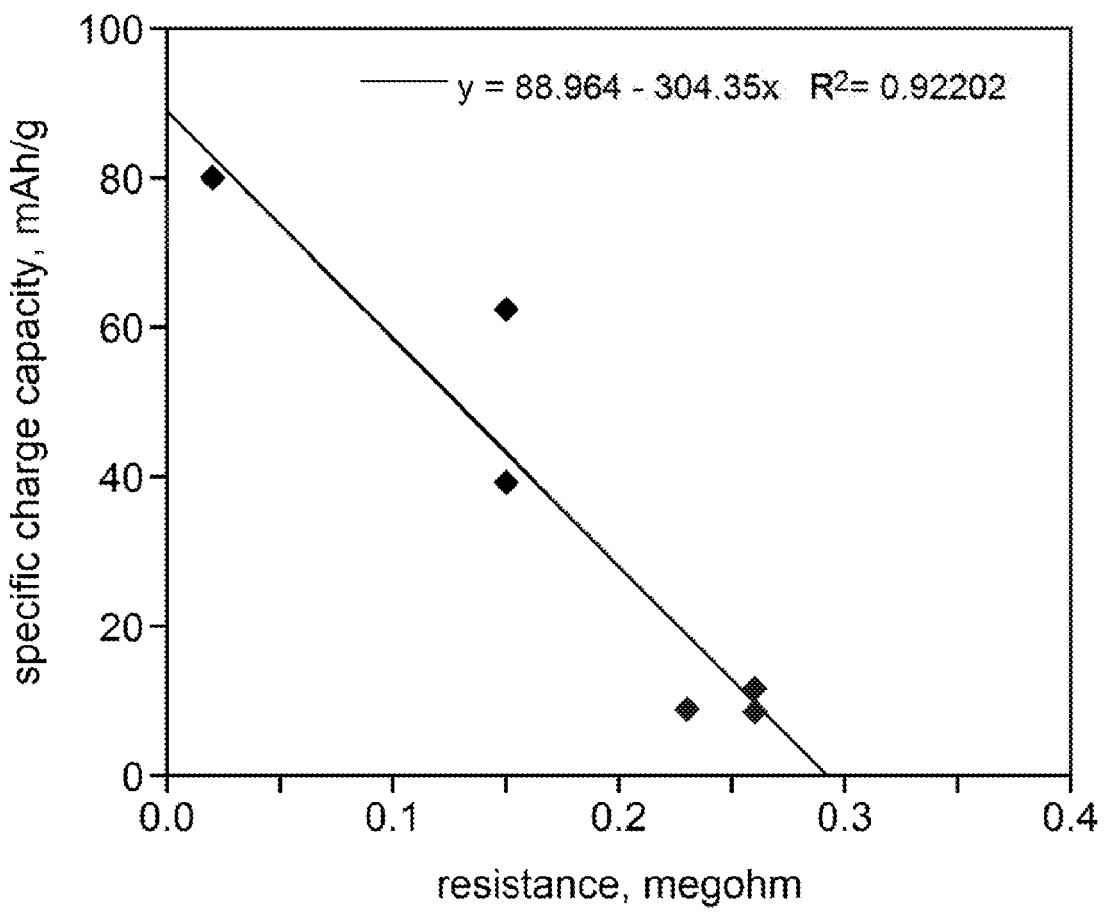
FIG. 43 depicts a correlation between resistance and specific charge capacity.

FIG. 43 shows that there appears to be a correlation such that Si can be tested prior to fabricating batteries to predict based on resistance of the Si, what the specific charge capacity, mAh/g will be.

It is understood that the foregoing detailed description and accompanying examples are merely illustrative and are not to be taken as limitations upon the scope of the invention, which is defined solely by the appended claims and their equivalents.

Various changes and modifications to the disclosed embodiments will be apparent to those skilled in the art. Such changes and modifications, including without limitation those relating to the chemical structures, substituents, derivatives, intermediates, syntheses, compositions, formulations, or methods of use of the invention, may be made without departing from the spirit and scope thereof.

What is claimed is:
1. A Group IVA particle composite, comprising:
a passivated Group IVA particle that comprises between 50 weight percent (wt %) to 100 wt % of the Group IVA particle composite;
the passivated Group IVA particle comprising a non-dielectric layer covering at least a portion of a surface of the Group IVA particle;

a conductive cohesion additive selected from a C60 Fullerene, a C70 Fullerene, or a derivative thereof;
the conductive cohesion additive comprising between 1 wt % and 50 wt % of the Group IVA particle composite; and
a dopant selected from Fullerene $(F)_n$, Fullerene $(CF_3)_n$, polycyclic aromatic hydrocarbon $(CF_3)_n$, polycyclic aromatic hydrocarbon $(F_n)$, where n=20.

2. The Group IVA particle of claim 1, wherein the non-dielectric layer is derived from a compound selected from the group consisting of alkenes, alkynes, aromatics, heteroaromatics, cycloalkenes, alcohols, glycols, thiols, disulfides, amines, amides, pyridines, pyrrols, furans, thiophenes, cyanates, isocyanates, isothiocyanates, ketones, carboxylic acids, amino acids, and aldehydes.

3. The Group IVA particle of claim 1, wherein the non-dielectric layer is derived from a compound selected from the group consisting toluene, benzene, a polycyclic aromatic, a fullerene, a metallofullerene, a styrene, a cyclooctatetraene, a norbornadiene, a primary alkene, a primary alkyne, a saturated or unsaturated fatty acid, a peptide, a protein, an enzyme, 2,3,6,7-tetrahydroxyanthracene, and terephthalaldehyde.

4. The Group IVA particle of claim 1, wherein the non-dielectric layer possesses functional groups capable of forming covalent bonds to other reagents.

5. The Group IVA particle of claim 1, wherein the Group IVA particle is stable to oxidation in air at room temperature.

6. The Group IVA particle of claim 1, wherein the particle is 25 microns in size or less.

7. The Group IVA particle of claim 1, wherein the particle is 1 micron in size or less.

8. The Group IVA particle of claim 1, wherein the particle is 0.1 micron in size or less.

9. The Group IVA particle of claim 1, wherein the particle is 0.05 micron in size or less.

10. The Group IVA particle of claim 1, wherein the particle is covalently bonded to a porous covalent framework.

11. The Group IVA particle of claim 10, wherein the porous covalent framework is a covalent organic framework, a metal organic framework, or a zeolitic imidazolate framework.

12. The Group IVA particle of claim 10, wherein the porous covalent framework is a 2-dimensional framework.

13. The Group IVA particle of claim 10, wherein the porous covalent framework is a 3-dimensional framework.

14. The Group IVA particle of claim 1, wherein the Group IVA particle comprises silicon.

15. The Group IVA particle of claim 1, wherein the Group IVA particle comprises germanium.

16. The Group IVA particle of claim 1, wherein the Group IVA particle comprises tin.

17. The Group IVA particle of claim 1, wherein the Group IVA particle comprises an n-type dopant.

18. The Group IVA particle of claim 17, wherein the n-type dopant comprises nitrogen, phosphorous, or arsenic.

19. A lithium ion battery comprising
a positive electrode;
a negative electrode comprising a passivated Group IVA particle composite that comprises between 50 weight percent (wt %) to 100 wt % of a Group IVA particle;
the passivated Group IVA particle comprising a non-dielectric layer covering at least a portion of a surface of the Group IVA particle;
a conductive cohesion additive selected from a C60 Fullerene, a C70 Fullerene, or a derivative thereof;
the conductive cohesion additive comprising between 1 wt % and 50 wt % of the Group IVA particle composite; and
a dopant selected from Fullerene $(F)_n$, Fullerene $(CF_3)_n$, polycyclic aromatic hydrocarbon $(CF_3)_n$, polycyclic aromatic hydrocarbon $(F_n)$, where n=20
a lithium ion permeable separator between the positive electrode and the negative electrode; and
an electrolyte comprising lithium ions.

20. A method of preparing a functionalized Group IVA particle, the method comprising:
comminuting silicon material in benzene, the silicon material comprising crystalline silicon ingot material or silicon powder;
removing solvent via vacuum distillation to yield a first solid mixture;
vacuum drying the first solid mixture to yield a second solid mixture;
combining the second solid mixture and a modifier reagent to a non-functional solvent;
removing the non-functional solvent to yield a third solid mixture;
washing and drying the third solid mixture;
combining the third solid mixture with a dopant additive in a solvent to yield a slurry;
sonicating the slurry; and
drying the sonicated slurry.

* * * * *